United States Patent
Hu et al.

(10) Patent No.: US 12,363,992 B2
(45) Date of Patent: Jul. 15, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Kuan-Kan Hu, Hsinchu (TW); Jhih-Rong Huang, Hsinchu County (TW); Yi-Bo Liao, Hsinchu (TW); Shuen-Shin Liang, Hsinchu County (TW); Min-Chiang Chuang, Taoyuan (TW); Sung-Li Wang, Hsinchu County (TW); Wei-Yen Woon, Taoyuan (TW); Szuya Liao, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 378 days.

(21) Appl. No.: 17/876,389

(22) Filed: Jul. 28, 2022

(65) Prior Publication Data
US 2024/0038595 A1 Feb. 1, 2024

(51) Int. Cl.
*H10D 84/03* (2025.01)
*H01L 21/285* (2006.01)
(Continued)

(52) U.S. Cl.
CPC ..... *H10D 84/038* (2025.01); *H01L 21/28518* (2013.01); *H10D 30/6219* (2025.01);
(Continued)

(58) Field of Classification Search
CPC ....... H01L 21/823871; H01L 21/28518; H01L 21/823814; H01L 21/823821; H01L 27/0924; H01L 29/0847; H01L 29/41791; H01L 29/45; H01L 21/76831; H01L 21/76846; H01L 21/76858; H01L 29/0673; H01L 29/66795; H01L 21/76843;
(Continued)

(56) References Cited

U.S. PATENT DOCUMENTS 9,105,490 B2 8/2015 Wang et al.
9,236,267 B2 1/2016 De et al.
(Continued)

OTHER PUBLICATIONS

Pin-Chun Shen et al., "Ultralow contact resistance between semimetal and monolayer semiconductors", Nature vol. 593, May 13, 2021.

*Primary Examiner* — Fernando L Toledo
*Assistant Examiner* — Adam S Bowen
(74) *Attorney, Agent, or Firm* — Maschoff Brennan

(57) ABSTRACT

A method for manufacturing a semiconductor device is provided. The method includes forming a first transistor over a substrate, wherein the first transistor comprises a first source/drain feature; depositing an interlayer dielectric layer around the first transistor; etching an opening in the interlayer dielectric layer to expose the first source/drain feature; conformably depositing a semimetal layer over the interlayer dielectric layer, wherein the semimetal layer has a first portion in the opening in the interlayer dielectric layer and a second portion over a top surface of the interlayer dielectric layer; and forming a source/drain contact in the opening in the interlayer dielectric layer.

20 Claims, 53 Drawing Sheets

(51) Int. Cl.
*H10D 30/62* (2025.01)
*H10D 62/13* (2025.01)
*H10D 64/62* (2025.01)
*H10D 84/01* (2025.01)
*H10D 84/85* (2025.01)

(52) U.S. Cl.
CPC ........... *H10D 62/151* (2025.01); *H10D 64/62* (2025.01); *H10D 84/017* (2025.01); *H10D 84/0186* (2025.01); *H10D 84/0193* (2025.01); *H10D 84/853* (2025.01)

(58) Field of Classification Search
CPC ... H01L 27/092; H01L 29/456; H10D 84/038; H10D 30/6219; H10D 62/151; H10D 64/62; H10D 84/017; H10D 84/0186; H10D 84/0193; H10D 84/853
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 11,476,333 B2 * | 10/2022 | Khaderbad ..... H01L 21/823412 |
| 2020/0303373 A1 * | 9/2020 | Glass .................. H01L 27/0924 |
| 2022/0238677 A1 * | 7/2022 | Hsieh .................. C01B 32/182 |

* cited by examiner

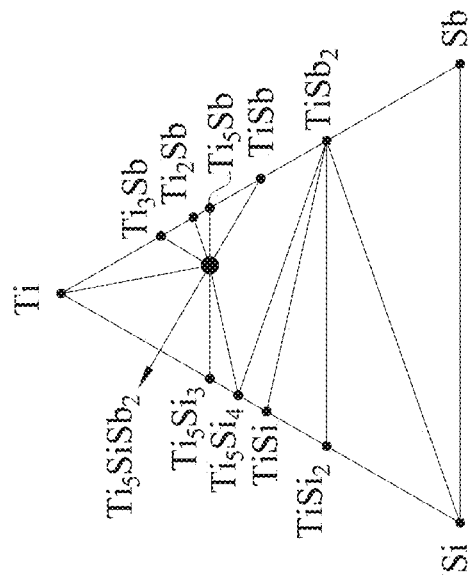
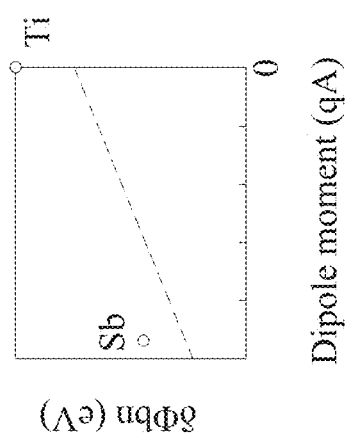
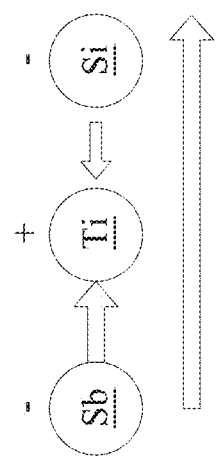
Fig. 16C
Fig. 16B
Fig. 16A

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16A illustrates a net dipole among a semimetal, a metal, and a semiconductor in accordance with some embodiments of the present disclosure.

FIG. 16B shows a diagram of dipole moment versus reduced Schottky barrier height of various materials in accordance with some embodiments of the present disclosure.

FIG. 16C shows a ternary phase diagram of a semimetal, a metal, and a semiconductor in accordance with some embodiments of the present disclosure.

DETAILED DESCRIPTION

Figure 1A:
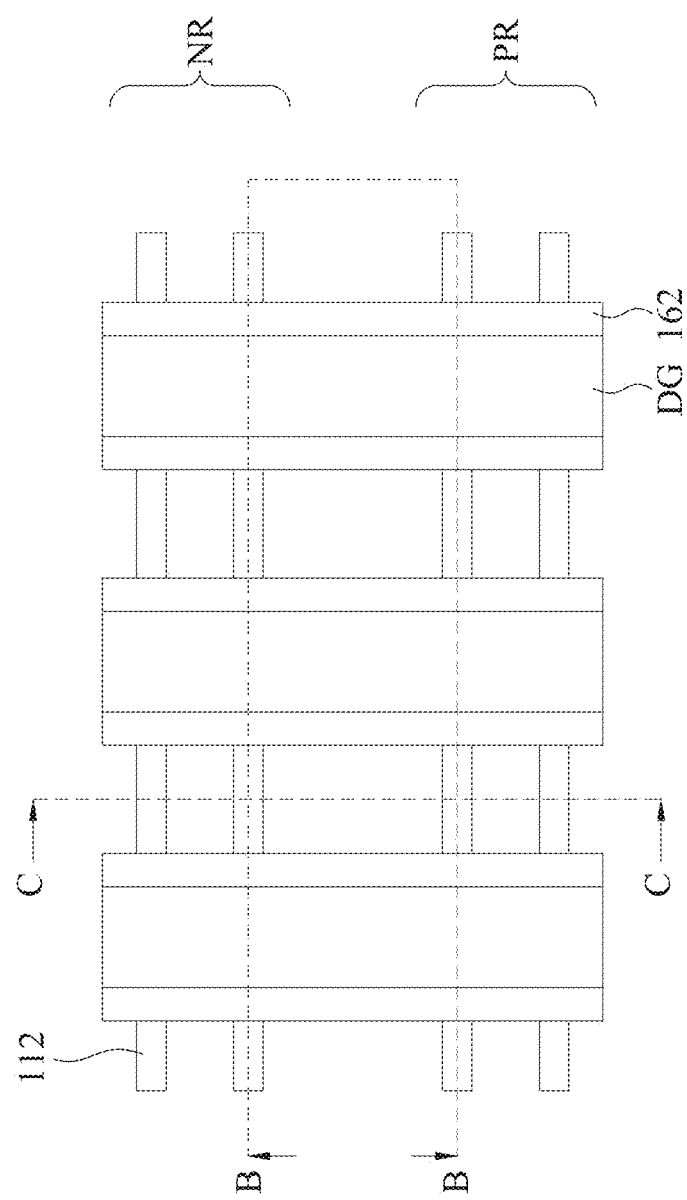
FIGS. 1A-11 illustrate a method of manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a p-type metal-oxide-semiconductor (PMOS) FinFET device and an n-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain region(s) may refer to a source or a drain, individually or collectively dependent upon the context.

FIGS. 1A-11 illustrate a method of manufacturing a semiconductor device at various stages in accordance with some embodiments of the present disclosure. FIGS. 1A, 2A, and 4A, are top views of the semiconductor device at various stages in accordance with some embodiments. FIGS. 1B, 2B, 3A, 4B, 5A, 6, 7A, 8A, 9A, 10A, and 11 are cross-sectional views of the semiconductor device (e.g., taken along line B-B in FIGS. 1A, 2A, and 4A) at various manufacturing stages in accordance with some embodiments. FIGS. 1C, 2C, 3B, 5B, 7B, 8B, 9B, and 10B are cross-sectional views of the semiconductor device (e.g., taken along line C-C in FIGS. 1A, 2A, and 4A) at various manufacturing stages in accordance with some embodiments. FIGS. 9C and 10C are cross-sectional views of the semiconductor device (e.g., taken along line C-C in FIGS. 1A, 2A, and 4A) at various manufacturing stages in accordance with some other embodiments. It is understood that additional steps may be provided before, during, and after the steps shown in FIGS. 1A-11, and some of the steps described below can be replaced or eliminated for additional embodiments of the method. The order of the operations/processes may be interchangeable.

Figure 1B:
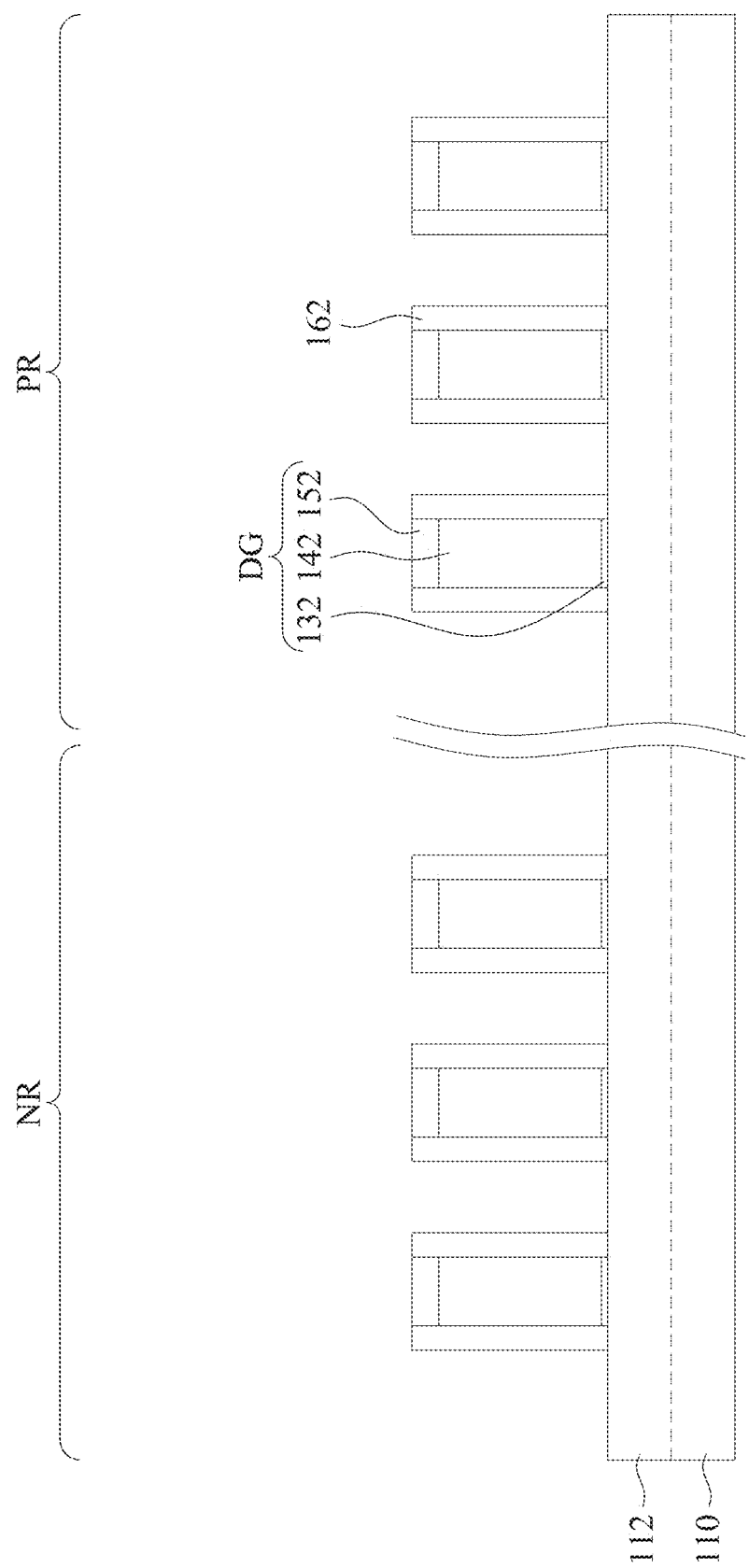
Figure 1C:
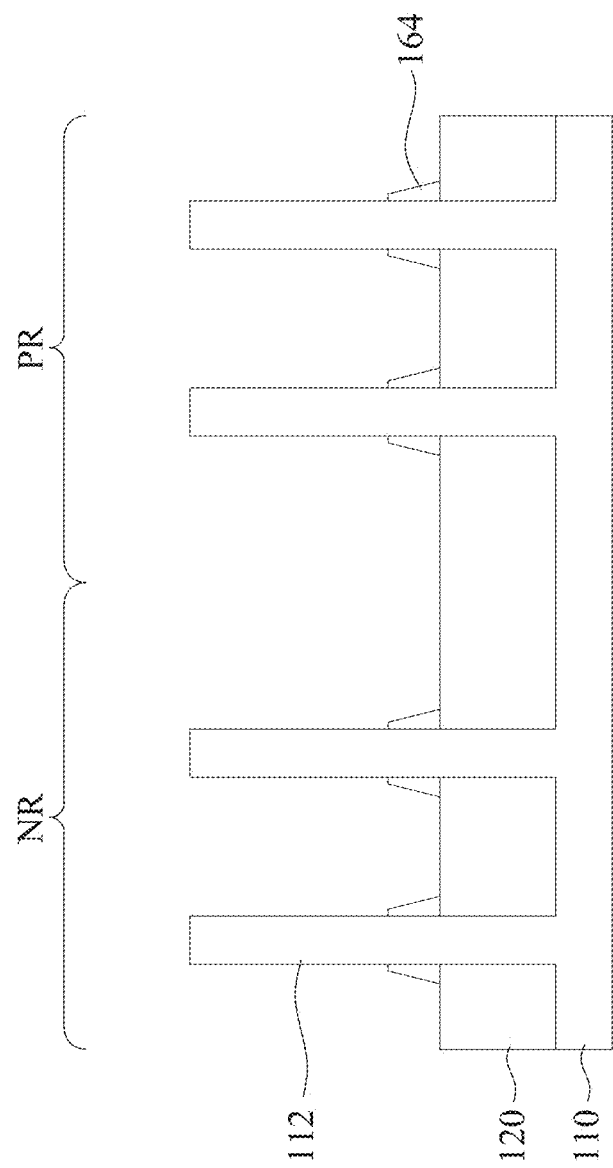

FIGS. 1A-1C illustrate a top view and cross-sectional views of formation of semiconductor fins 112 extending from a substrate 110, and formation of dummy gate structures DG over the semiconductor fins 112. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods. The substrate 110 may also include various doped regions. The doped regions may be doped with p-type dopants, such as boron or $BF_2$; n-type dopants, such as phosphorus or arsenic; or combinations thereof. The doped regions may be formed directly on the substrate 110, in a P-well structure, in an N-well structure, in a dual-well structure, and/or using a raised structure. The substrate 110 may include a region NR for a n-type device (e.g., NMOS) and a region PR for a p-type device (e.g., PMOS).

The semiconductor fins 112 may be formed by any suitable method. For example, the semiconductor fins 112 may be formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Dash lines in FIG. 1B indicates a top surface of the substrate 110 that the fins 112 protrudes from.

A plurality of isolation structures 120 are formed over the substrate 110 and interposing the semiconductor fins 112. The isolation structures 120 may act as a shallow trench isolation (STI) around the semiconductor fins 112. The isolation structures 120 may be formed by depositing a dielectric material around the fins 112, followed by a recessing etching process that lowers top surfaces of the dielectric material. In some embodiments, a dielectric layer is first deposited over the substrate 110, filling the trenches between the fins 112 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the structure may be annealed, for example, to improve the quality of the dielectric layer. In some embodiments, the dielectric layer (and subsequently formed isolation structures 120) may include a multi-layer structure, for example, having one or more liner layers.

After deposition of the dielectric layer, the deposited dielectric material may be thinned and planarized, for example by a chemical mechanical polishing (CMP) process. Subsequently, the isolation structures 120 interposing the fins 112 may be recessed. For example, the isolation structures 120 are recessed providing the fins 112 extending above the isolation structures 120. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fins 112.

The dummy gate structures DG are formed around the semiconductor fins 112 of the substrate 110. In some embodiments, each of the dummy gate structure DG includes a dummy gate 142 and a gate dielectric 132 underlying the dummy gate 142. The dummy gates 142 may include polycrystalline-silicon (poly-Si) or poly-crystalline silicon-germanium (poly-SiGe). Further, the dummy gates 142 may be doped poly-silicon with uniform or non-uniform doping. The gate dielectrics 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

In some embodiments, the dummy gate structures DG may be formed by, for example, forming a stack of a gate dielectric layer and a dummy gate material layer over the substrate 110. A patterned mask 152 is formed over the stack of gate dielectric layer and dummy gate material layer. The patterned mask 152 may be a hard mask (HM) layer patterned through suitable photolithography process. For example, the patterned mask 152 may include silicon nitride, silicon oxy nitride, the like, or the combination thereof. Then, the gate dielectric layer and the dummy gate material layer may be patterned using one or more etching processes, such as one or more dry plasma etching processes or one or more wet etching processes. During the etching process, the patterned mask 152 may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric layer until the semiconductor fins 112 and the isolation structures 120 are exposed.

Gate spacers 162 may be formed alongside sidewalls of the dummy gate structures DG, and fin sidewall spacers 164 may be formed alongside sidewalls of the fins 112. The formation of the gate spacers 162 and the fin sidewall spacers 164 may include conformally depositing a spacer layer over the dummy gate structures DG and the fins 112, followed by an anisotropic etching process. The anisotropic etching process may remove horizontal portions of the spacer layer and remain vertical portions of the spacer layer, which form the gate spacer 162 and the fin sidewall spacers 164. The spacer layer may be deposited by suitable processes such as, CVD process, an ALD process, a PVD process, or other suitable process. The gate spacers 162 and the fin sidewall spacers 164 may include a dielectric material such as $SiO_2$, SiON, SiCON, SiCO, the like, and/or combinations thereof. The gate spacers 162 and the and fin sidewall spacers 164 may be a single-layer structure or a multi-layer structures that includes multiple layers.

Figure 2A:
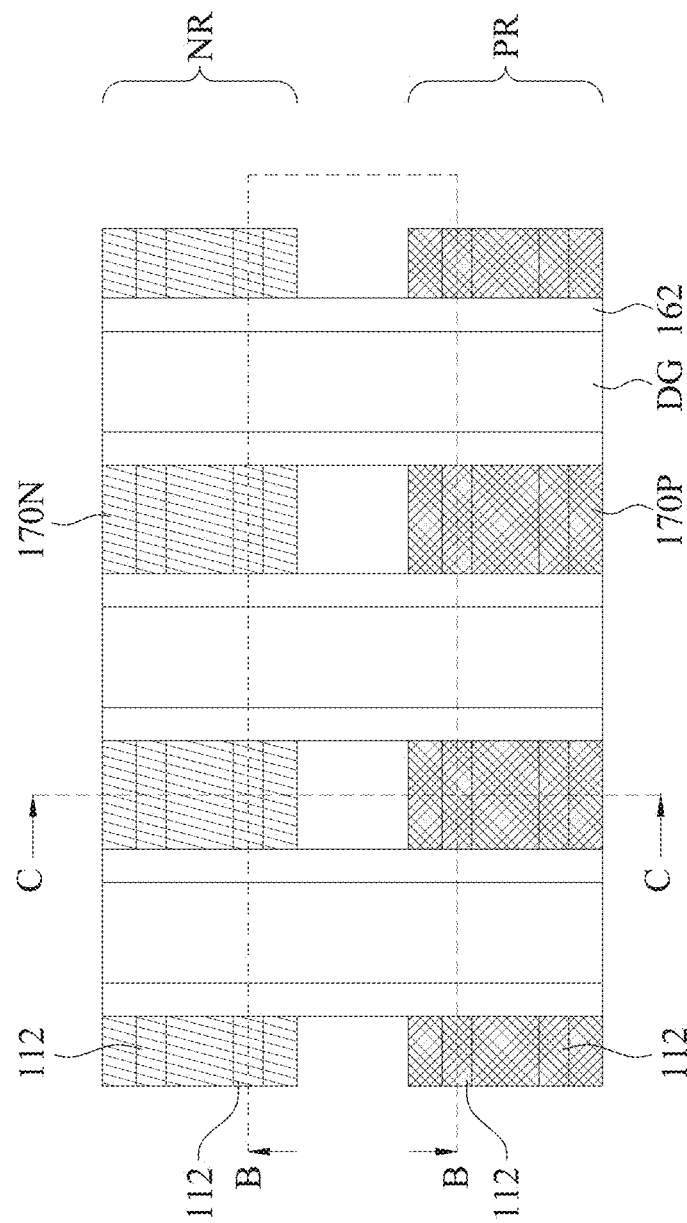
Figure 2B:
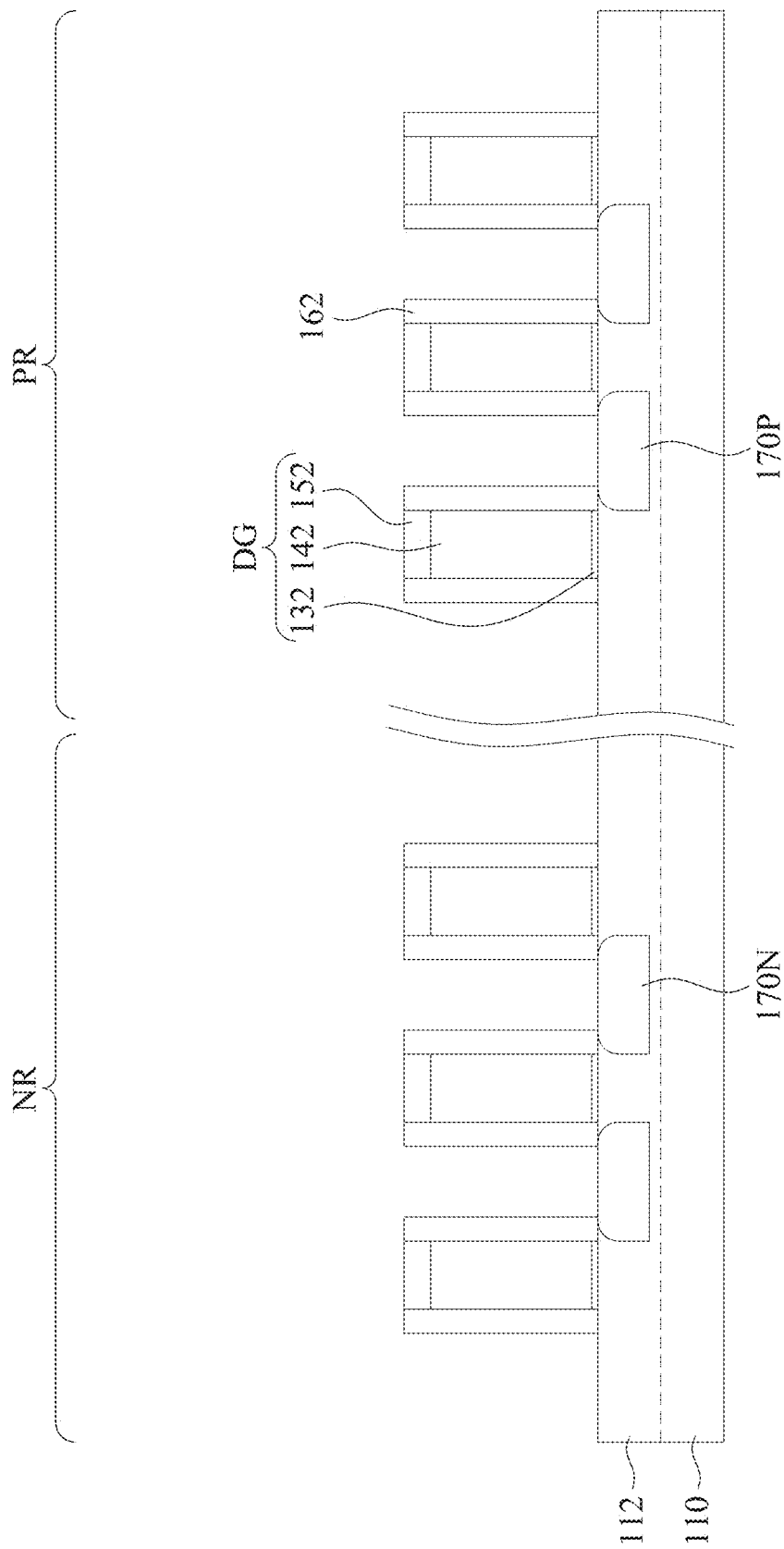
Figure 2C:
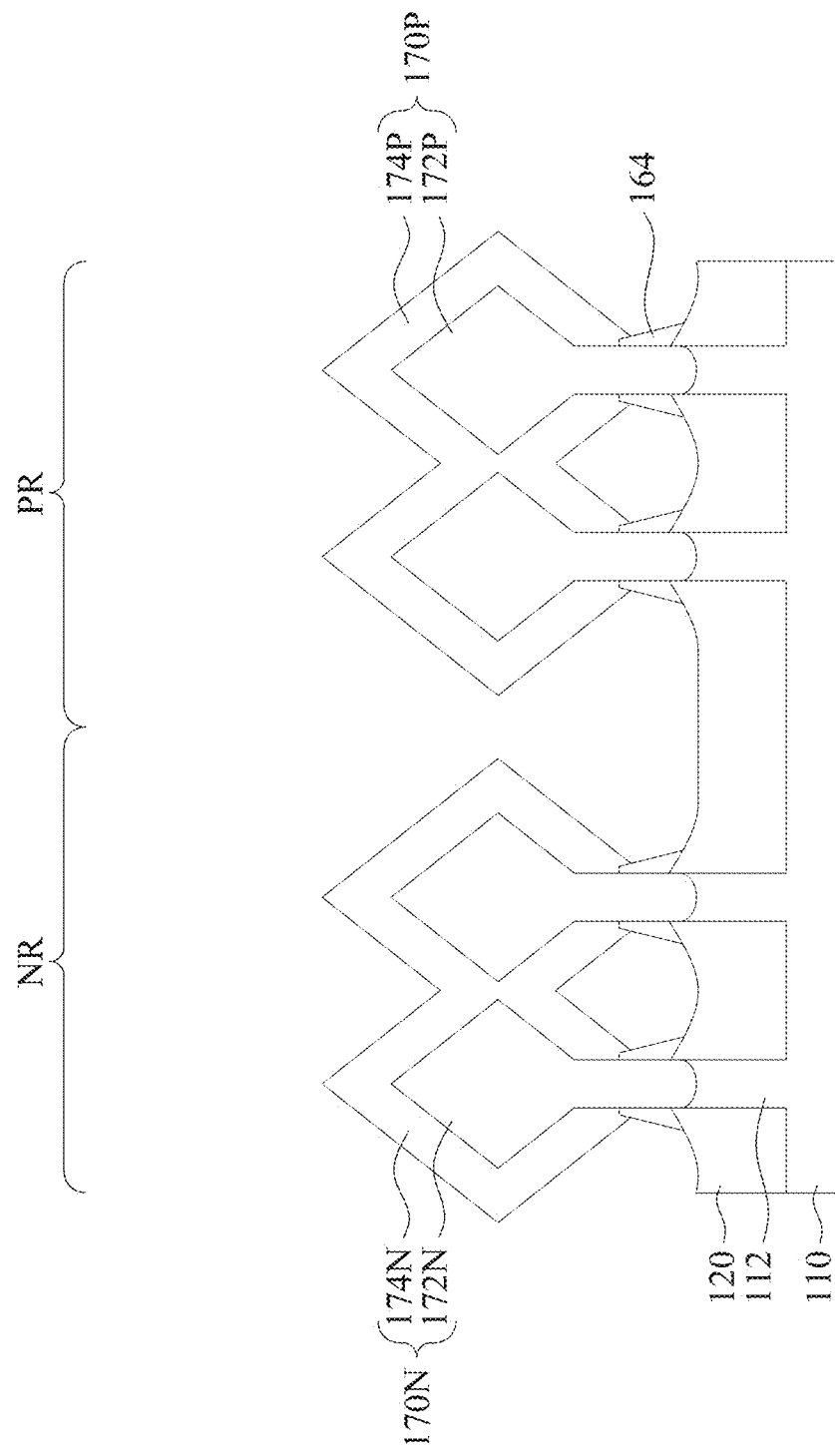

FIGS. 2A-2C illustrate a top view and cross-sectional views of formation of a source/drain epitaxial structures 170N and 170P. The source/drain epitaxial structures 170N and 170P may be referred to as source/drain epitaxial features. Portions of the semiconductor fins 112 uncovered the dummy gate structures DG may be recessed by one or more suitable etching processes, and the source/drain epitaxial structures 170N and 170P are respectively formed over the recessed portions of the semiconductor fins 112. In the depicted embodiments, the source/drain epitaxial structures 170N/170P over two fins 112 are merged with each other. In some other embodiments, the source/drain epitaxial structures 170N/170P over two fins 112 may be spaced apart from each other.

In some embodiments, the source/drain epitaxial structures 170N and 170P may also be referred to as an epitaxy feature. The source/drain epitaxial structure 170N/170P may be formed using one or more epitaxy or epitaxial (epi) processes, such that one or more semiconductor materials can be formed in a crystalline state on the semiconductor fins 112. In some embodiments, a lattice constant of the source/drain epitaxial structure 170N/170P is different from a lattice constant of the semiconductor fin 112, such that channels in the channel regions 112C of the semiconductor fins 112 are strained or stressed to enable carrier mobility of the semiconductor device and enhance the device performance.

In the illustrated embodiments, the source/drain epitaxial structures 170N are n-type epitaxial structures, which may include a suitable n-type semiconductor material, such as germanium (Ge) or silicon (Si); or compound semiconductor materials, such as silicon carbide (SiC). The source/drain epitaxial structures 170N may be doped with n-type dopants, such as phosphorus or arsenic. The source/drain epitaxial structures 170N may include one or plural epitaxial layers (e.g., epitaxial layers 172N and 174N), in which the plural epitaxial layers (e.g., epitaxial layers 172N and 174N) may have different compositions. In some embodiments, the epitaxial layers 174N may have a n-type dopant concentration (e.g., phosphorus concentration) greater than a n-type dopant concentration (e.g., phosphorus concentration) of the epitaxial layers 172N. In some embodiments, the epitaxial layers 174N may have a n-type dopant concentration (e.g., phosphorus concentration) greater than about $10^{18}$ atoms/$cm^3$, or even greater than about $2\times10^{21}$ atoms/$cm^3$. In some embodiments, a thickness of the epitaxial layers 172N may be in a range from about 2 nanometers to about 20 nanometers, and a thickness of the epitaxial layers 174N may be in a range from about 3 nanometers to about 30 nanometers.

In the illustrated embodiments, the source/drain epitaxial structures 170P are p-type epitaxial structures, which may include a suitable semiconductor material, such as germanium (Ge) or silicon (Si); or compound semiconductor materials, such as silicon germanium (SiGe). The p-type source/drain epitaxial structures 170P may be doped with p-type dopants, such as boron or $BF_2$. The source/drain epitaxial structures 170P may include one or plural epitaxial layers (e.g., epitaxial layers 172P and 174P), in which the plural epitaxial layers (e.g., epitaxial layers 172P and 174P) may have different compositions. In some embodiments, the epitaxial layers 174P may have a p-type dopant concentration (e.g., boron concentration) greater than a p-type dopant concentration (e.g., boron concentration) of the epitaxial layers 172P. In some embodiments, the epitaxial layers 174P may have a p-type dopant concentration (e.g., boron concentration) greater than about $10^{18}$ atoms/$cm^3$, or even greater than about $2\times10^{21}$ atoms/$cm^3$. In some embodiments, a thickness of the epitaxial layers 172P may be in a range from about 2 nanometers to about 20 nanometers, and a thickness of the epitaxial layers 174P may be in a range from about 3 nanometers to about 30 nanometers.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112 (e.g., silicon). The source/drain epitaxial structures 170N and 170P may be in-situ doped. If the source/drain epitaxial structures 170N/170P is not in-situ doped, a second implantation process (i.e., a junction implant process) is performed to dope the source/drain epitaxial structures 170N/170P. One or more annealing processes may be performed to activate the source/drain epitaxial structures 170N and 170P. The annealing processes may include rapid thermal annealing (RTA) and/or laser annealing processes.

Figure 3A:
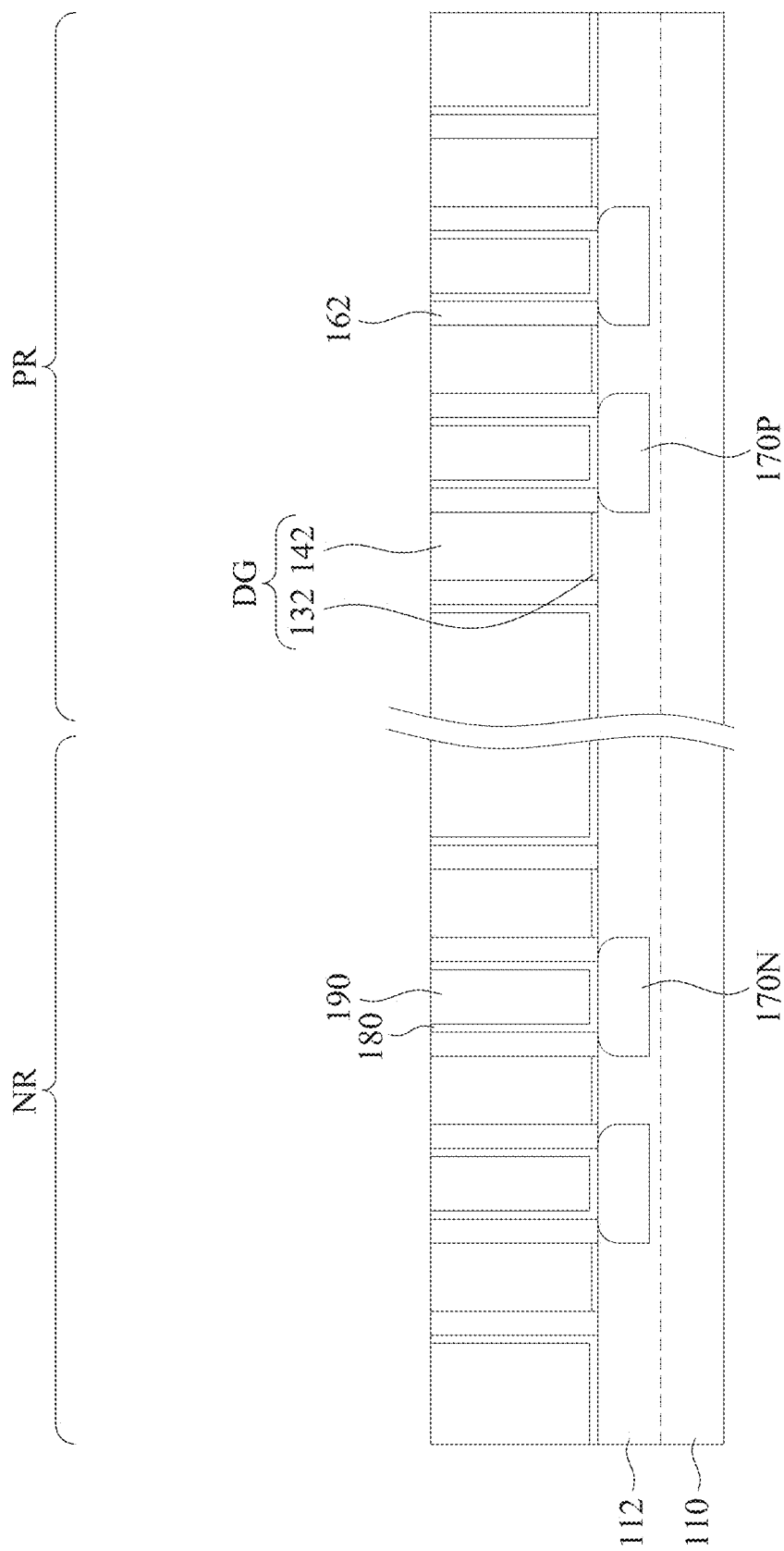
Figure 3B:
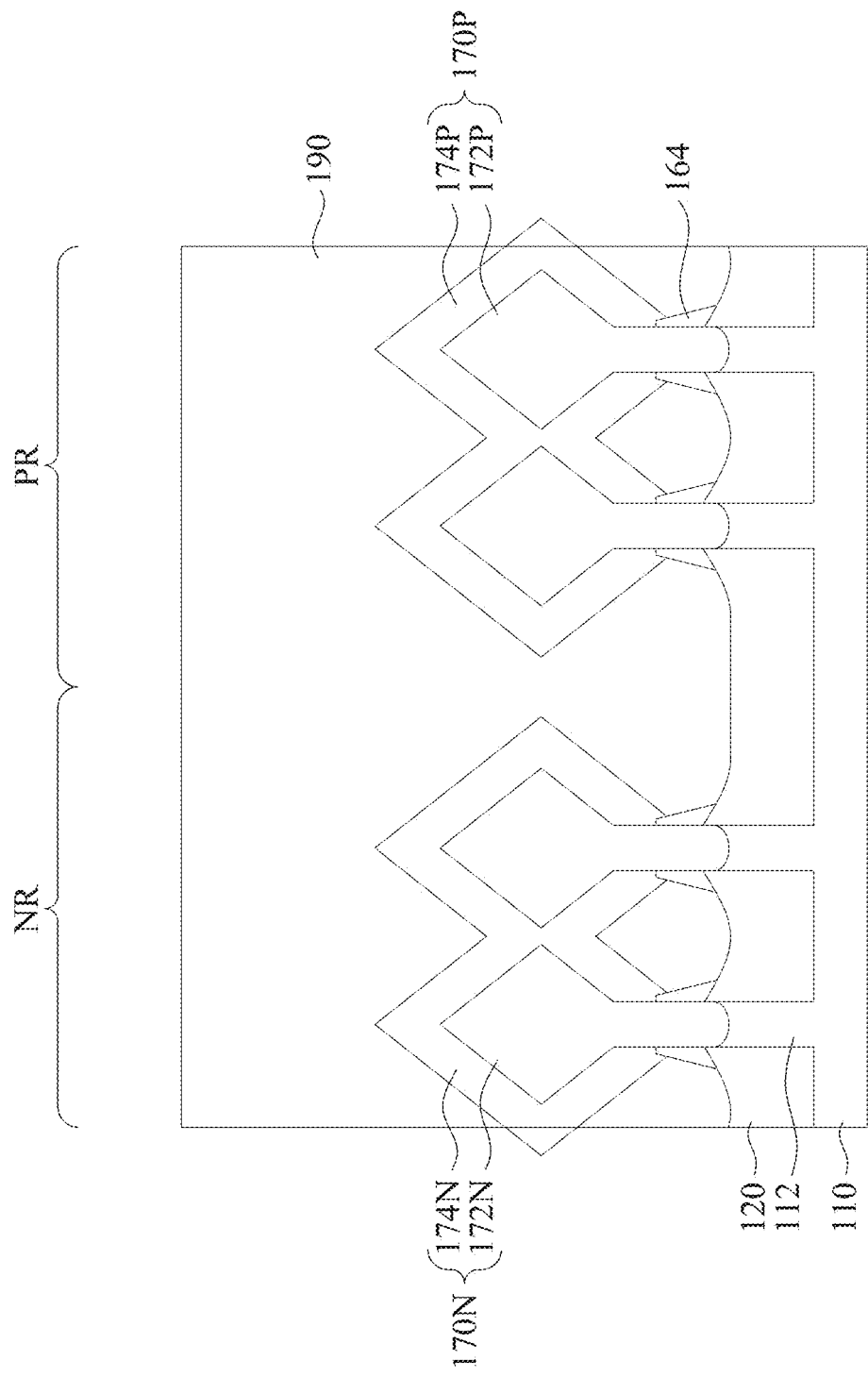

FIGS. 3A and 3B illustrate cross-sectional views of formation of a contact etch stop layer (CESL) and the ILD layer 190. In some embodiments, after the source/drain epitaxial structures 170N and 170P are formed, a CESL 180 may be blanket formed over the substrate 110 and surrounding the source/drain epitaxial structures 170N and 170P. In some examples, the CESL 180 includes suitable dielectric materials, such as SiON, LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, the like, or combinations thereof. The CESL 180 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques. The CESL 180 is omitted from FIG. 3B for sake of brevity.

After the formation of the CESL 180, the ILD layer 190 is formed over the substrate 110. In some embodiments, the ILD layer 190 may has a different etch selectivity than that of the CESL 180. The ILD layer 190 may be include any suitable dielectric or insulating material such as, but not limited to, silicon dioxide, SiOF, carbon-doped oxide, a glass or polymer material. For example, the dielectric material of the ILD layer 190 may include tetraethoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, the like, or combinations thereof. The ELK dielectric material may have a dielectric constant less than, for example, about 2.5. It is understood that the ILD layer 190 may include one or more dielectric materials and/or one or more dielectric layers. In some embodiments, the ILD layer 190 may be deposited by chemical vapor deposition (CVD), high density plasma (HDP) CVD, sub-atmospheric CVD (SACVD), spin-on coating, sputtering, or other suitable techniques. In some other embodiments, the ILD layer 190 may include multiple layers of the same or differing dielectric materials may instead be used. In some other embodiments, the ILD layer 190 may include SiON, LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, the like, or combinations thereof. A CMP process may be performed to remove an excess portion of the ILD layer 190 until reaching the dummy gate structures DG. The CMP may remove the patterned mask 152 of the dummy gate structures DG (referring to FIG. 2B). After the CMP process, the dummy gate 142 of the dummy gate structures DG are exposed from the ILD layer 190.

Figure 4A:
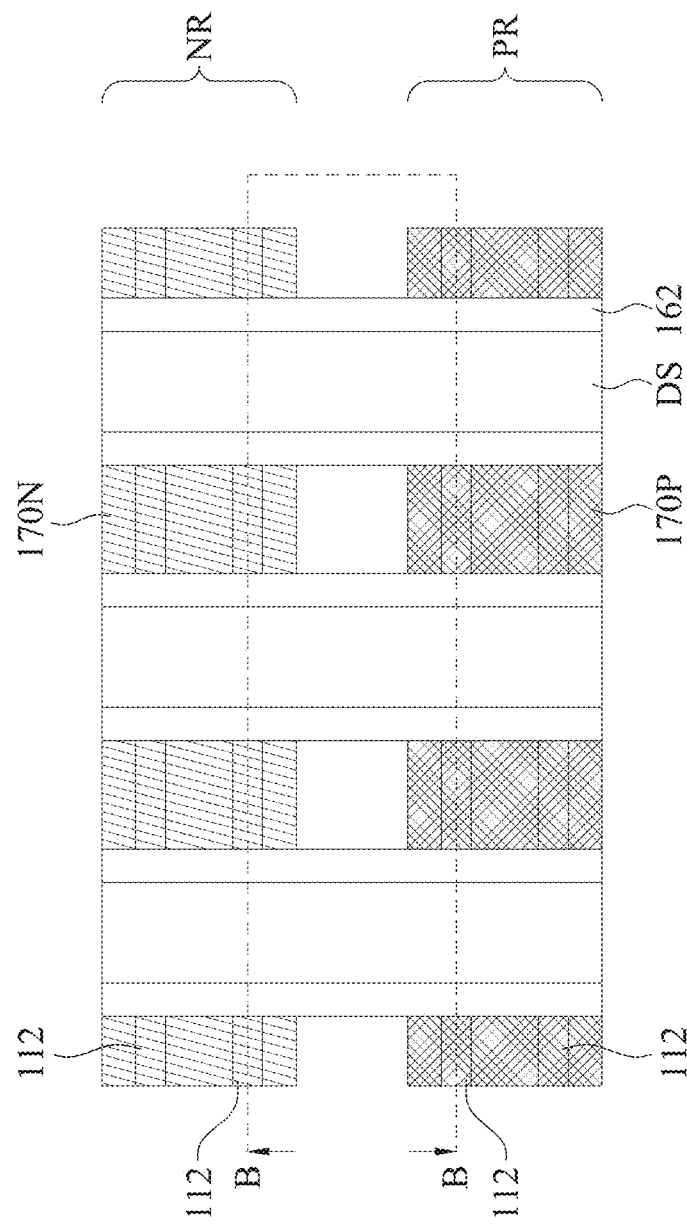
Figure 4B:
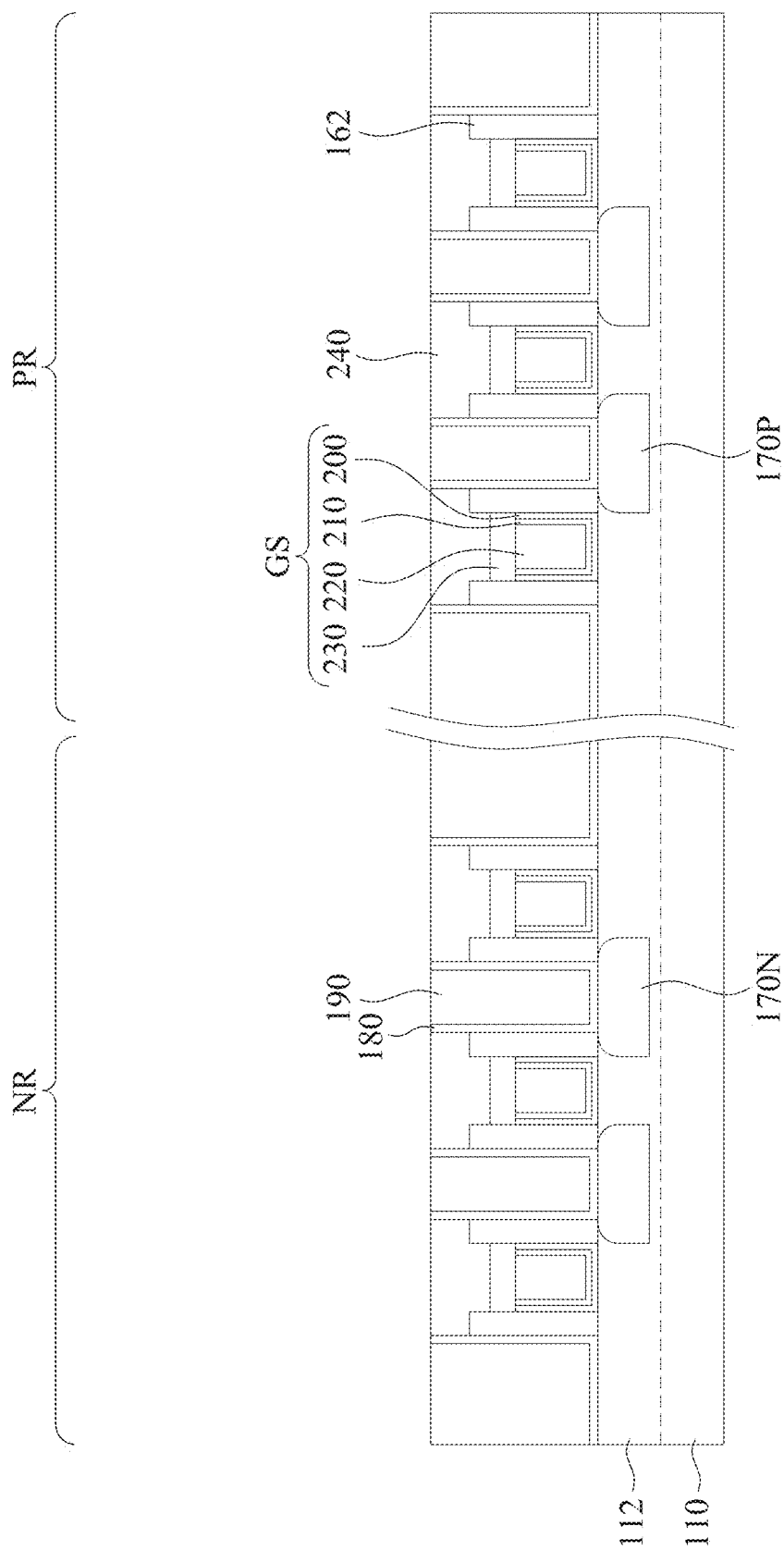

FIGS. 4A and 4B illustrate a top view and a cross-sectional view of a replacement gate (RPG) process scheme. The dummy gate structures DG (see FIGS. 3A and 3B) are replaced with metal gate structures GS. For example, the dummy gate structures DG (see FIGS. 3A and 3B) are removed to form a plurality of gate trenches. The dummy gate structures DG are removed by a selective etch process, including a selective wet etch or a selective dry etch, and carries a substantially vertical profile of the gate spacers 140. The gate trenches expose portions of the semiconductor fins 112 of the substrate 110. Then, the metal gate structures GS are formed respectively in the gate trenches and cover the semiconductor fins 112 of the substrate 110. The gate structure GS may include a gate dielectric layer 200, a work function metal layer 210, a gate conductor 220, and a gate cap layer 230.

The gate dielectric layer 200 in the gate structure GS may include an interfacial layer and a high-k dielectric layer over the interfacial layer. The interfacial layer may include silicon oxides, for example, formed by thermal oxidation process. The high-k dielectric layers, as used and described herein, include dielectric materials having a high dielectric constant, for example, greater than that of thermal silicon oxide (~3.9). The high-k dielectric layers may include a high-k dielectric layer such as tantalum, hafnium, titanium, lanthanum, aluminum and their carbide, silicide, nitride, boride combinations. The high-k dielectric layers may include other high-K dielectrics, such as $HfO_2$, $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-k dielectric layers may be formed by ALD, PVD, CVD, oxidation, and/or other suitable methods. In some embodiments, the high-k dielectric layers may include the same or different materials.

The work function metal layer 210 over the gate dielectric layer 200, may have a suitable work function to enhance the device performance, and the work function metal layers 210 in region NR may include a material different from the work function metal layers 210 in the region PR. For example, in the region NR, the work function metal layer 210 may be an n-type work function layer, which includes one or more n-type work function metals, such as Ti, Ag, TaAl, TaAlC, TiAlN, TaC, TaCN, TaSiN, Mn, Zr, other suitable n-type work function materials, or combinations thereof. In the region PR, the work function metal layer 210 may be a p-type work function layer, which includes one or more p-type work function metals, such as TiN, TaN, Ru, Mo, Al, WN, $ZrSi_2$, $MoSi_2$, $TaSi_2$, $NiSi_2$, WN, other suitable p-type work function materials, or combinations thereof. The work function layers may include a plurality of layers. The work function layer(s) may be deposited by CVD, PVD, electroplating and/or other suitable process.

In some embodiments, the gate conductor 220 over the work function metal layer 210 may fill a recess in the work function metal layer 210. The gate conductor 220 may include metal or metal alloy. For example, the gate conductor 220 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, the metal gate in the gate structure GS may further include a liner layer, a wetting layer, and/or an adhesion layer around the gate conductor 220.

The gate cap layer 230 may be formed over the gate conductor 220, the work function metal layer 210, and the gate dielectric layer 200. In some embodiments, the gate cap layer 230 may be formed of W, Co, Ni, Ru, Ti, Ta, TiN, TaN, combinations thereof, and/or other suitable compositions. In some embodiments, an etching back process may be performed to lower top surfaces of the gate dielectric layer 200, the work function metal layer 210, the gate conductor 220, and the gate cap layer 230 may then formed over the lower top surfaces by suitable deposition process.

In some embodiments, dielectric features 240 may be formed over the gate cap layer 230. The dielectric features 240 may be referred to as self-aligned contact (SAC) dielectrics. The dielectric features 240 may include a dielectric material such as LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, or a combination thereof. The dielectric features 240 can be formed using CVD, ALD, plasma-enhanced CVD (PECVD), plasma-enhanced-ALD (PEALD), or other suitable technique. In some embodiments, the gate cap layer 230 may be lower than a top surface of the ILD layer, and the dielectric material may be deposited over the top surface of the gate cap layer 230, followed by a CMP process, thereby forming the self-aligned contact (SAC) dielectrics.

Figure 5A:
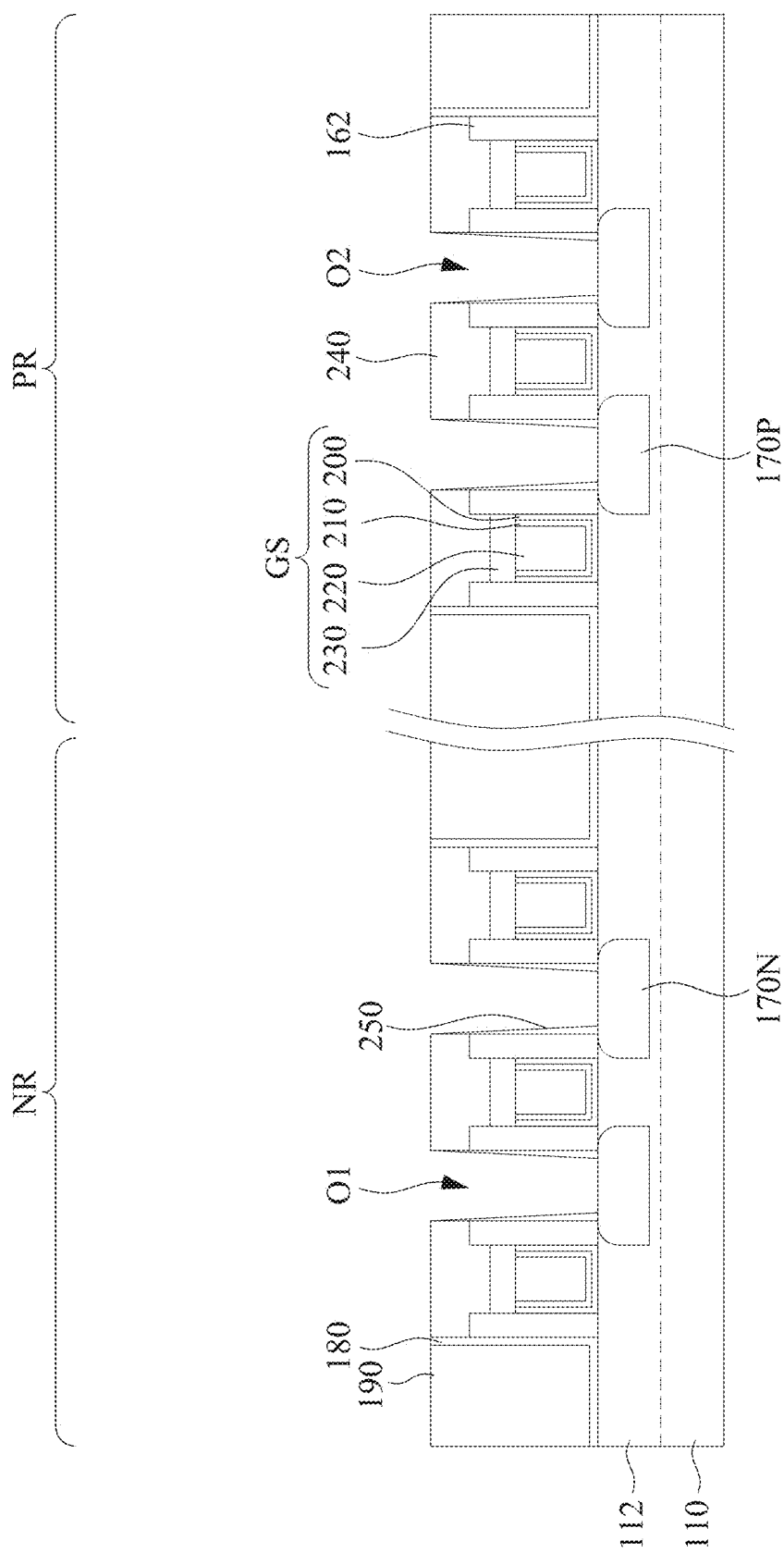
Figure 5B:
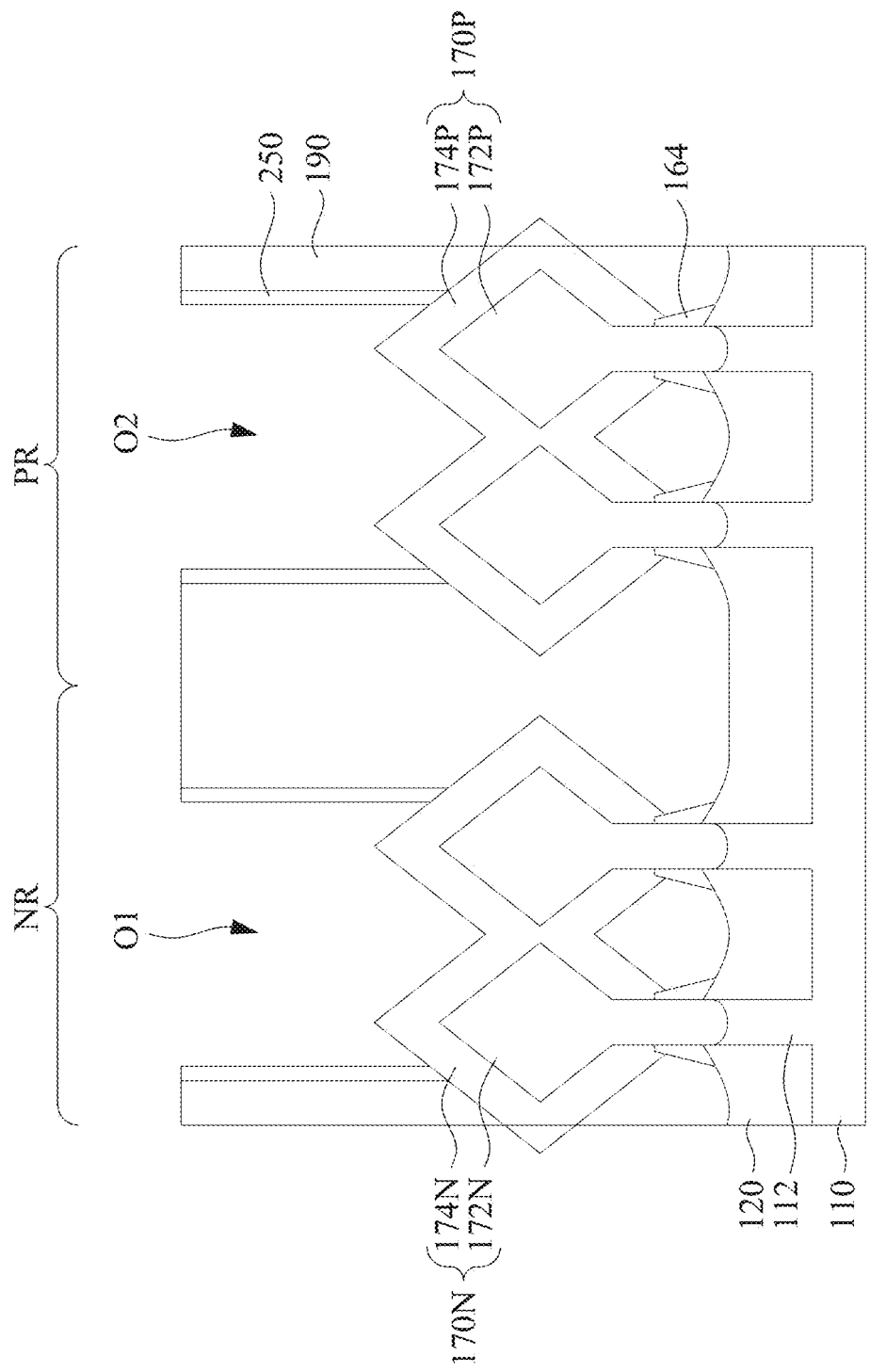

FIGS. 5A and 5B illustrate cross-sectional views of formation of source/drain contact openings O1 and O2. One or more etching processes are performed to etch through the ILD layer 190 and the CESL 180, thereby forming the source/drain contact openings O1 and O2. The source/drain contact openings O1 and O2 expose the source/drain epitaxial structures 170N and 170P, respectively.

In some embodiments, after the formation of the source/drain contact openings O1 and O2, nitride spacers 250 are formed on sidewalls of the source/drain contact openings O1 and O2. Formation of the nitride spacers 250 may include depositing a silicon nitride layer over the source/drain contact openings O1 and O2 and etching the silicon nitride layer using an anisotropic etching process. The anisotropic etching process may remove horizontal portions of the silicon nitride layer and remain vertical portions of the silicon nitride layer, which forms the nitride spacers 250 hereinafter. In some other embodiments, the nitride spacers 250 may be omitted.

Figure 6:
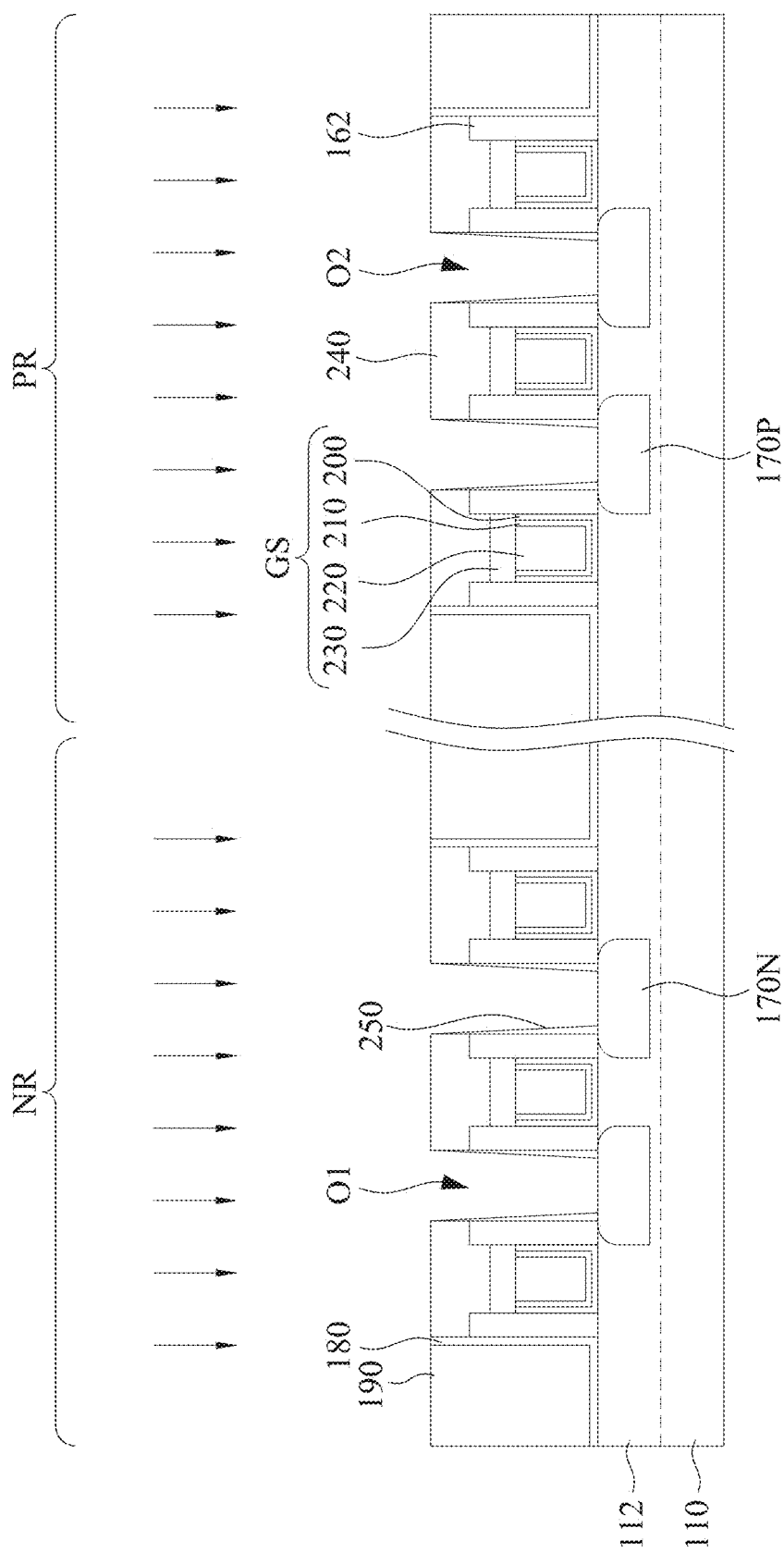

FIG. 6 illustrates a cross-sectional view of the structure under a cleaning process. The clean process may be optionally performed on the exposed surfaces of the source/drain epitaxial structures 170N and 170P. The clean process may be performed using, for example, a fluorine-based gas (e.g., HF), the like or other suitable gases. The clean process may remove the native oxide that is formed as a result of the nature oxidation of the exposed surfaces of the source/drain epitaxial structures 170N and 170P. The clean process may be referred to as a pre-silicide clean process in some embodiments. In some embodiments, prior to the clean process, a pre-silicide implantation process may be performed to dope the source/drain epitaxial structures 170N/

170P, thereby reducing the contact resistance between the source/drain epitaxial structure 170N/170P and subsequently formed silicide.

Figure 7A:
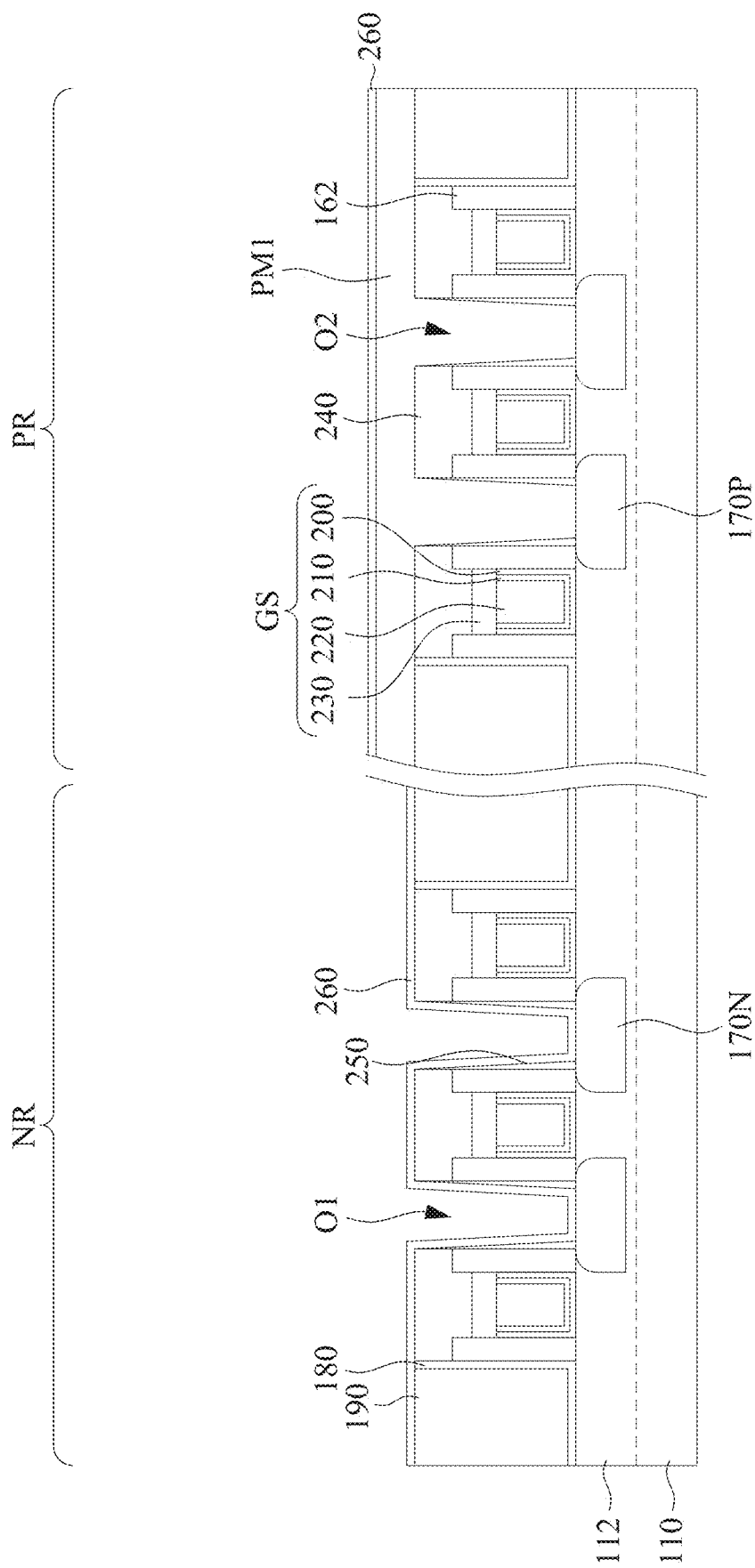
Figure 7B:
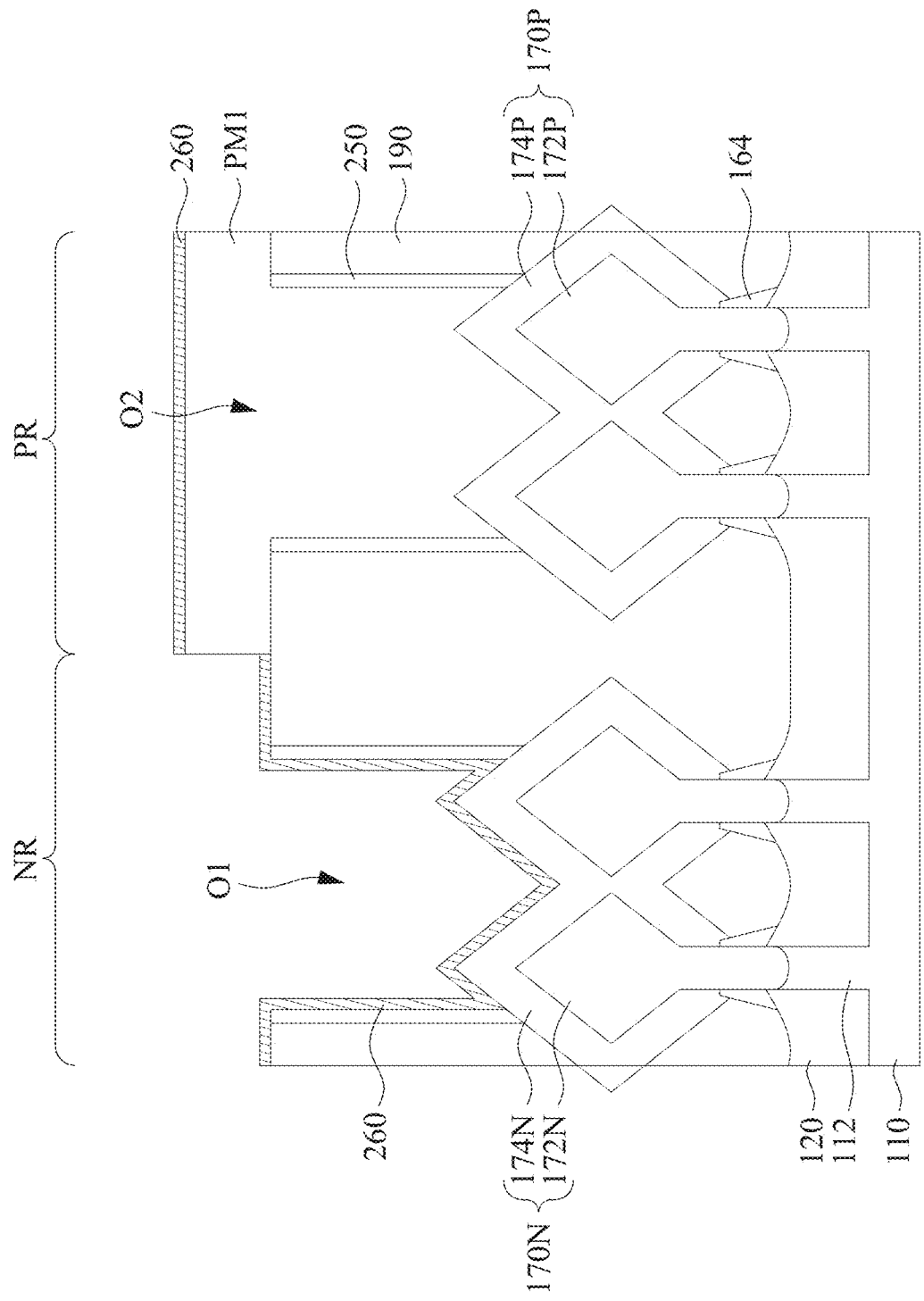

FIGS. 7A and 7B illustrates cross-sectional views of deposition of a semimetal layer 260 over the structure of FIG. 6. The semimetal layer 260 is deposited over the top surface of ILD layer 190, into the openings O1. The semimetal layer 260 may include suitable semimetals, such as Sb, Bi, graphene, the like, or the combination thereof. In the present embodiments, the semimetal layer 260 is a conformal liner deposited alongside the nitride spacers 250. In some other embodiments, the semimetal layer 260 is selectively deposited at a bottom of the openings O1, and not alongside the nitride spacers 250 as a conformal liner. The semimetal layer 260 may have a thickness in a range from about 0.5 nanometers to about 5 nanometers. The semimetal layer 260 may be deposited by PVD, CVD, ALD, the like, or the combination thereof. When the semimetal layer 260 includes Sb, precursors, such as $SbCl_3$, $(EtSi)_3Sb$, $BiCl_3$, $(EtSi)_3Bi$, $CH_4$, $C_2H_2$, other $C_xH_y$, or the like may be used for depositing the semimetal layer 260. Ethyl group, which is an alkyl substituent derived from ethane ($C_2H_6$), may be abbreviated Et. The precursors may co-flow with a suitable carrier gas, such as Ar, $H_2$, or the combination thereof. In some embodiments, the semimetal layer 260 may be deposited at a low deposition temperature. For example, Sb or Bi may be deposited at a deposition temperature ranging from about 50 Celsius degrees to about 100 Celsius degrees; and graphene may be deposited at a deposition temperature ranging from about 400 Celsius degrees to about 500 Celsius degrees. In some embodiments, a pressure for depositing the semimetal layer 260 may be in a range from about 10 mtorr to about 1 atm. In the present embodiments, the semimetal layer 260 is a continuous film. In some other embodiments, the semimetal layer 260 is discontinuous and having plural separated portions.

Figure 8A:
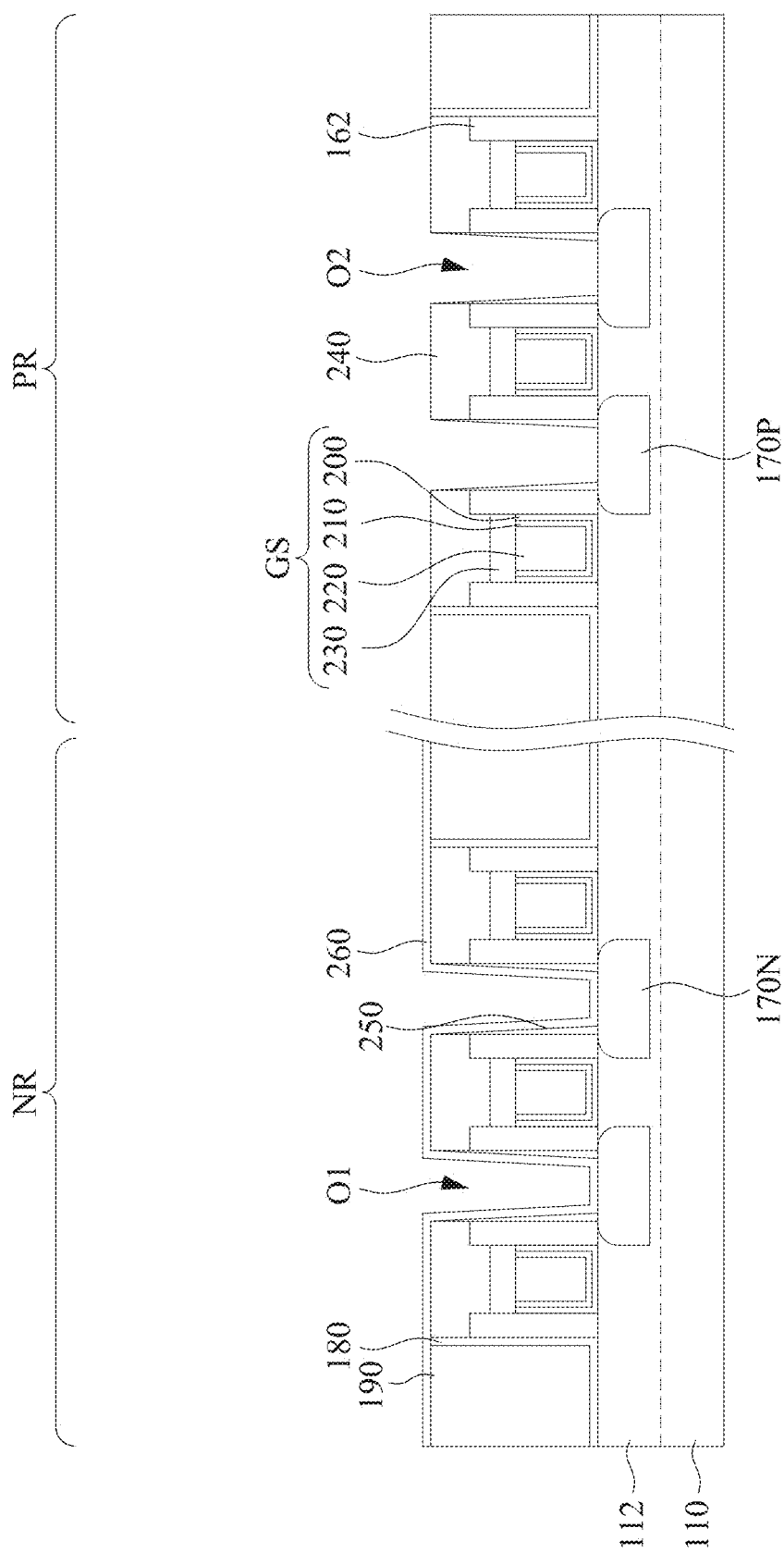
Figure 8B:
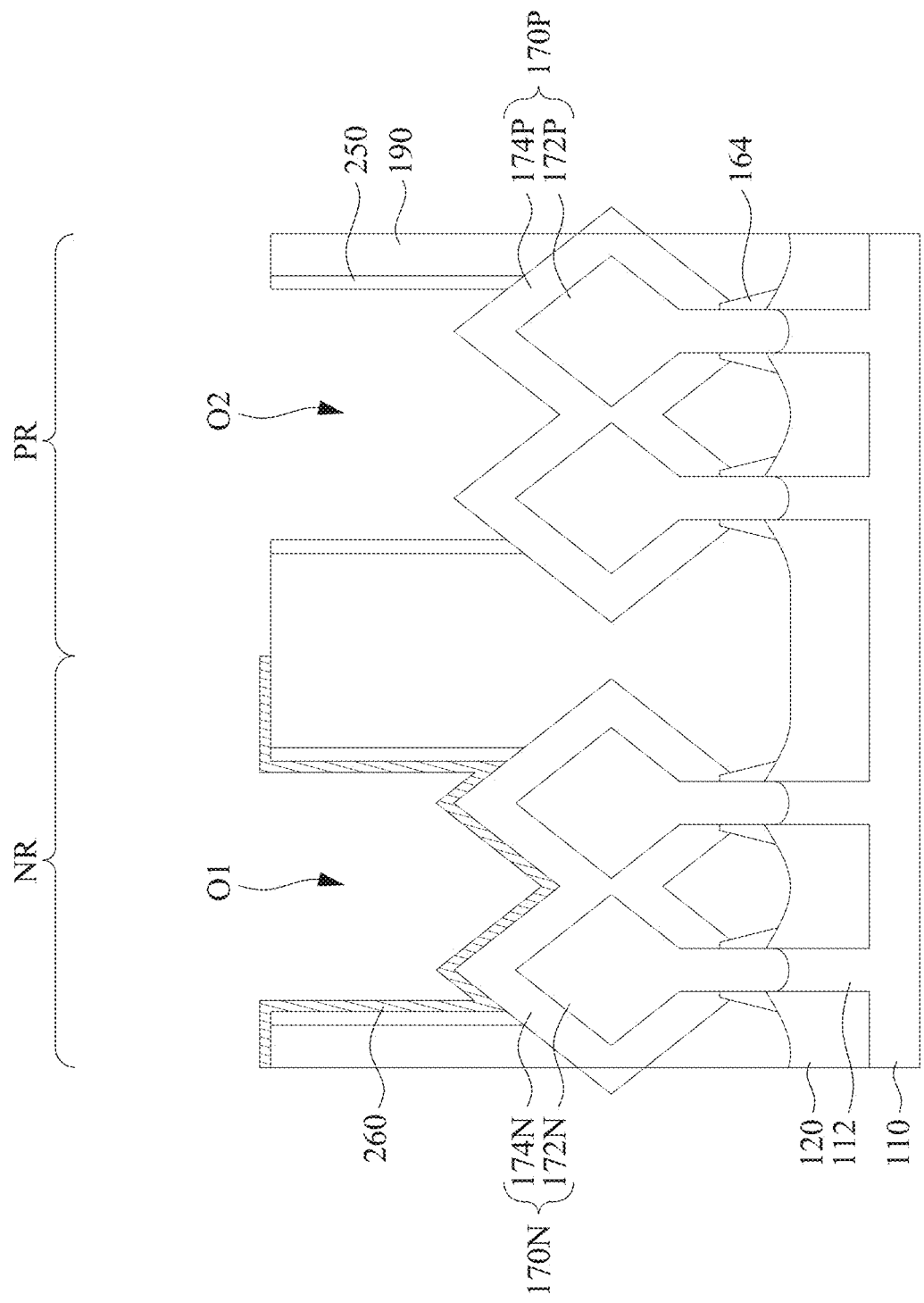

Prior to depositing the semimetal layer 260, a patterned mask PM1 may be formed to cover the region PR. In some embodiments, the patterned mask PM1 may include a photoresist formed by a photolithography process. An exemplary photolithography process may include processing steps of photoresist coating, soft baking, mask aligning, exposing, post-exposure baking, developing photoresist and hard baking. In some embodiments, the patterned mask PM1 may further include a planarized sacrificial layer below the photoresist. The planarized sacrificial layer, for example, can be an organic material used for the bottom anti-reflection coating (BARC). The deposited semimetal layer 260 may located over the patterned mask PM1. After depositing the semimetal layer 260, the patterned mask PM1 may be removed by suitable stripping or ashing process. The removal of the patterned mask PM1 may also remove a portion of the semimetal layer 260 over the region PR. The resulting structure is shown in FIGS. 8A and 8B.

After depositing the semimetal layer 260 and prior to overfilling the openings O1 and O2 with other materials (referring to FIGS. 9A and 9B later), a clean process may be optionally performed on the semimetal layer 260. The clean process may be performed using, for example, a fluorine-based gas (e.g., HF), the like or other suitable gases. The clean process may be referred to as a pre-silicide clean process in some embodiments.

Figure 9A:
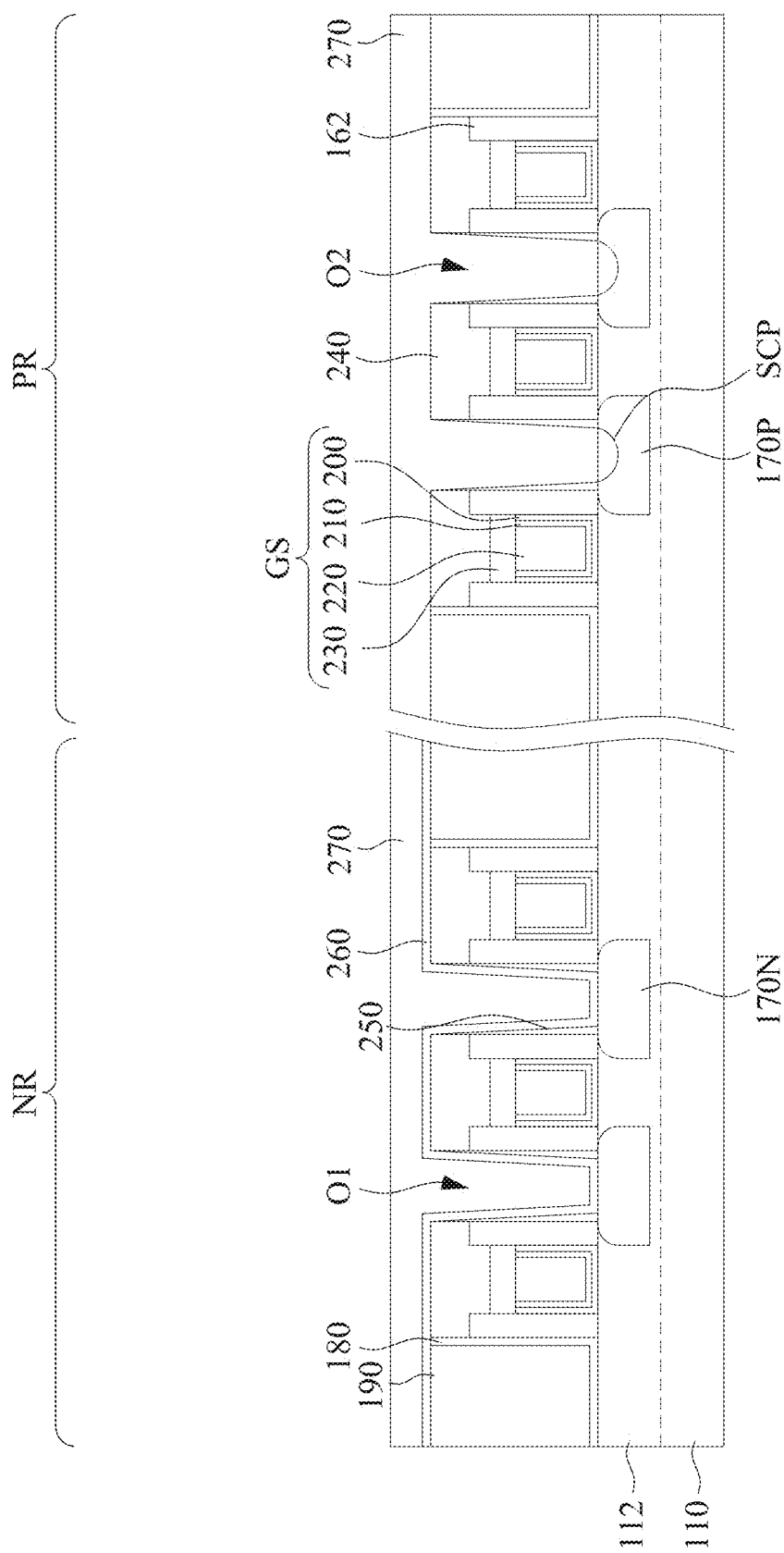
Figure 9B:
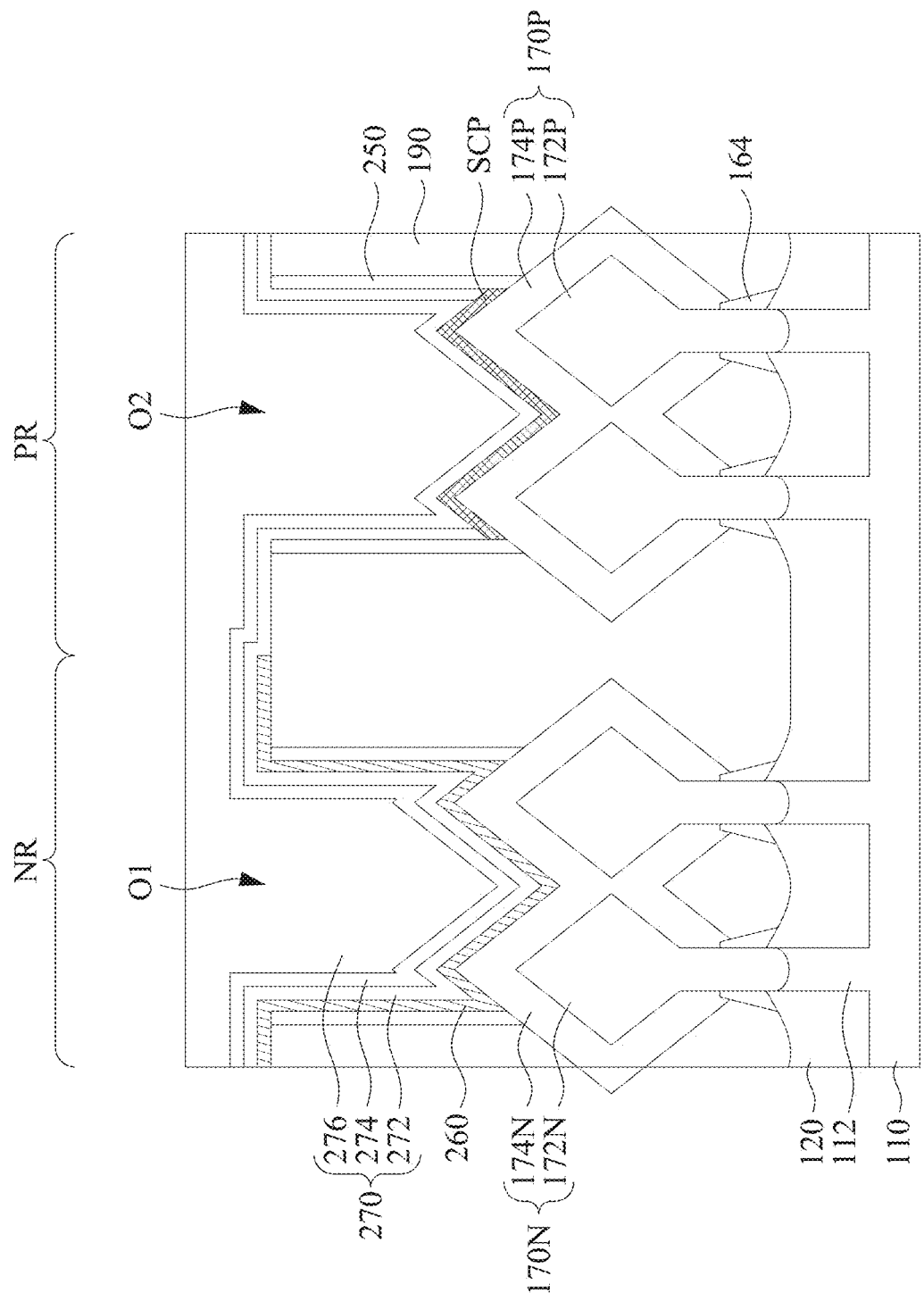

FIGS. 9A and 9B illustrate cross-sectional views of overfilling the openings O1 and O2 with a conductive material 270 according to some embodiments of the present disclosure. The conductive material 270 may include one or more conductive layers. In the present embodiments, the conductive material 270 includes a fill conductive layer 276, which may include Ni, Co, W, Ru, Er, Y, Yb, Eu, Tb, Lu, Th, Sc, Hf, Zr, Tb, Mo, Ir, Cu, Au, and Ag. Formation of the fill conductive layer 276 may include suitable deposition techniques (e.g., thermal CVD, PECVD, ALD, PEALD, PVD, the like or combinations thereof).

In some embodiments, prior to overfilling the openings O1 and O2 with the fill conductive layer 276, a silicide region SCP may be formed on top surfaces of the source/drain epitaxial structures 170P by using a silicidation process. The silicidation process may include depositing a metal-containing layer 272 over the top surfaces of the source/drain epitaxial structures 170P, followed by annealing the metal-containing layer 272 such that the metal-containing layer 272 reacts with silicon (and germanium if present) in the source/drain epitaxial structures 170P to form the metal silicide regions SCP. The annealing process may include rapid thermal annealing (RTA) and/or laser annealing processes. In some embodiments, the metal-containing layer 272 may include a metal or a metal silicide. The metal-containing layer 272 may include Ti, Ni, Co, W, Ru, Er, Y, Yb, Eu, Tb, Lu, Th, Sc, Hf, Zr, Mo, Tb, Ta, Pt, Cr, their alloys, the silicide thereof, the like, or the combination thereof. The metal-containing layer 272 may have a thickness in a range from about 2 nanometer to about 6 nanometers. Formation of the metal-containing layer 272 may include suitable deposition techniques (e.g., thermal CVD, PECVD, ALD, PEALD, PVD, the like or combinations thereof). Prior to the annealing process, a protection layer 274 may be deposited or formed over the metal-containing layer 272 for avoiding oxidation. The protection layer 274 may be formed by nitriding a surface layer of the metal-containing layer 272. The protection layer 274 may be a cap layer including suitable metal nitrides. For example, the protection layer 274 may include RuN, CoN, TiN, MoN, NiN, PtN, TaN, WN, CrN, ZrN, the like, or the combination thereof. For example, in some embodiments where the metal-containing layer 272 is a TiSi layer or a Ti layer, the protection layer 274 may be a TiSiN layer or a TiN layer. The protection layer 274 may have a thickness in a range from about 0.5 nanometer to about 4 nanometers. The conductive material 270 may include metal-containing layer 272, the protection layer 274, and the fill conductive layer 276. The protection layer 274 may be omitted in some embodiments. After deposition of the fill conductive layer 276, the metal silicide regions SCP may be located between the source/drain epitaxial structure 170P and the fill conductive layer 276.

Figure 13A:
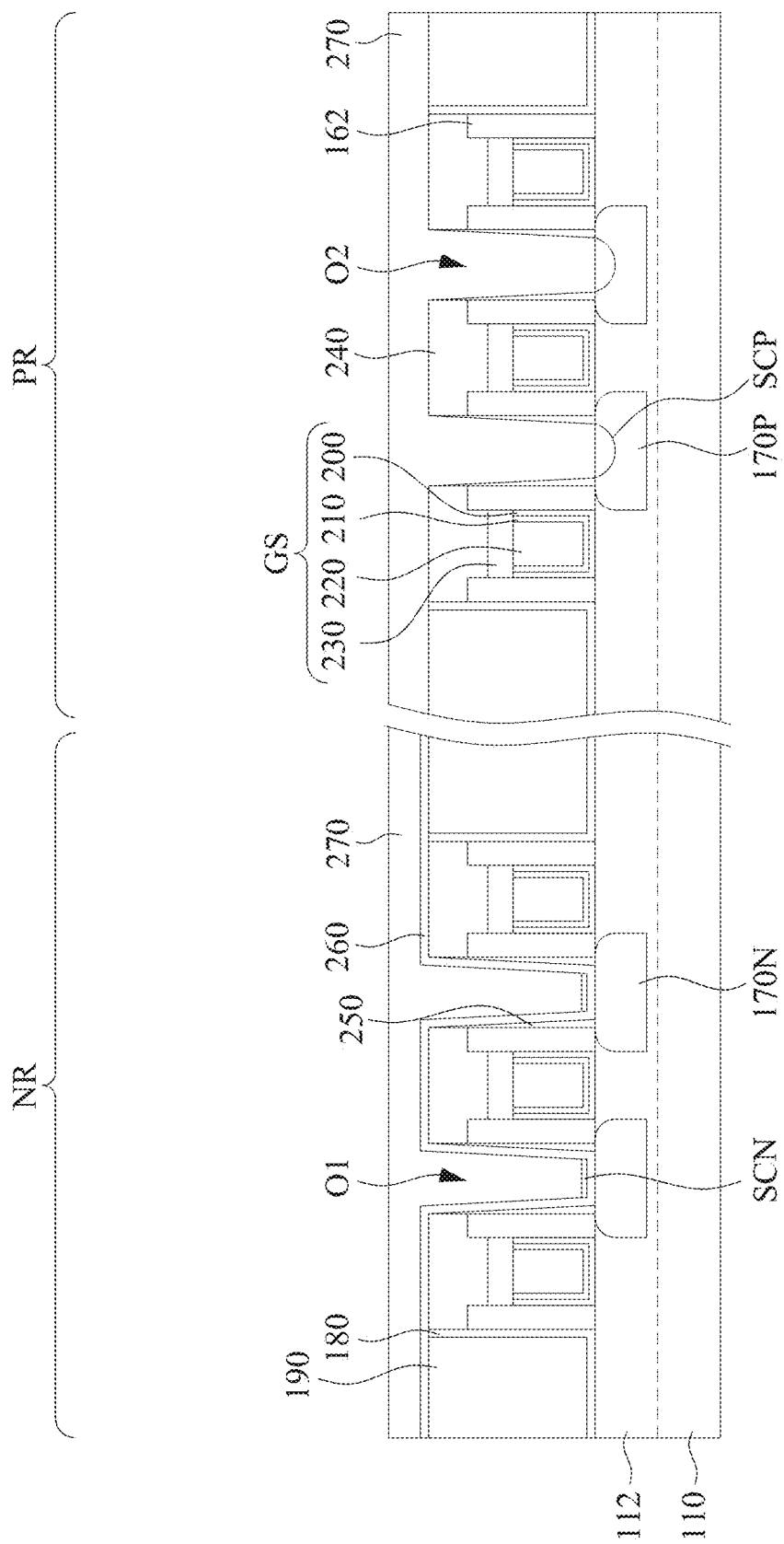
FIGS. 13A-15 illustrate a method of manufacturing a semiconductor device at various stages in accordance with some embodiments of the present disclosure.
Figure 13B:
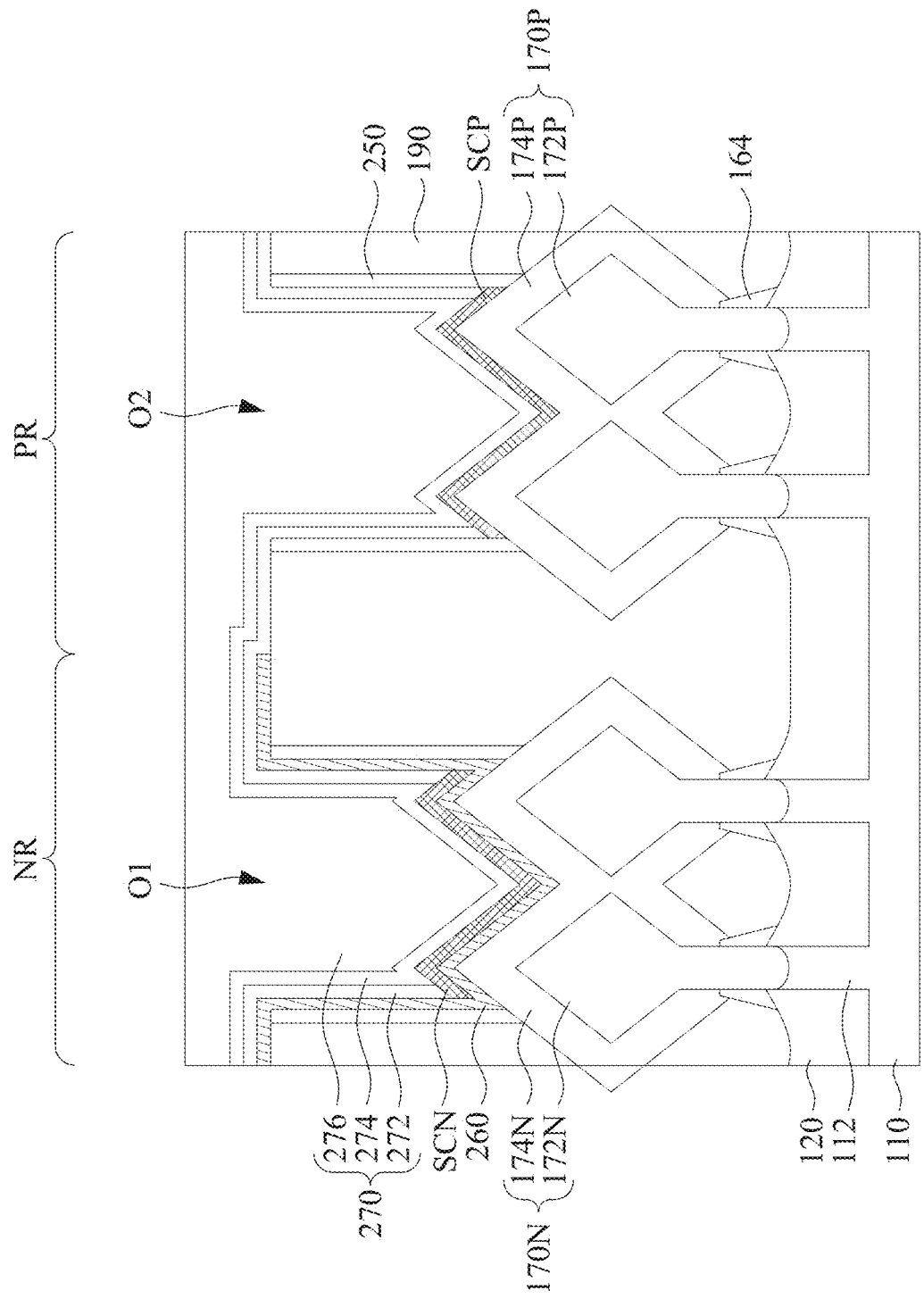
Figure 13C:
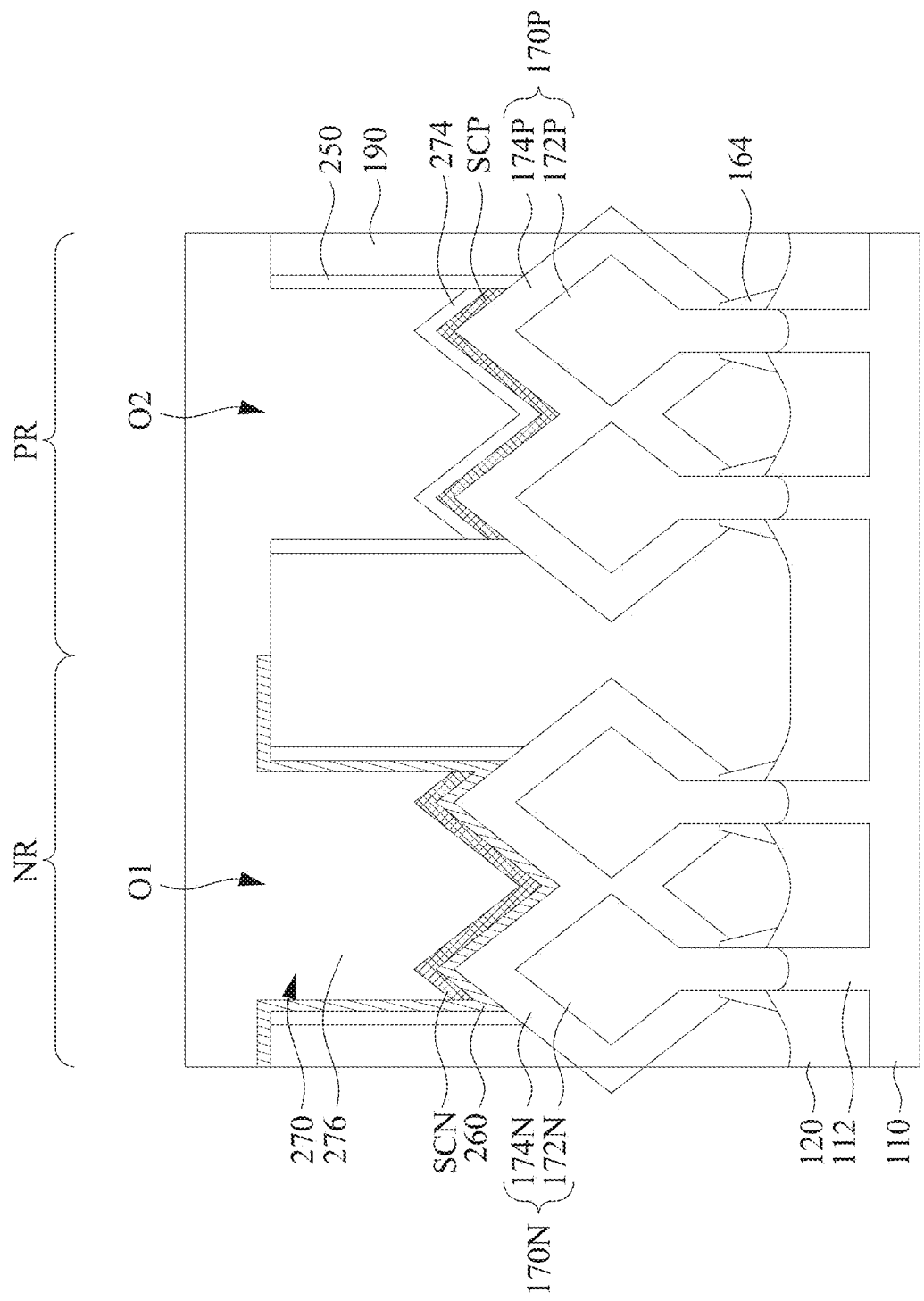

In the present embodiments, in the region NR, the semimetal layer 260 may be thick enough to space the metal-containing layer 272 apart from the underlying source/drain epitaxial structure 170N. Thus, in the embodiments where the metal-containing layer 272 is a metal layer, the silicidation process may form little or no metal silicide region over the source/drain epitaxial structure 170N in the region NR. For example, the semimetal layer 260 may have a thickness in a range from about 2 nanometers to about 5 nanometers. In some embodiments, Cl, Si, C, O, F, and metal impurities of the conductive material 270 may be found in the semimetal layer 260, in which Cl, Si, C, and F may come from precursors using for depositing the semimetal layer 260, and O may come from environments. In some other embodiments as illustrated in FIGS. 13A-13C later, when the metal-containing layer 272 is a metal layer, the semimetal layer 260 may be thin enough to allow the formation of a metal silicide region over the source epitaxial structure 170N. In some other embodiments, the metal-containing layer 272 is a metal silicide layer directly formed over the semimetal layer 260, and the thickness of the semimetal layer 260 does not substantially affect the formation of the metal silicide layer. The metal-containing layer 272 and the protection layer 274 over the region NR may be omitted in some embodiments.

In the present embodiments, as shown in FIG. 9B, the non-reacted portions of the metal-containing layer 272 on sidewalls of the openings O1 and O2 may remain, and portions of the protection layer 274 on the sidewalls of the openings O1 and O remains as well. Thus, after the deposition of the fill conductive layer 276, the metal-containing layer 272 and the protection layer 274 laterally surround the fill conductive layer 276.

Figure 9C:
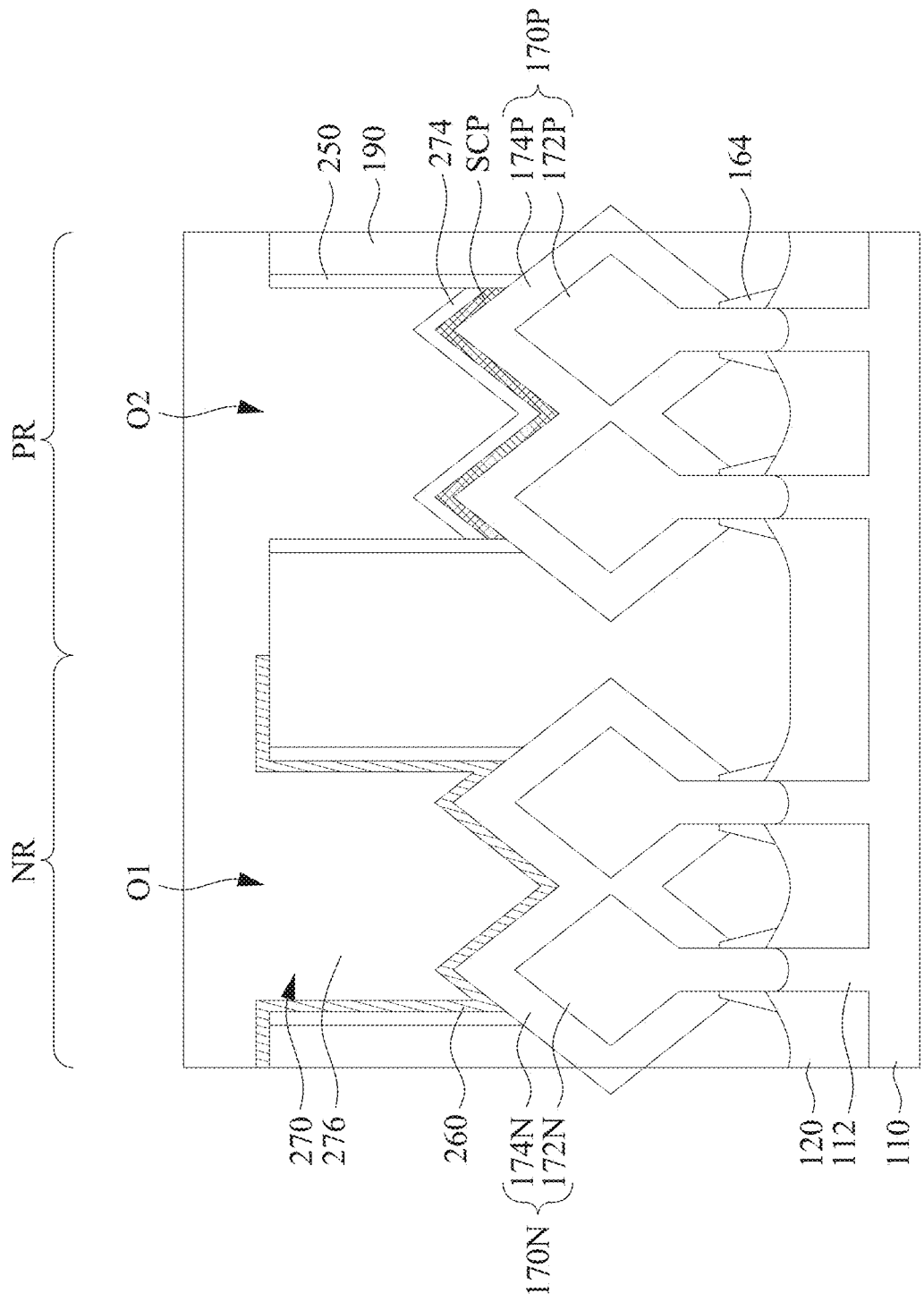

FIG. 9C illustrate cross-sectional views of overfilling the openings O1 and O2 with a fill conductive layer 276 according to some other embodiments. Details of the present embodiments are similar to those illustrated in FIG. 9B, except that the non-reacted portions of the metal-containing layer 272 on sidewalls of the openings O1 and O2 (referring to FIG. 9B) may be removed from the sidewalls, and the portions of the protection layer 274 on the sidewalls of the openings O1 and O2 (referring to FIG. 9B) are removed as well. Thus, after the deposition of the fill conductive layer 276, sidewalls of the fill conductive layer 276 may be free of the metal-containing layer 272 and protection layer 274. Other details regarding FIG. 9C are similar to FIG. 9B, and thereto not repeated herein.

Figure 10A:
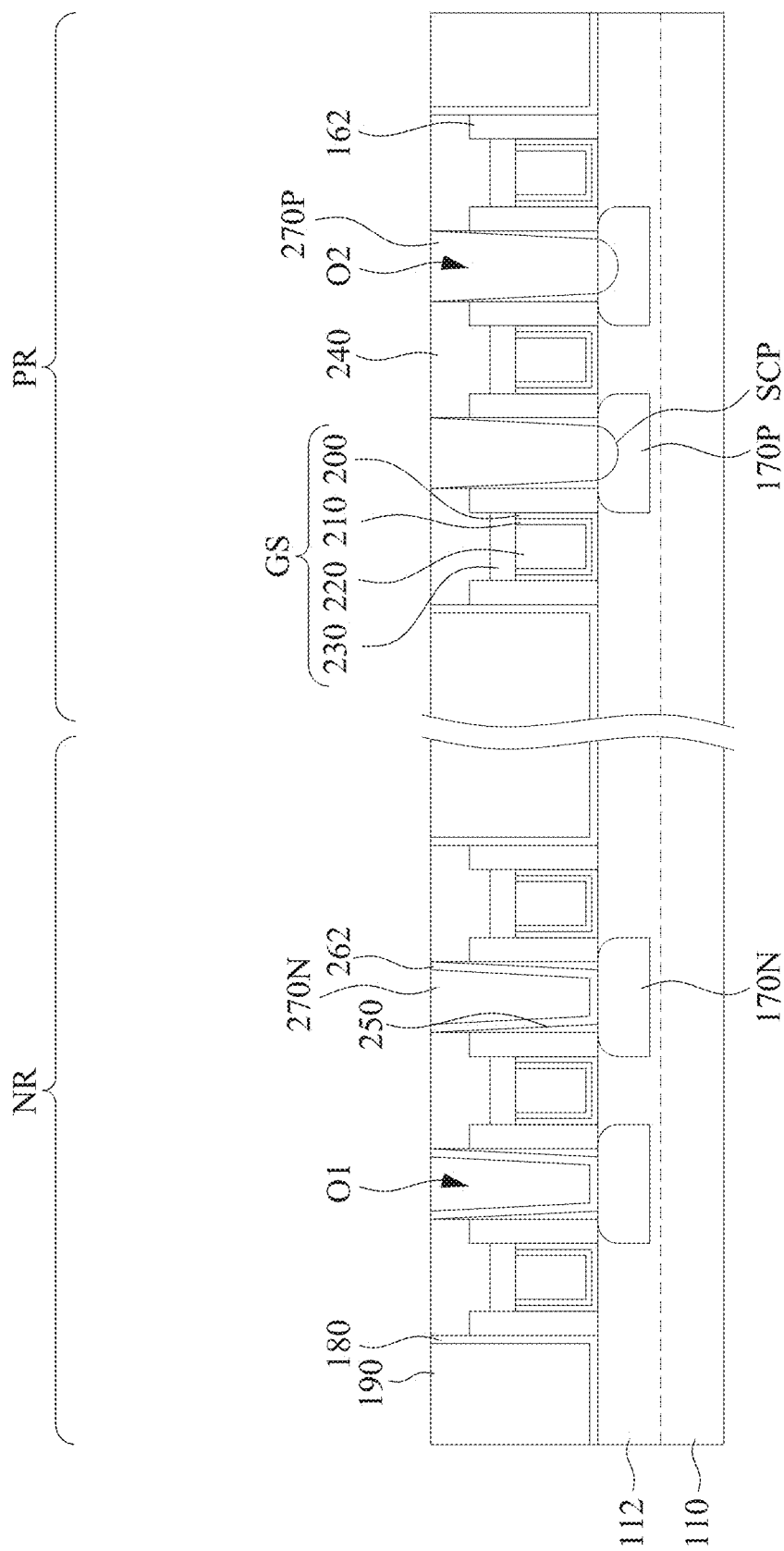
Figure 10B:
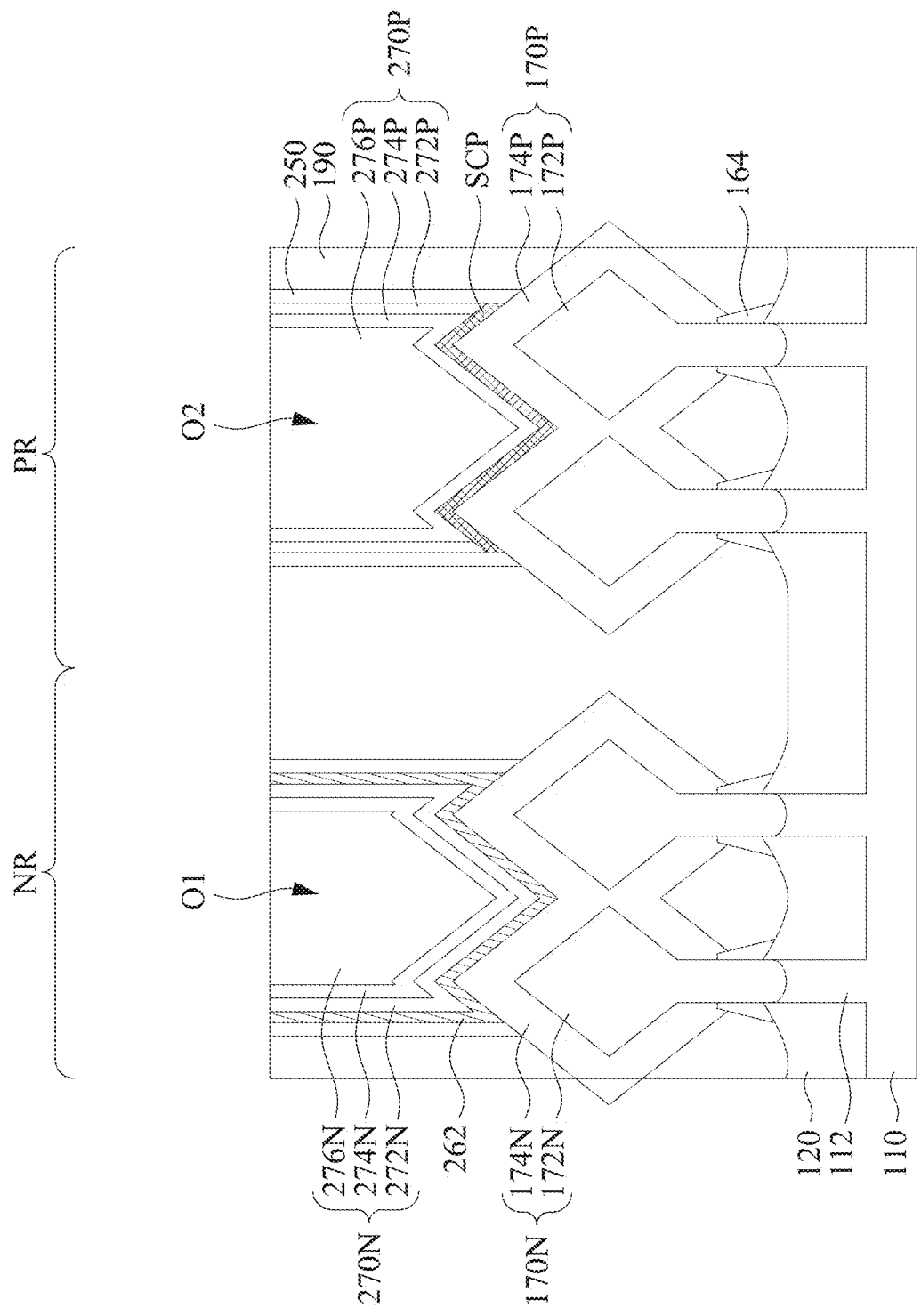

FIGS. 10A and 10B illustrate formation of source/drain contacts. After depositing the conductive material 270, a planarization process is performed to remove a portion of the semimetal layer 260 and a portion of the conductive material 270 (referring to FIGS. 9A-9B) from a top surface of the ILD layer 190. In the embodiments of FIG. 10B, the planarization process may remove a portion of the semimetal layer 260, a portion of the metal-containing layer 272, a portion of the protection layer 274, and a portion of the fill conductive layer 276 (referring to FIG. 9B) from the top surface of the ILD layer 190. The planarization process may be a chemical mechanical polishing (CMP) process. Remaining portions of the semimetal layer 260, the metal-containing layer 272, the protection layer 274, and the fill conductive layer 276 are referred to as a semimetal layer 262, metal-containing layers 272N and 272P, the protection layers 274N and 274P, and source/drain contacts 276N and 276P, respectively. In some embodiments, a combination of the metal-containing layer 272N, the protection layer 274N, and the source/drain contact 276N may be referred to as a source/drain contact 270N; and a combination of the metal-containing layer 272P, the protection layer 274P, and the source/drain contact 276P may be referred to as a source/drain contact 270P.

Figure 10C:
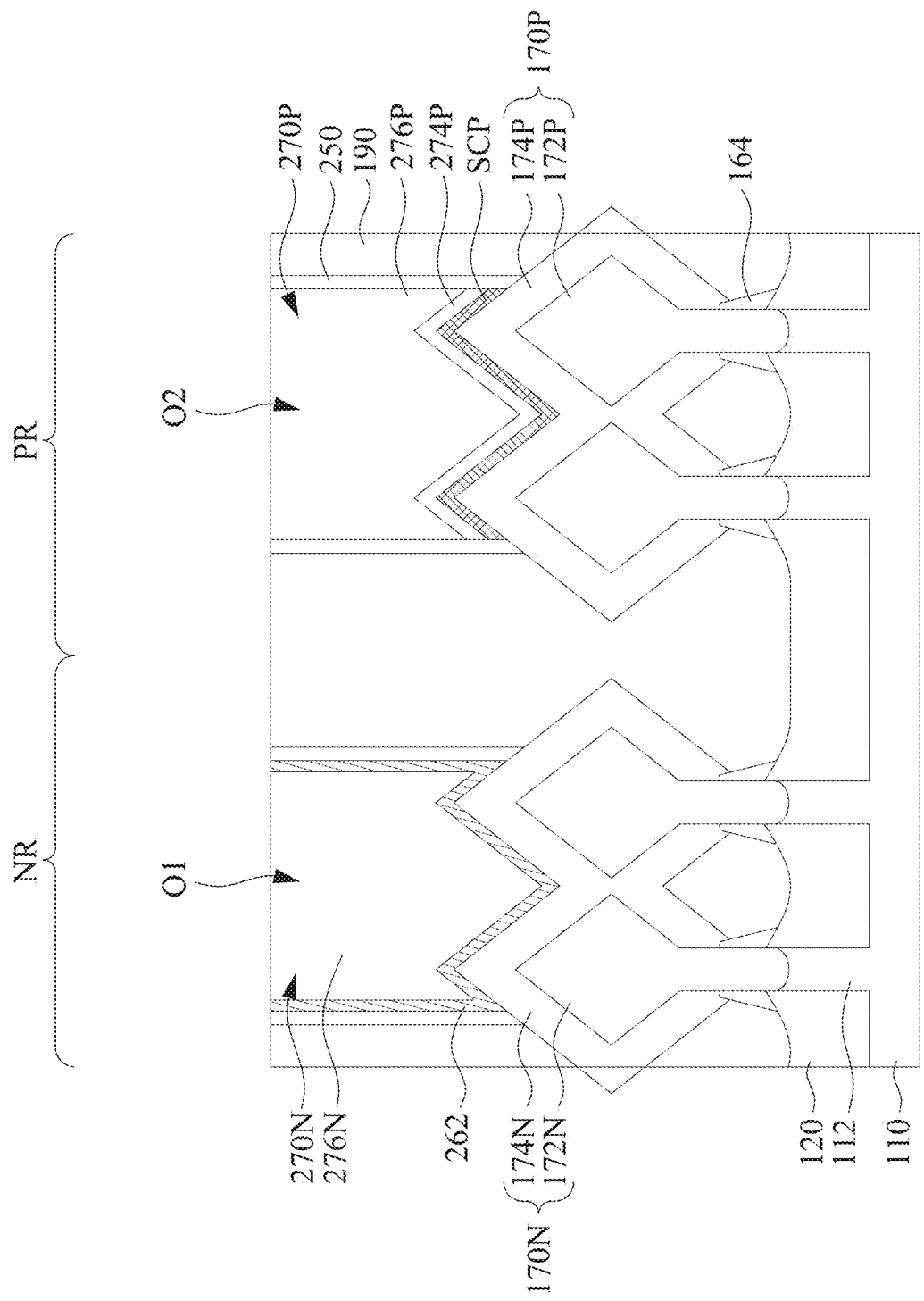

FIG. 10C illustrates cross-sectional views of formation of source/drain contacts according to some other embodiments. Details of the present embodiments are similar to those illustrated in FIG. 10B, except that the planarization process is performed to remove a portion of the semimetal layer 260 and a portion of the fill conductive layer 276 (referring to FIG. 9C) from the top surface of the ILD layer 190, such that the sidewalls of the source/drain contacts 276N and 276P may be free of the metal-containing layer 272 and protection layer 274 as illustrated in FIG. 9C. Other details regarding FIG. 10C are similar to FIG. 10B, and thereto not repeated herein.

Figure 11:
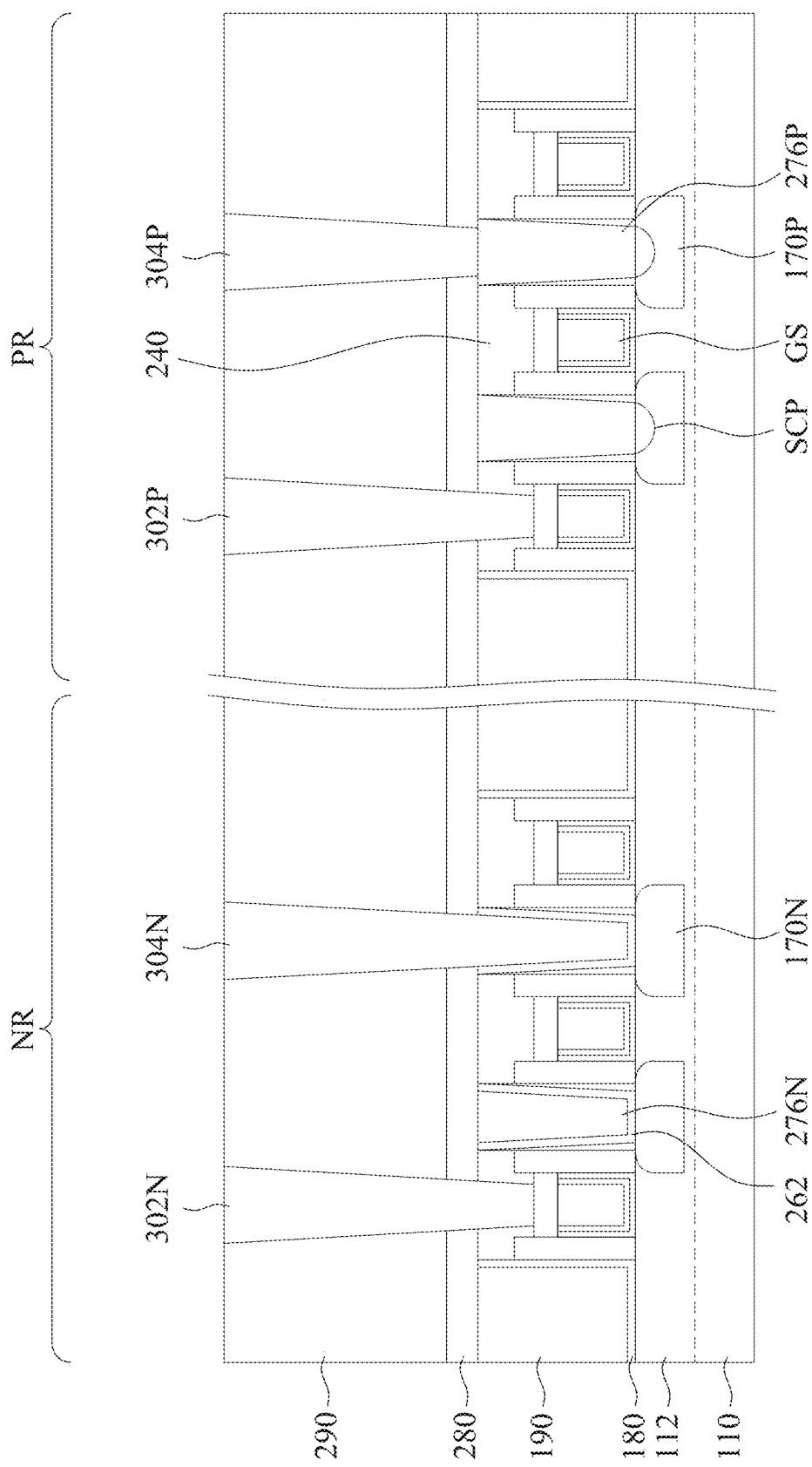

FIG. 11 illustrates formation of gate contacts 302N and 302P and conductive features 304N and 304P. An etch stop layer 280 and an ILD layer 290 are formed over the ILD layer 190 and the gate structure GS. The etch stop layer 280 may be formed of a similar material to the CESL 180 by using similar deposition techniques to the CESL 180 as discussed previously, and thus are not described again for the sake of brevity. The ILD layer 290 may be formed of a similar material to the ILD layer 190 by using similar deposition techniques to the ILD layer 190 as discussed previously, and thus are not described again for the sake of brevity. The etch stop layer 280 may have a thickness in a range from about 3 nanometers to about 20 nanometers. The ILD layer 290 may have a thickness in a range from about 3 nanometers to about 40 nanometers.

One or more etching processes are performed to etch through the ILD layer 290, the etch stop layer 280, and the dielectric features 240 to form openings exposing the gate structure GS or the source/drain contacts 276N and 276P. In some embodiments, one or more metal materials are deposited to fill the openings. The one or more deposited metal materials may include W, Ru, Co, Cu, Ti, TiN, Ta, TaN, Mo, Ni, the like or combinations thereof. The one or more metal materials may be deposited by suitable deposition techniques (e.g., CVD, PVD, ALD, the like or combinations thereof). In some embodiments, the one or more metal materials may or may not include a glue layer. A CMP process may be performed to remove excess metal materials above a top surface of the ILD layer 290, while leaving metal materials in the openings to serve as the gate contacts 302N and 302P and conductive features 304N and 304P. After the formation of gate contacts 302N and 302P and conductive features 304N and 304P, an interconnect structure comprising one or more metallization layers may be formed on the gate contacts 302N and 302P and conductive features 304N and 304P by suitable back-end-of-line (BEOL) process.

Figure 12A:
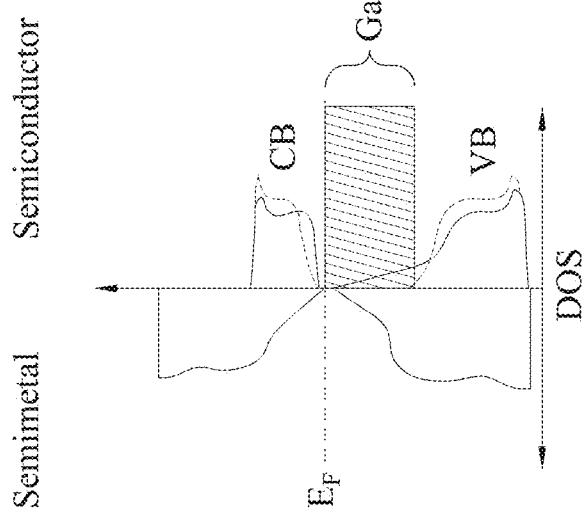
FIGS. 12A and 12B respectively illustrate density of states (DOS) of a metal-semiconductor contact and a semimetal-semiconductor contact in accordance with some embodiments of the present disclosure.
Figure 12B:
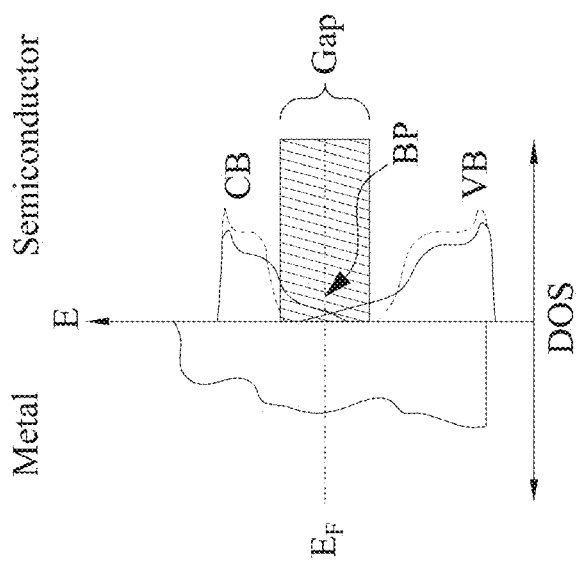
Figure 12C:
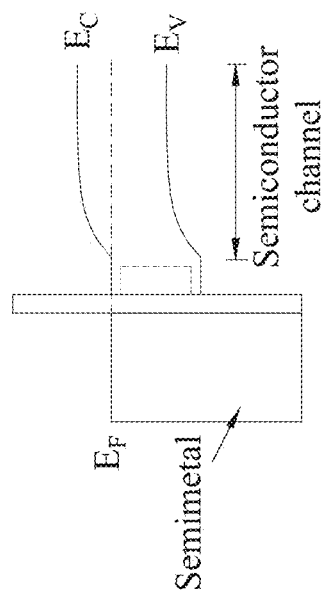
FIGS. 12C and 12D respectively illustrate band structures of a metal-semiconductor contact and a semimetal-semiconductor contact in accordance with some embodiments of the present disclosure.
Figure 12D:
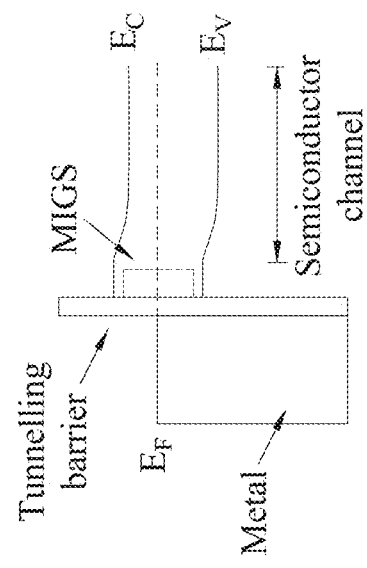

FIGS. 12A and 12B respectively illustrate density of states (DOS) of a metal-semiconductor contact and a semimetal-semiconductor contact in accordance with some embodiments of the present disclosure. FIGS. 12C and 12D respectively illustrate band structures of a metal-semiconductor contact and a semimetal-semiconductor contact in accordance with some embodiments of the present disclosure. In FIGS. 12A and 12B, DOS is shown on the horizontal axis, and the energy level (E) is shown on the vertical axis. In the figures, a conduction band CB is spaced apart from a valence band VB by a gap G, and the areas filled with hatch pattern indicate electron-occupied states. In FIGS. 12C and 12D, position is shown on the horizontal axis, and the energy level (E) is shown on the vertical axis. Conduction band energy $E_C$ and valence band energy $E_V$ are indicated in the band structures of FIGS. 12C and 12D.

For the metal-semiconductor contact (referring to FIG. 12A), Schottky barrier may be formed between the metal electrode and the semiconductor. As shown in FIG. 12A, when a semiconductor is in close proximity to a metal surface, the extended wavefunction from the metal perturbs the environment of the semiconductor, leading to rehybridizations of the semiconductor's original wavefunctions. Metal-induced gap states (MIGS) are a result of such perturbation, where new states in resonance with the metal states emerge in the bandgap. The conduction band CB and valence band VB may contribute to the MIGS. The Fermi level ($E_F$) is pinned at around the branching point of the MIGS (which is indicated as point BP), leading to gap-state pinning. In FIG. 12C, a Schottky barrier is formed as a result of gap-state pinning. As FIG. 12C shows, a tunneling barrier is between the metal and the semiconductor channel.

For the semimetal-semiconductor contact (referring to FIG. 12B), because the Fermi level ($E_F$) of the semimetal aligns with the conduction band of the semiconductor, and the DOS at the Fermi level of the semimetal is near-zero, conduction-band contributed MIGS are suppressed and the branching point is elevated into the conduction band. The MIGS, now mostly contributed by the valence band, are saturated, leading to gap-state saturation. The gap-state pinning is avoided. In FIG. 12D, ohmic contact is formed as a result of gap-state saturation. In this way, the semiconductor in contact with semimetal will be free of a Schottky barrier at the interface.

FIGS. 13A-15 illustrate a method of manufacturing a semiconductor device at various stages in accordance with some embodiments of the present disclosure. Details of the manufacturing method of present embodiments are similar to that of FIGS. 1A-11, except that the semimetal layer 260 is thin enough to allow the formation of a metal silicide region. It is understood that additional steps may be provided before, during, and after the steps shown in FIGS. 13A-15, and some of the steps described below can be replaced or eliminated for additional embodiments of the method. The order of the operations/processes may be interchangeable.

FIGS. 13A and 13B illustrate cross-sectional views of overfilling the openings O1 and O2 with a conductive material 270 according to some embodiments of the present disclosure. The conductive material 270 includes at least a fill conductive layer 276. Formation and materials of conductive material 270 are similar to those illustrated in FIGS. 9A and 9B, and thereto not repeated herein.

In the present embodiments, as the semimetal layer 260 is deposited with a thin thickness, prior to overfilling the openings O1 and O2 with the fill conductive layer 276, silicide regions SCN and SCP may be respectively formed on the semimetal layer 260 and top surfaces of the source/drain epitaxial structures 170P by using a silicidation process. The silicidation process may include depositing a metal-containing layer 272 over the top surfaces of the semimetal layer 260 and the source/drain epitaxial structures 170P, followed by annealing the metal-containing layer 272. The annealing process is performed such that a portion of the metal-containing layer 272 over the top surface of the semimetal layer 260 reacts with the semimetal layer 260 and a semiconductor material (e.g., silicon) in the source/drain epitaxial structures 170N to form the metal silicide regions SCN, and a portion of the metal-containing layer 272 over the top surface of the source/drain epitaxial structures 170P reacts with a semiconductor material (e.g., silicon and/or germanium) in the source/drain epitaxial structures 170P to form the metal silicide regions SCP. Prior to the annealing process, a protection layer 274 may be deposited or formed over the metal-containing layer 272 for avoiding oxidation. The protection layer 274 may be formed by nitriding a surface layer of the metal-containing layer 272. In the present embodiments, the semimetal layer 260 may have a thickness in a range from about 0.5 nanometer to about 2 nanometers, being thin enough to allow the formation of the metal silicide region SCN. Thus, in the embodiments where the metal-containing layer 272 is a metal layer, the silicidation process may form metal silicide region SCN over the semimetal layer 260 with the underlying source/drain epitaxial structure 170N in the region NR. The metal silicide region SCN may reduce Schottky barrier height and lowering the contact resistivity, which are further discussed in FIG. 16A-18. In some other embodiments, the metal-containing layer 272 is a metal silicide layer directly formed over the semimetal layer 260, and the thickness of the semimetal layer 260 does not substantially affect the formation of the metal silicide layer. After deposition of the conductive material 270, the metal silicide regions SCN/SCP may be located between the source/drain epitaxial structure 170N/170P and the conductive material 270. Other detail regarding the deposition of the conductive material 270 are similar to those illustrated in FIGS. 9A and 9B, and thereto not repeated herein.

As aforementioned, Cl, Si, C, O, F and metal impurities of the conductive material 270 may be found in the semimetal layer 260. With the metal silicide regions SCN on top of the semimetal layer 260, some silicide metal impurity (e.g., TiSi) could be found in the semimetal layer 260. In some embodiments, with the metal silicide regions SCN on top of the semimetal layer 260, the oxygen concentration in the semimetal layer 260 could be reduced.

In the present embodiments, as shown in FIG. 13B, the non-reacted portions of the metal-containing layer 272 on sidewalls of the openings O1 and O2 may remain, and portions of the protection layer 274 on the sidewalls of the openings O1 and O remains as well. Thus, after the deposition of the fill conductive layer 276, the metal-containing layer 272 and the protection layer 274 laterally surround the fill conductive layer 276.

FIG. 13C illustrates cross-sectional views of overfilling the openings O1 and O2 with a fill conductive layer 276 according to some other embodiments. Details of the present embodiments are similar to those illustrated in FIG. 13B, except that the non-reacted portions of the metal-containing layer 272 on sidewalls of the openings O1 and O2 (referring to FIG. 13B) may be removed from the sidewalls, and the portions of the protection layer 274 on the sidewalls of the openings O1 and O2 (referring to FIG. 13B) are removed as well. Thus, after the deposition of the fill conductive layer 276, sidewalls of the fill conductive layer 276 may be free of the metal-containing layer 272 and protection layer 274. Other details regarding FIG. 13C are similar to FIG. 13B, and thereto not repeated herein.

Figure 14A:
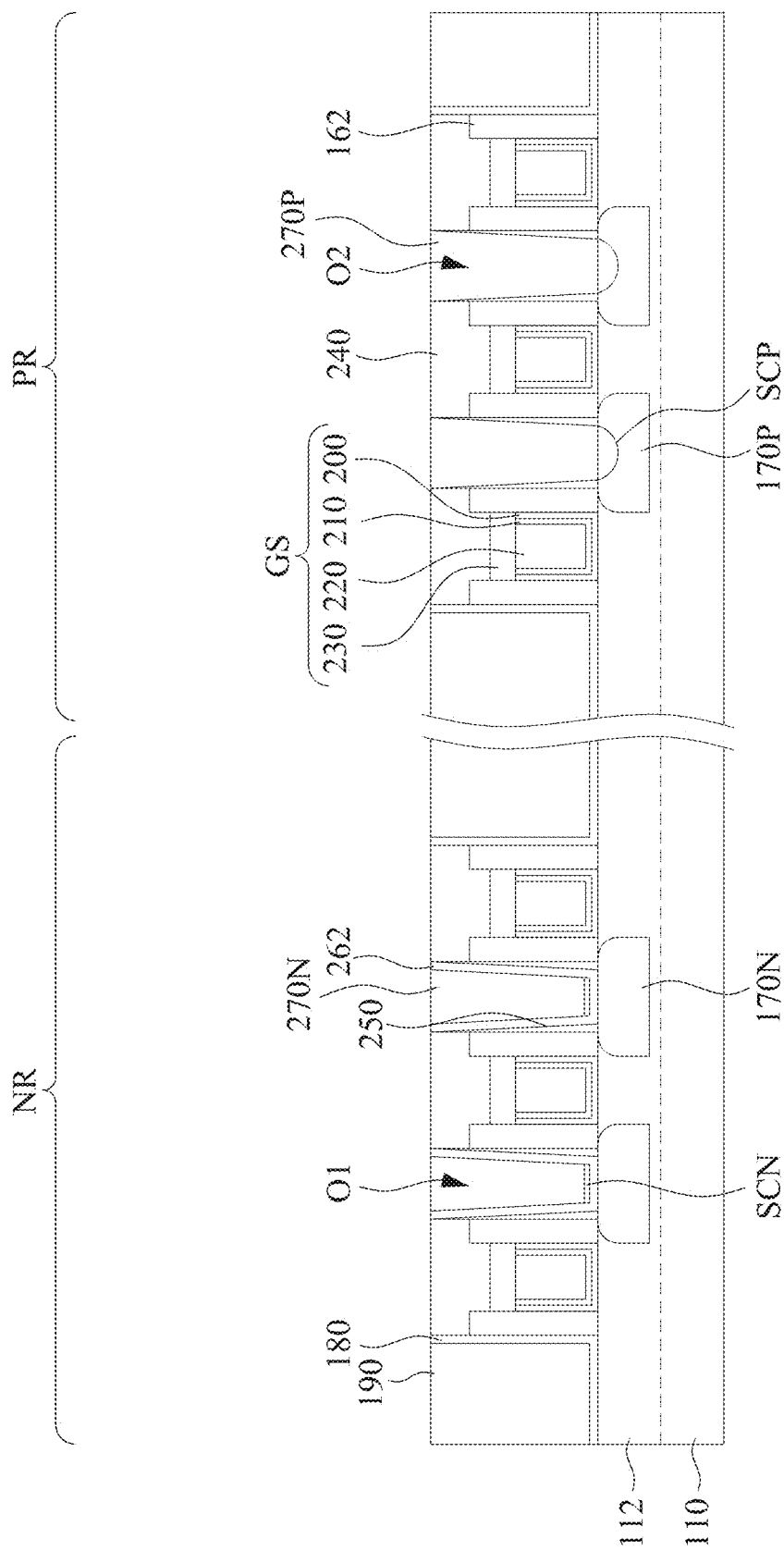
Figure 14B:
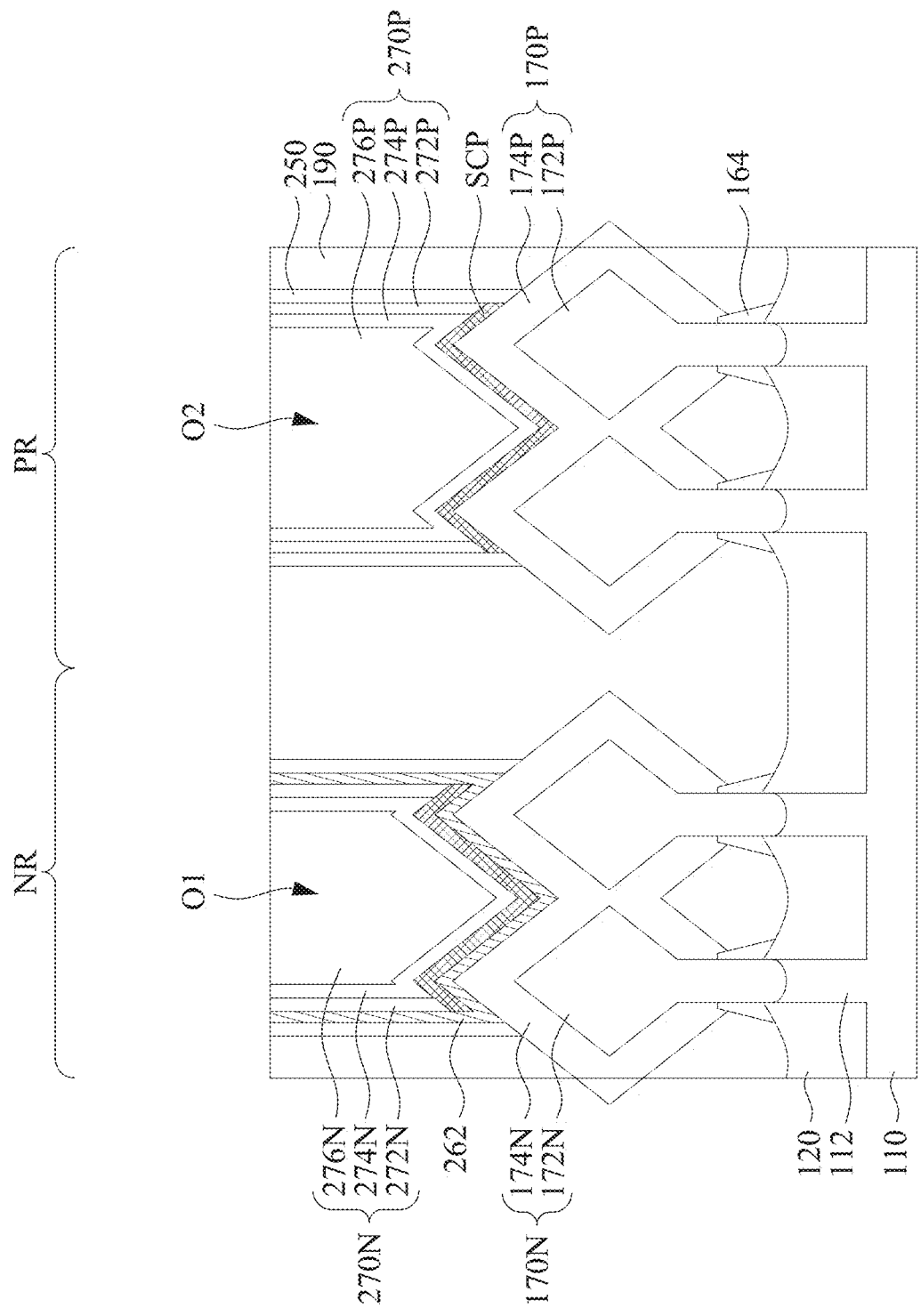
Figure 14C:
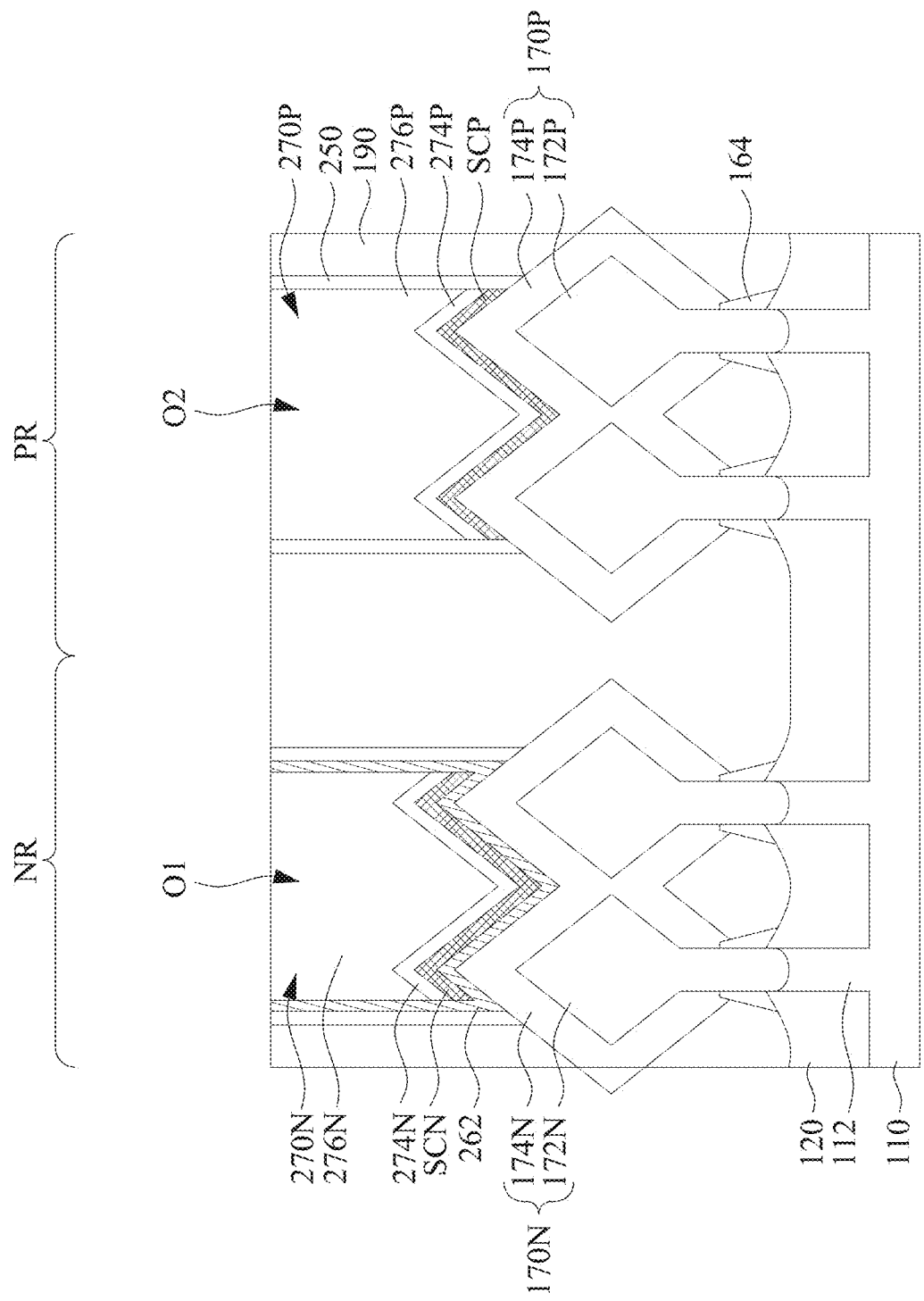

FIGS. 14A-14B illustrate formation of source/drain contacts according to some embodiments. As aforementioned, a planarization process is performed to remove a portion of the semimetal layer 260 and a portion of the conductive material 270 (referring to FIGS. 13A-13B) above a top surface of the ILD layer 190. In the embodiments of FIG. 14B, the planarization process is performed to remove a portion of the semimetal layer 260, a portion of the metal-containing layer 272, a portion of the protection layer 274, and a portion of the fill conductive layer 276 (referring to FIG. 13B) from the top surface of the ILD layer 190. After the planarization process, remaining portions of the fill conductive layer 276 (referring to FIGS. 13A-13C) form the source/drain contacts 276N and 276P, which may form source/drain contacts 270N and 270P with remaining portions of the metal-containing layer 272 (i.e., the metal-containing layers 272N and 272P) and remaining portions of the protection layer 274 (i.e., the protection layers 274N and 274P). FIG. 14C illustrates formation of source/drain contacts 270N and 270P according to some other embodiments. In the embodiments of FIG. 14C, the planarization process is performed to remove a portion of the semimetal layer 260 and a portion of the fill conductive layer 276 (referring to FIGS. 13A and 13C) from the top surface of the ILD layer 190. After the planarization process, remaining portions of the fill conductive layer 276 (referring to FIG. 13C) form the source/drain contacts 276N and 276P. Other detail regarding the formation of source/drain contacts are similar to those illustrated in FIGS. 10A-10C, and thereto not repeated herein.

Figure 15:
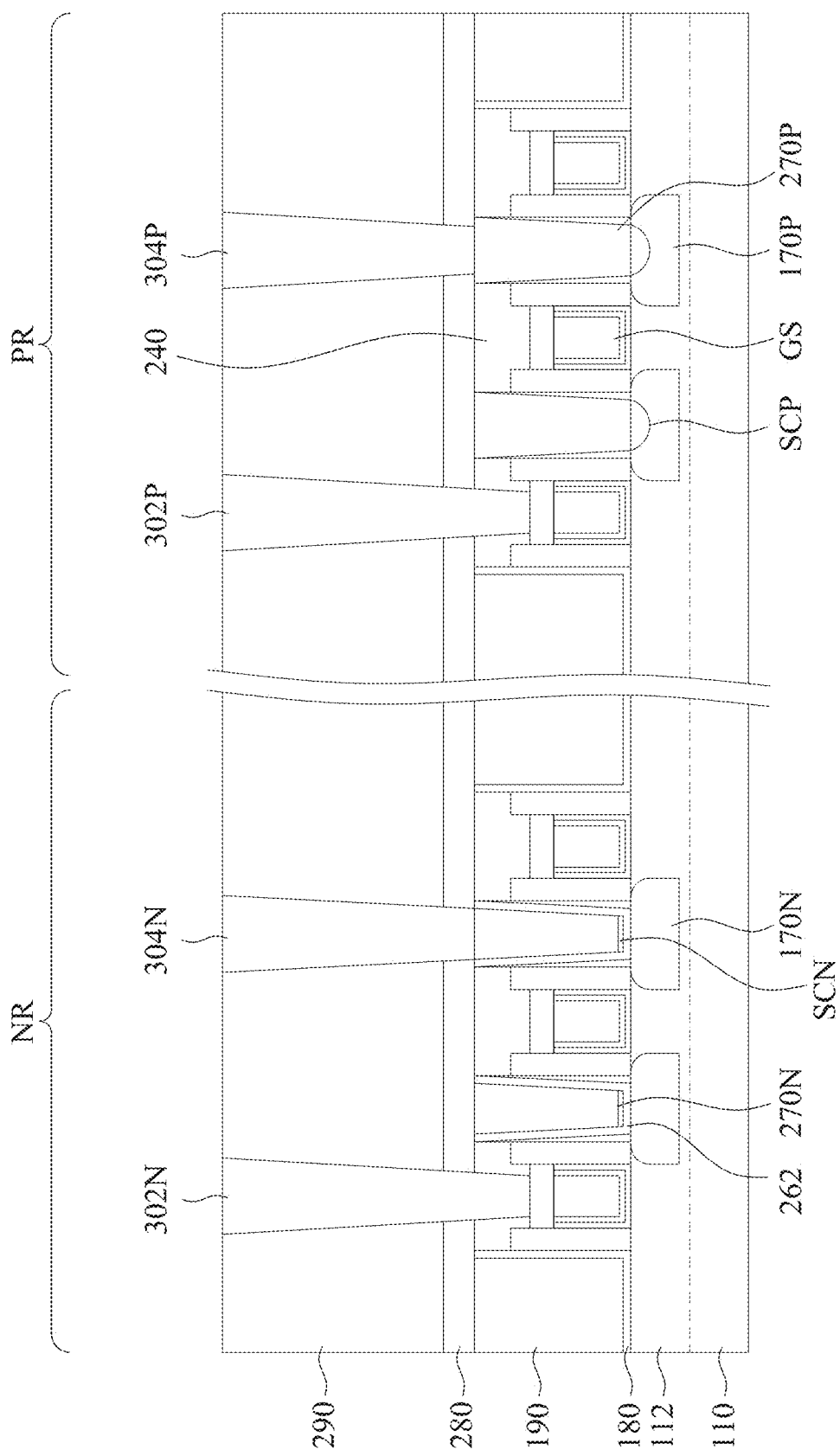

FIG. 15 illustrates formation of gate contacts 302N and 302P and conductive features 304N and 304P. The etch stop layer 280 and the ILD layer 290 may be formed over the ILD layer 190 and the gate structure GS, and the gate contacts 302N and 302P and conductive features 304N and 304P are formed through the etch stop layer 280 and the ILD layer 290 to connect the gate structure GS and the source/drain epitaxial structures 170N/170P, respectively. Other detail regarding the formation of gate contacts 302N and 302P and conductive features 304N and 304P are similar to those illustrated in FIG. 11, and thereto not repeated herein.

FIG. 16A illustrates a net dipole moment among a semimetal, a metal, and a semiconductor in accordance with some embodiments of the present disclosure. Atoms of Sb, Ti, and Si are illustrated in FIG. 16A without drawn to scale. Widths and directions of arrows in FIGS. 16A-16C indicate magnitude and directions of dipole moments among these atoms. Dipole moment is a result of multiplexing a separated charge by distance. The metal silicide region SCN (referring to FIG. 15) including the materials of the semimetal may benefit from the dipole moment. Atoms in the semimetal layer (e.g., Sb atom) may have a greater atom size than atoms in the source/drain contact (e.g., Ti atoms). By adding a semimetal layer (e.g., Sb layer) between the source/drain contact and the source/drain epitaxial structure, atoms between the source/drain contact and the source/drain epitaxial structure (for example, in the metal silicide region SCN) are separated by a larger distance (e.g., greater atom size) and have a separated charge, thereby increasing a net dipole moment.

FIG. 16B shows a diagram of dipole moment versus reduced Schottky barrier height of various materials in accordance with some embodiments of the present disclosure. In FIG. 16B, dipole moments of a metal (e.g., Ti) and a semimetal (e.g., Sb) are shown the horizontal axis, and the Schottky barrier heights of n-type devices ($\delta\Phi bn$) using the metal (e.g., Ti) and the semimetal (e.g., Sb) are shown on the vertical axis. As the figure shown, Sb has a stronger dipole moment than Ti, and the n-type device using the Sb layer has a lower Schottky barrier height than the n-type device using the Ti layer. The simulation shows Sb dipole is energetic stability to stay at TiSi interface. It is believed that using the semimetal layer between the contact metal and the epitaxial structure can reduce the Schottky barrier height by the strong dipole moment.

FIG. 16C shows a ternary phase diagram of a semimetal, a metal, and a semiconductor in accordance with some embodiments of the present disclosure. Sb—Ti—Si has a stable ternary phase of $Ti_5SiSb_2$. As aforementioned, the thin semimetal layer allows the formation of the metal silicide region SCN (referring to FIG. 15). In the embodiments where the metal-containing layer comprises Ti, the semimetal layer comprises Sb, and the source/drain epitaxial structure comprises Si, the metal silicide region SCN (referring to FIG. 15) may be $Ti_5SiSb_2$.

Figure 17B:
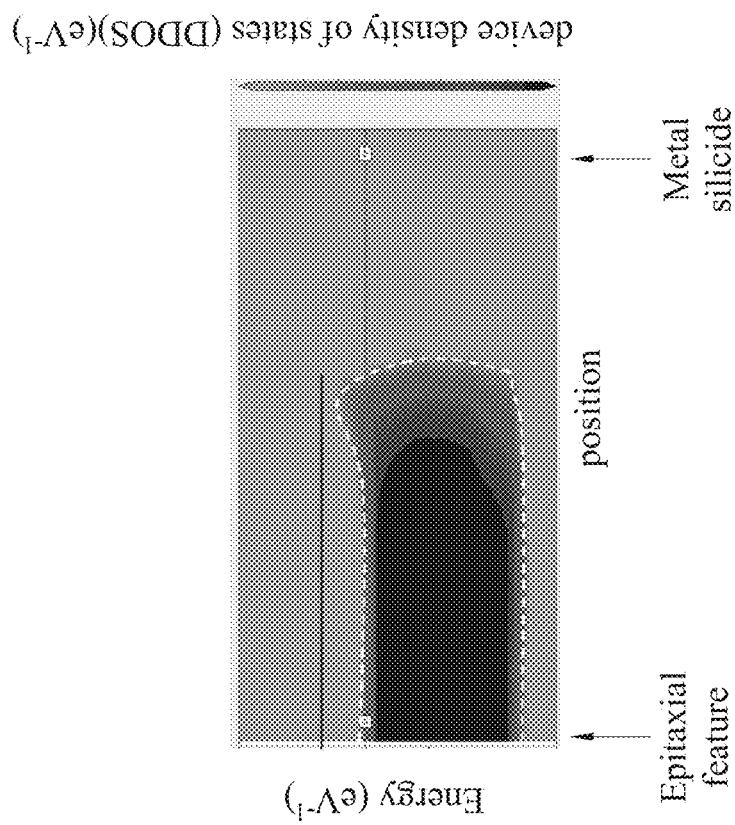
FIGS. 17A and 17B illustrate barrier energy diagrams between a source/drain epitaxial structure and a metal silicide without and with a semimetal layer, respectively.
Figure 17A:
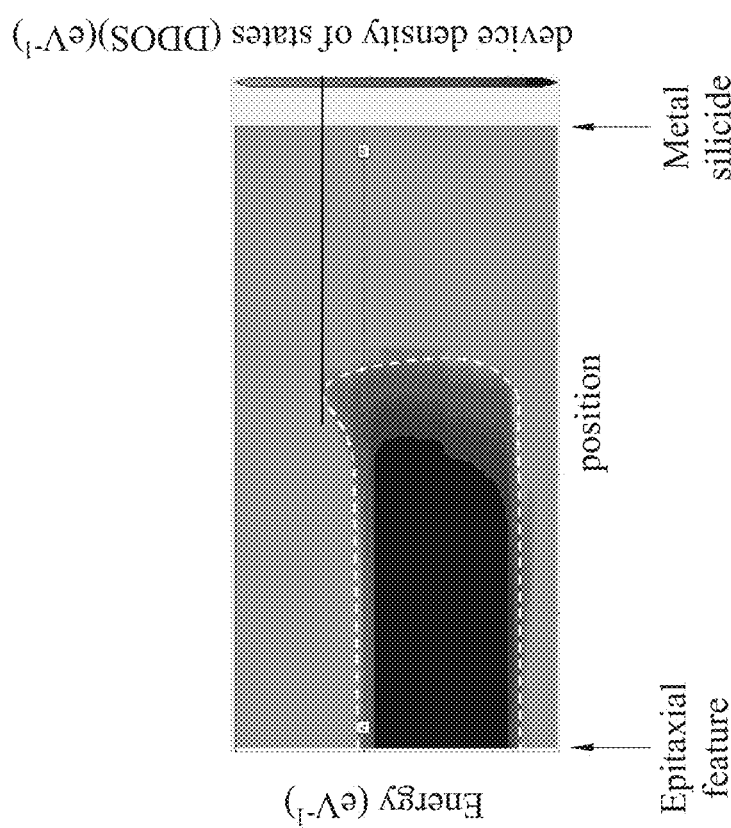

FIGS. 17A and 17B illustrate barrier energy diagrams between a source/drain epitaxial structure and a metal silicide without and with a semimetal layer, respectively. In FIGS. 17A and 17B, a position between the source/drain epitaxial structure and the metal silicide is shown the horizontal axis, and contact resistivity is shown on the vertical axis. In FIG. 17A, no semimetal layer is between the source/drain epitaxial structure and the metal silicide. In FIG. 17B, a semimetal layer is between the source/drain epitaxial structure and the metal silicide. Comparing the barrier energy in FIGS. 17A and 17B, a topmost portion of the barrier energy in FIG. 17B is lower than a topmost portion of the barrier energy in FIG. 17A. It is evidenced that the barrier energy is reduced by using the semimetal layer.

Figure 18:
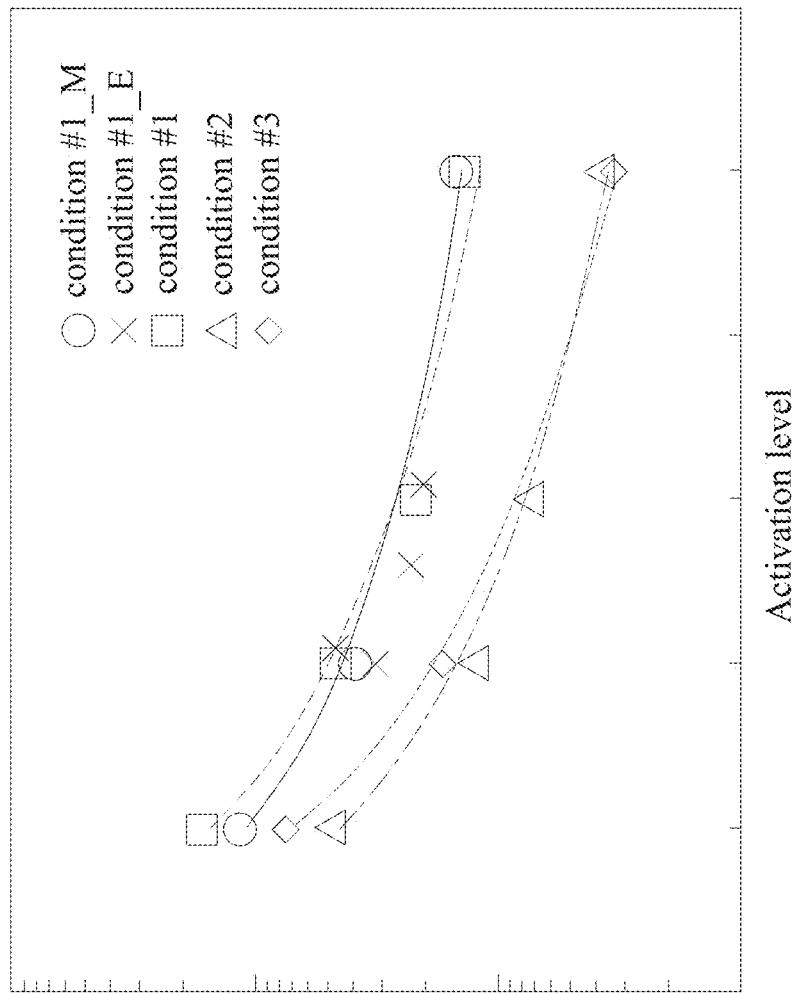
FIG. 18 shows a diagram of contact resistivity versus activation level in accordance with some embodiments of the present disclosure.

FIG. 18 shows a diagram of contact resistivity ($\rho_{csd}$) versus activation level in accordance with some embodiments of the present disclosure. In FIG. 18, activation level (e.g., doping level of source/drain epitaxial structure) is shown the horizontal axis, and contact resistivity is shown on the vertical axis. The condition #1_S and #1_E are respectively a simulation result and an experiment result related to no addition layer between the metal silicide region and the source/drain epitaxial structure. The conditions #1 is a model estimation result related to no addition layer between the metal silicide region and the source/drain epitaxial structure based on a model, which is optimized and built according the simulation result of condition #1. The condition #2 is a model estimation result related to a Sb semimetal layer between the metal silicide region and the source/drain epitaxial structure using the model. The condition #3 is a model estimation result related to a Zr layer between the metal silicide region and the source/drain epitaxial structure using the model.

At a fixed activation level, the estimated contact resistivity in the condition #1 may be in a range from about $10^{-9}$ $\Omega\cdot cm^2$ to about $10^{-8}$ $\Omega\cdot cm^2$, and the estimated contact resistivity in the condition #3 may be in a range from about $10^{-10}$ $\Omega\cdot cm^2$ to about $10^{-9}$ $\Omega\cdot cm^2$. It is evidenced than the contact resistivity is reduced by more than about 50% by using the Sb semimetal layer. For example, in some embodiments, a Sb monolayer can reduce about 0.25 eV Schottky barrier height by the dipole moment. In some embodiments, an ultra-low contact resistivity (less than $10^{-9}$ $\Omega\cdot cm^2$) can be achieved by the insertion of the semimetal layer.

FIGS. 19A-22 illustrate a method of manufacturing a semiconductor device at various stages in accordance with some embodiments of the present disclosure. Details of the present embodiments are similar to those of FIGS. 1A-11, except that the semimetal layer 260' is selectively deposited over the source/drain epitaxial structure 170N. It is understood that additional steps may be provided before, during, and after the steps shown in FIGS. 19A-22, and some of the steps described below can be replaced or eliminated for additional embodiments of the method. The order of the operations/processes may be interchangeable.

Figure 19A:
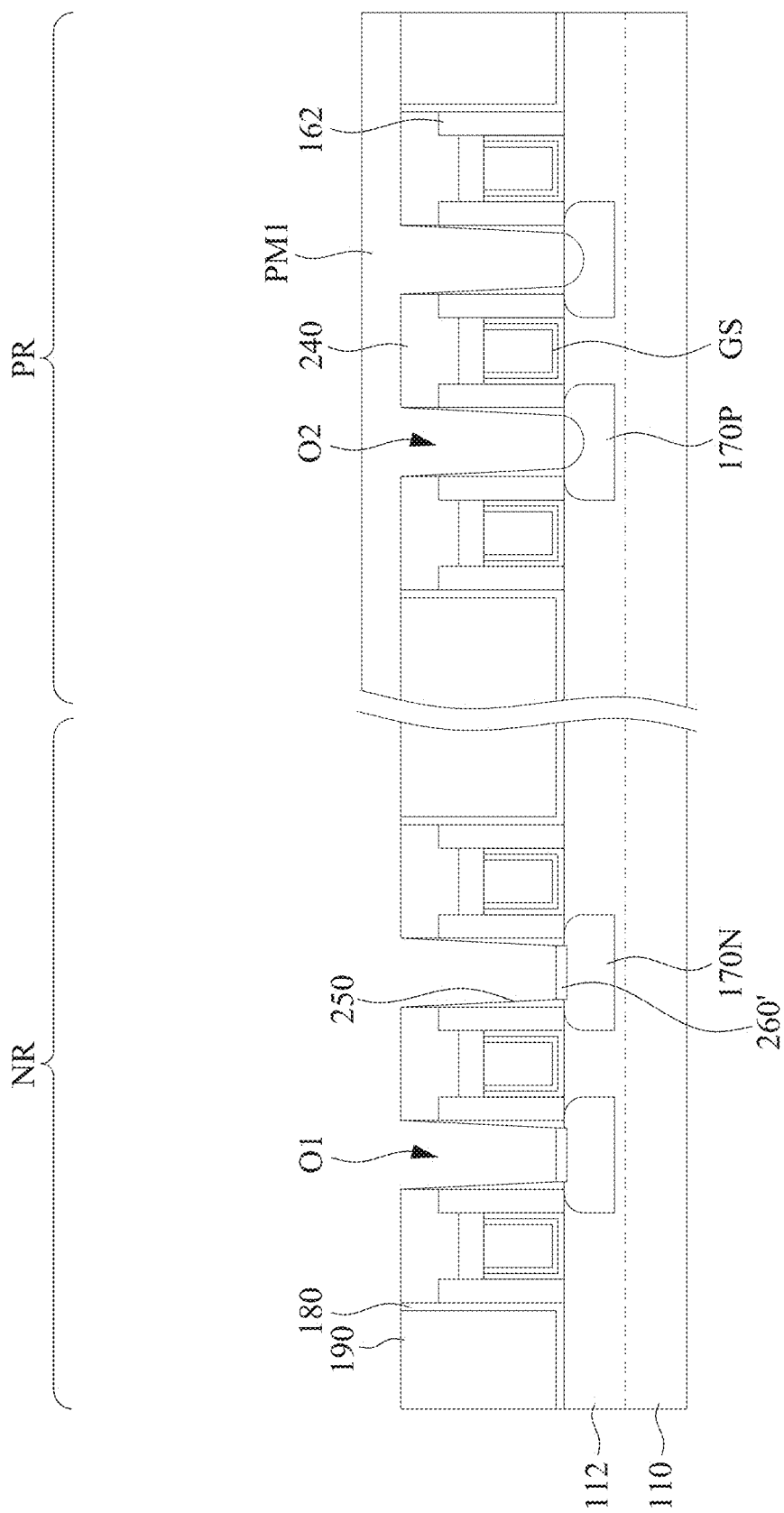
FIGS. 19A-22 illustrate a method of manufacturing a semiconductor device at various stages in accordance with some embodiments of the present disclosure.
Figure 19B:
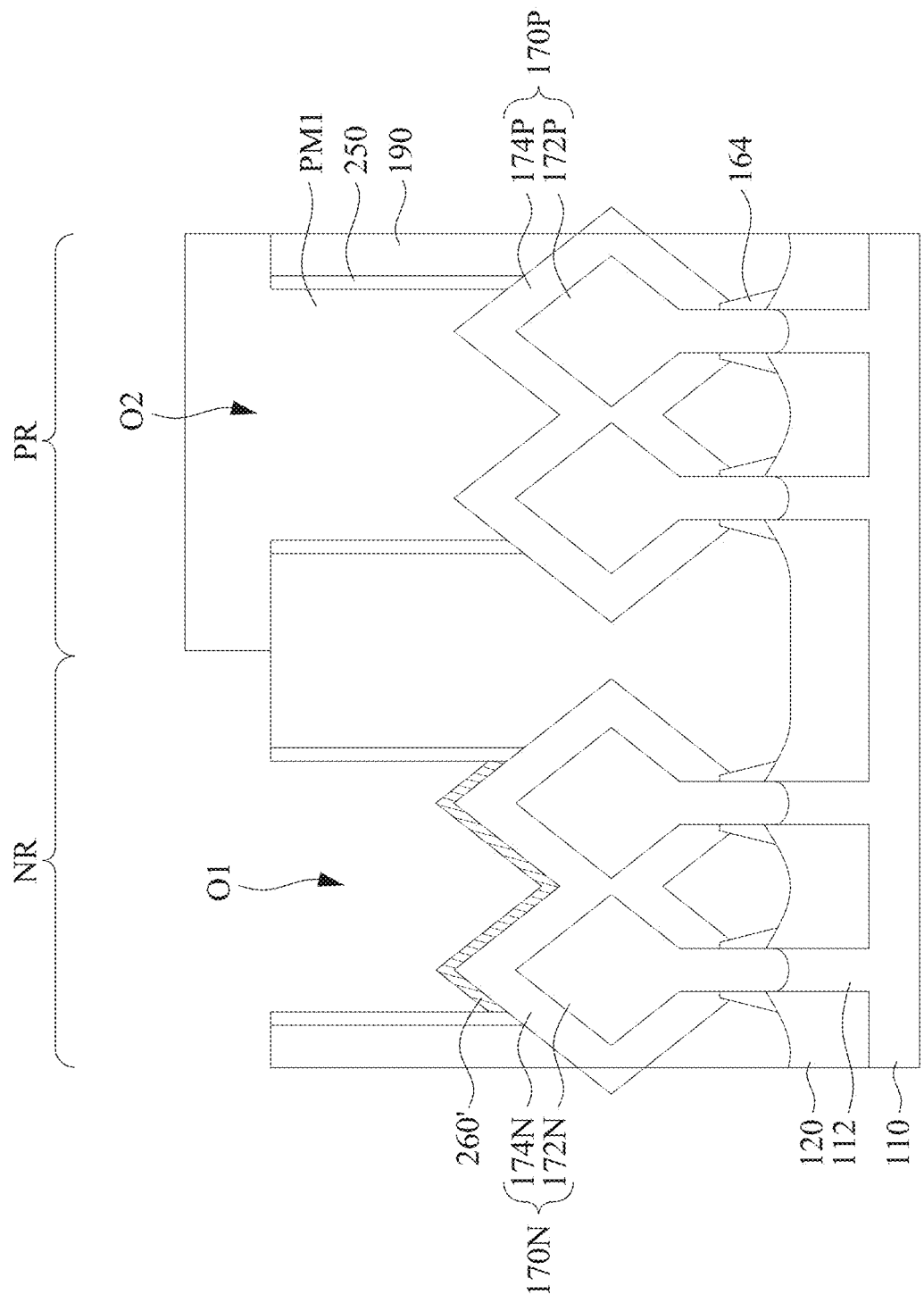

FIGS. 19A and 19B illustrate cross-sectional views of selective deposition of a semimetal layer 260' over the structure of FIG. 6. The semimetal layer 260' may include suitable semimetals, such as Sb, Bi, graphene, the like, or the combination thereof. In the present embodiments, the semimetal layer 260' is selectively deposited over a top surface of the source/drain epitaxial structure 170N, and not alongside the nitride spacers 250 as a conformal liner. The semimetal layer 260' may have a thickness in a range from about 0.5 nanometers to about 5 nanometers. The semimetal layer 260' may be deposited by PVD, CVD, ALD, the like, or the combination thereof. Precursors, such as $SbCl_3$, $(EtSi)_3Sb$, $BiCl_3$, $(EtSi)_3Bi$, $CH_4$, $C_2H_2$, or the like may be used for depositing the semimetal layer 260. In some embodiments, the semimetal layer 260' may be deposited at a low deposition temperature. For example, Sb or Bi may be deposited at a deposition temperature ranging from about 50 Celsius degrees to about 100 Celsius degrees; and graphene may be deposited at a deposition temperature ranging from about 400 Celsius degrees to about 500 Celsius degrees. In some embodiments, a pressure for depositing the semimetal layer 260' may be in a range from about 10 mtorr to about 1 atm. In the present embodiments, the semimetal layer 260' is a continuous film. In some other embodiments, the semimetal layer 260' is discontinuous and having plural separated portions.

Prior to selectively depositing the semimetal layer 260', a patterned mask PM1 may be formed to cover the region PR. In some embodiments, the patterned mask PM1 may include a photoresist formed by a photolithography process. An exemplary photolithography process may include processing steps of photoresist coating, soft baking, mask aligning, exposing, post-exposure baking, developing photoresist and hard baking. In some embodiments, the patterned mask PM1 may further include a planarized sacrificial layer below the photoresist. The planarized sacrificial layer, for example, can be an organic material used for the bottom anti-reflection coating (BARC). After depositing the semimetal layer 260', the patterned mask PM1 may be removed by suitable stripping or ashing process.

Figure 20A:
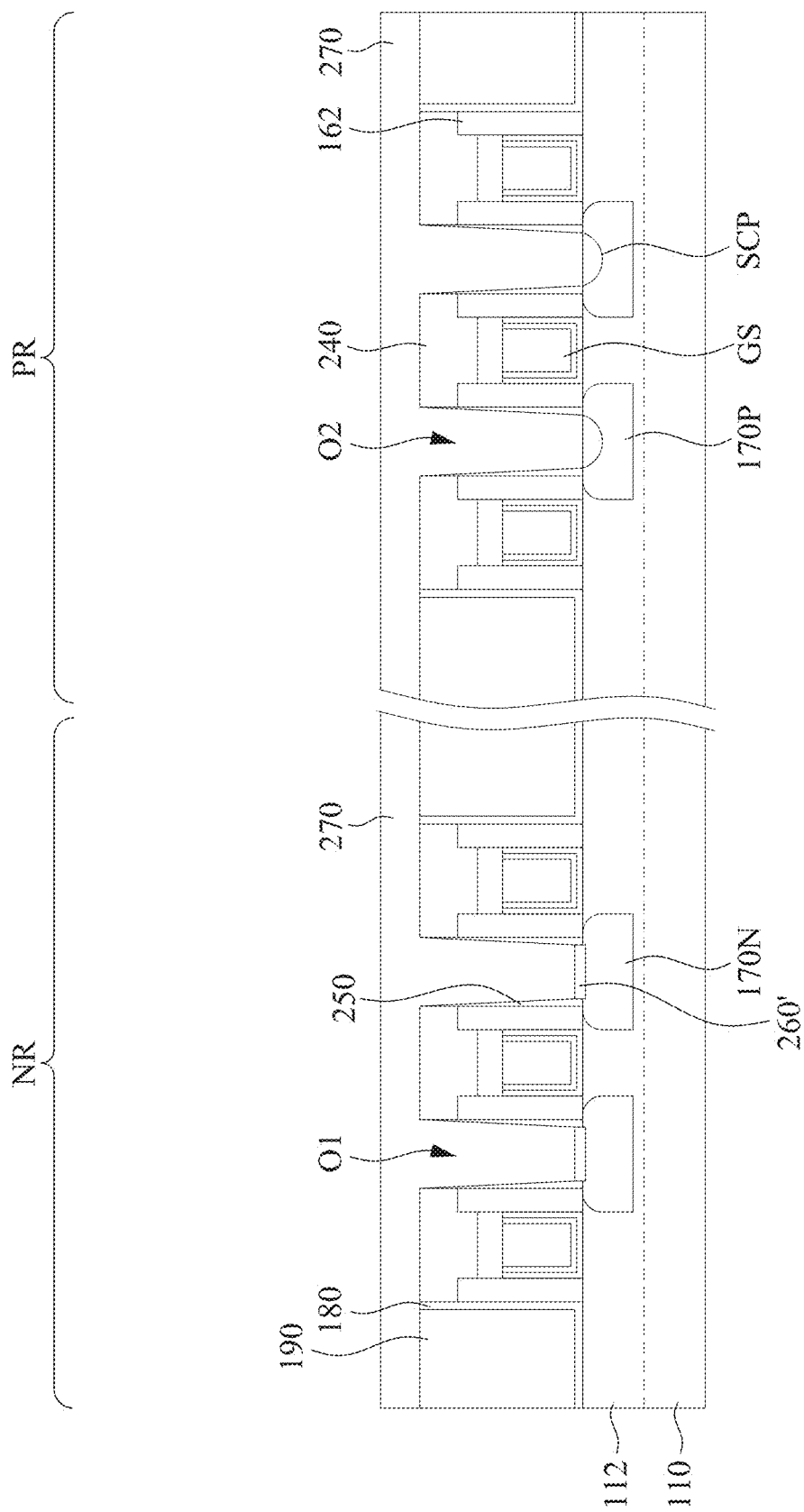
Figure 20B:
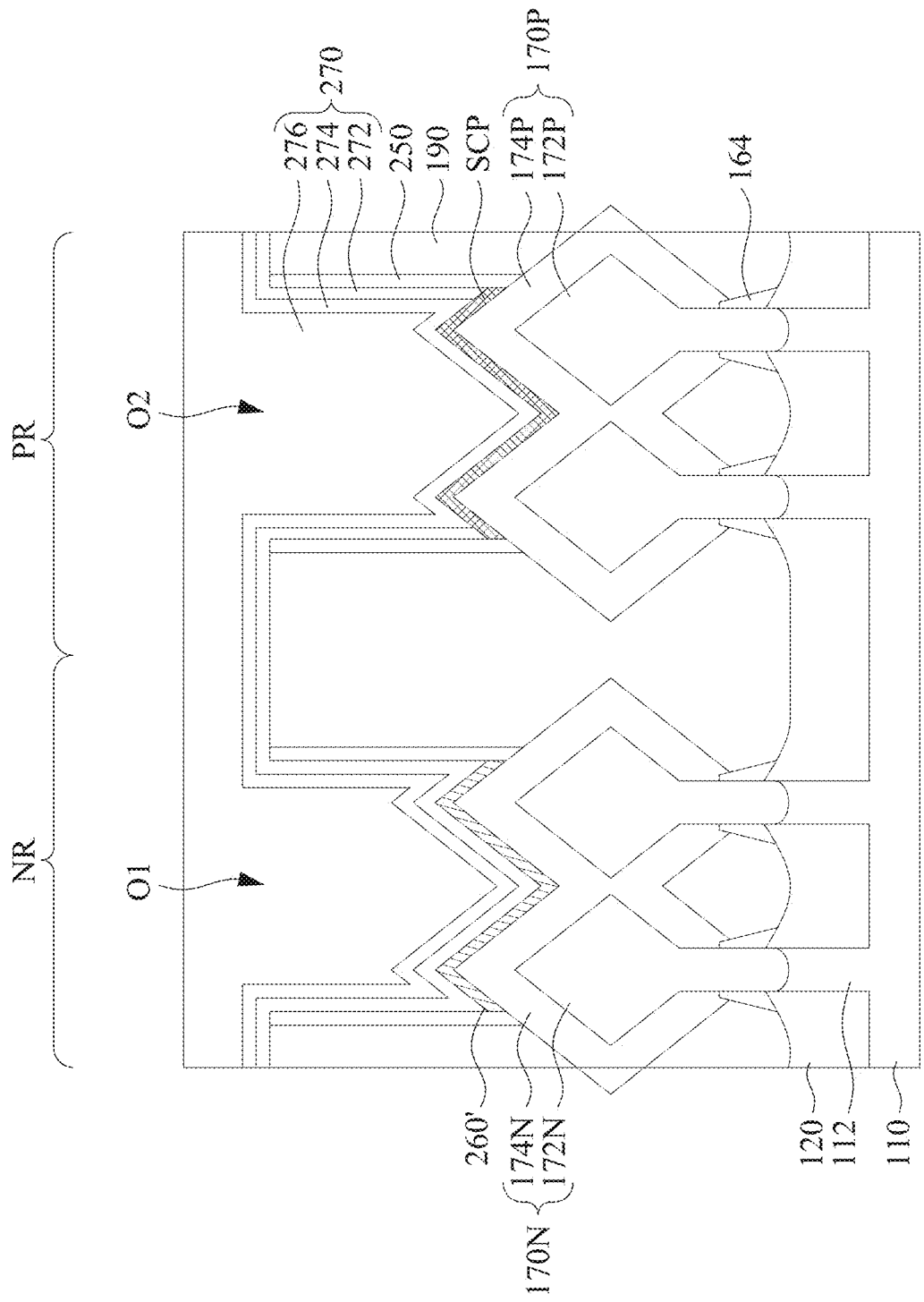

FIGS. 20A and 20B illustrate cross-sectional views of overfilling the openings O1 and O2 with a conductive material 270 according to some embodiments of the present disclosure. The conductive material 270 includes at least a fill conductive layer 276. Formation and materials of the conductive material 270 are illustrated in FIGS. 9A and 9B, and thereto not repeated herein.

As aforementioned, prior to overfilling the openings O1 and O2 with the fill conductive layer 276, a silicide region SCP may be formed on top surfaces of the source/drain epitaxial structures 170P by using a silicidation process. The silicidation process may include depositing a metal-containing layer 272 over the top surfaces of the source/drain epitaxial structures 170P, followed by annealing the metal-containing layer 272 such that the metal-containing layer 272 reacts with silicon (and germanium if present) in the source/drain epitaxial structures 170P to form the metal silicide regions SCP. Prior to the annealing process, a protection layer 274 may be formed over the metal-containing layer 272. Formation and materials of the metal-containing layer 272 and the protection layer 274 are illustrated in FIGS. 9A and 9B, and thereto not repeated.

Figure 25A:
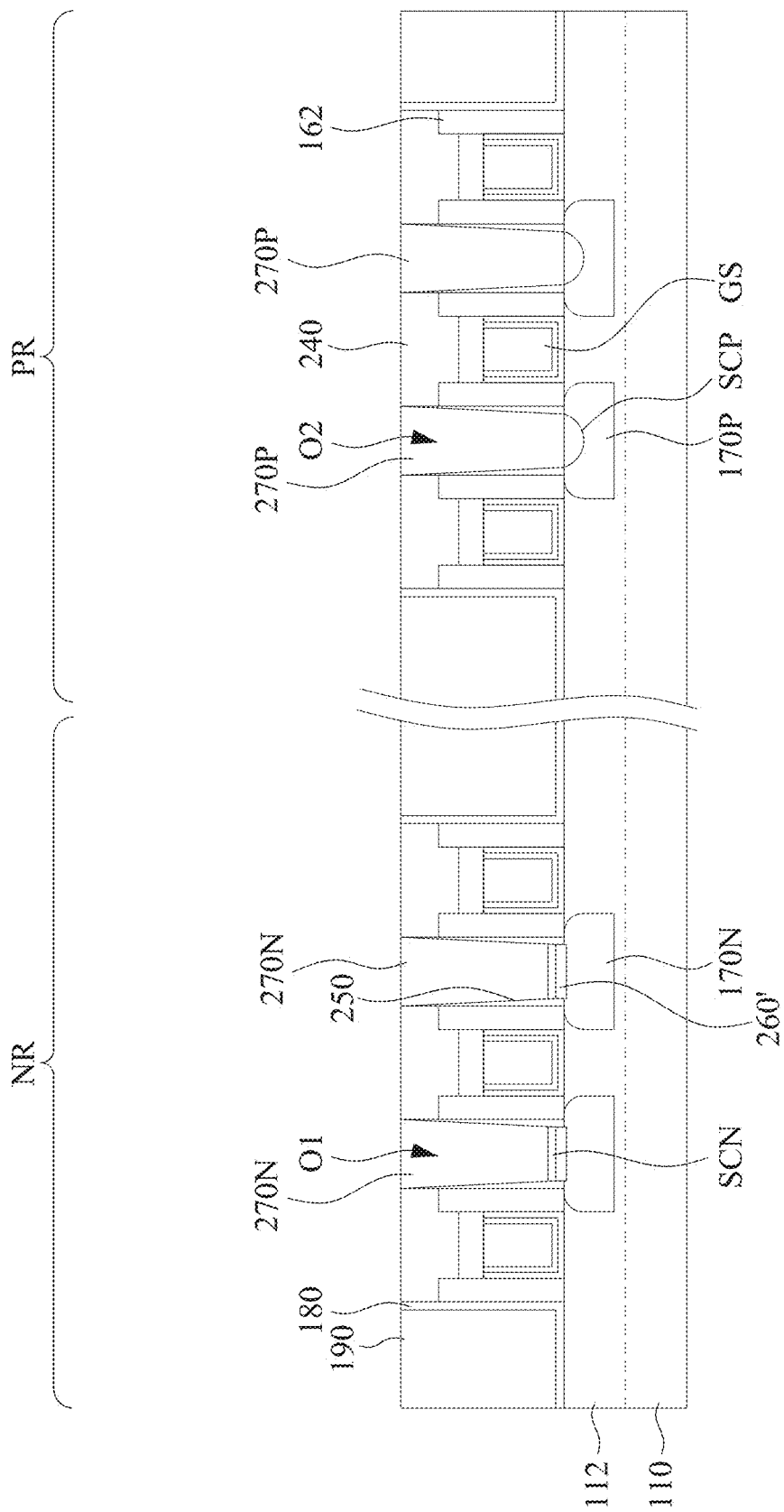
Figure 25B:
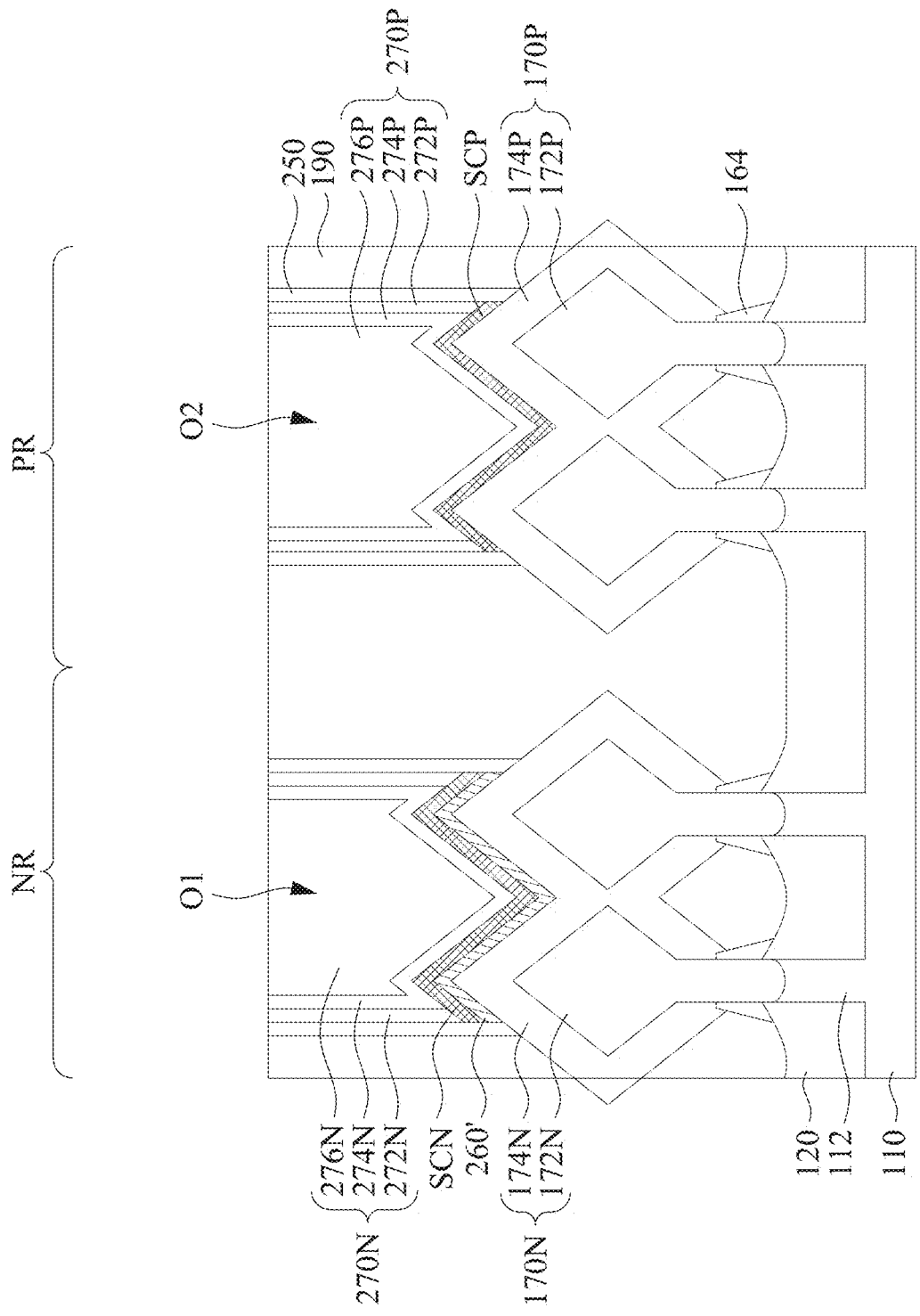
Figure 25C:
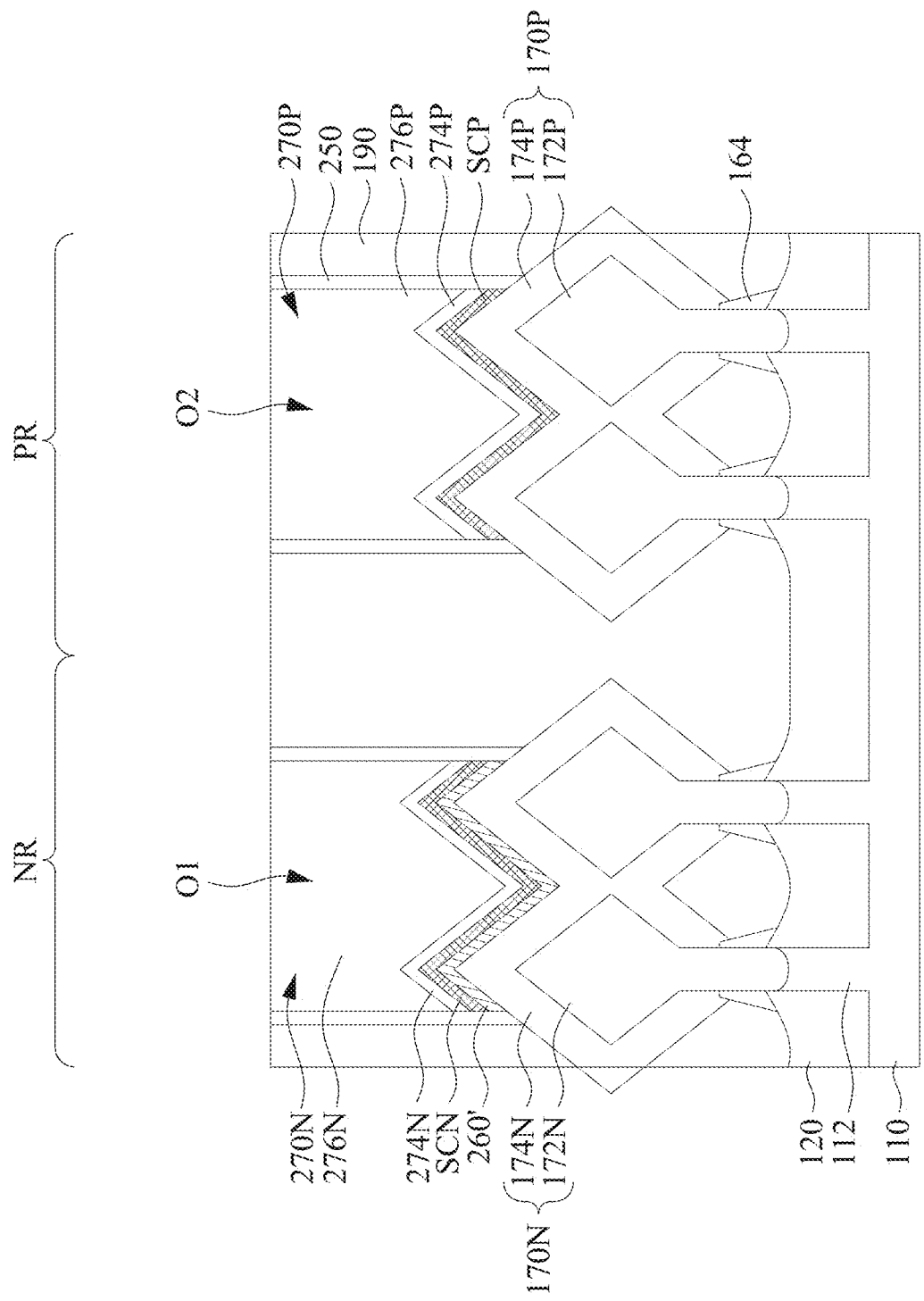

In the present embodiments, in the region NR, the semimetal layer 260' may be thick enough to space the metal-containing layer 272 apart from the underlying source/drain epitaxial structure 170N. Thus, in the embodiments where the metal-containing layer 272 is a metal layer, the silicidation process may form little or no metal silicide region over the source/drain epitaxial structure 170N in the region NR. For example, the semimetal layer 260' may have a thickness in a range from about 2 nanometers to about 5 nanometers. In some other embodiments as illustrated in FIGS. 25A-25C later, when the metal-containing layer 272 is a metal layer, the semimetal layer 260' may be thin enough to allow the formation of a metal silicide region over the source epitaxial structure 170N. In some other embodiments, the metal-containing layer 272 is a metal silicide layer directly formed over the semimetal layer 260', and the thickness of the semimetal layer 260' does not substantially affect the formation of the metal silicide layer.

In the present embodiments, as shown in FIG. 20B, the non-reacted portions of the metal-containing layer 272 on sidewalls of the openings O1 and O2 may remain, and portions of the protection layer 274 on the sidewalls of the openings O1 and O remains as well. Thus, after the deposition of the fill conductive layer 276, the metal-containing layer 272 and the protection layer 274 laterally surround the fill conductive layer 276.

Figure 20C:
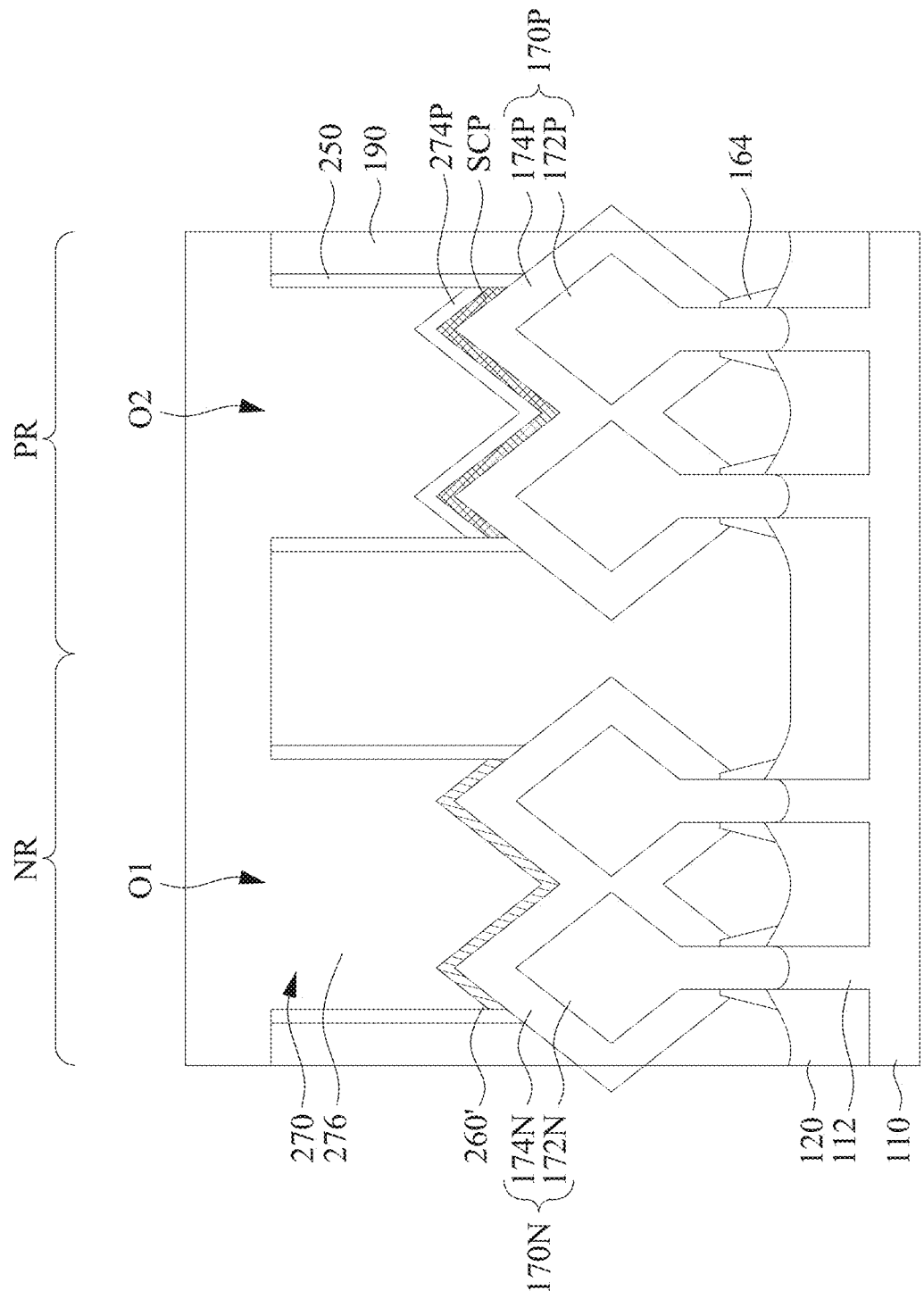

FIG. 20C illustrates cross-sectional views of overfilling the openings O1 and O2 with a fill conductive layer 276 according to some other embodiments. Details of the present embodiments are similar to those illustrated in FIG. 20B, except that the non-reacted portions of the metal-containing layer 272 on sidewalls of the openings O1 and O2 (referring to FIG. 9B) may be removed from the sidewalls, and the portions of the protection layer 274 on the sidewalls of the openings O1 and O2 (referring to FIG. 9B) are removed as well. Thus, after the deposition of the fill conductive layer 276, sidewalls of the fill conductive layer 276 may be free of the metal-containing layer 272 and protection layer 274. Other details regarding FIG. 20C are similar to FIG. 20B, and thereto not repeated herein.

Figure 21A:
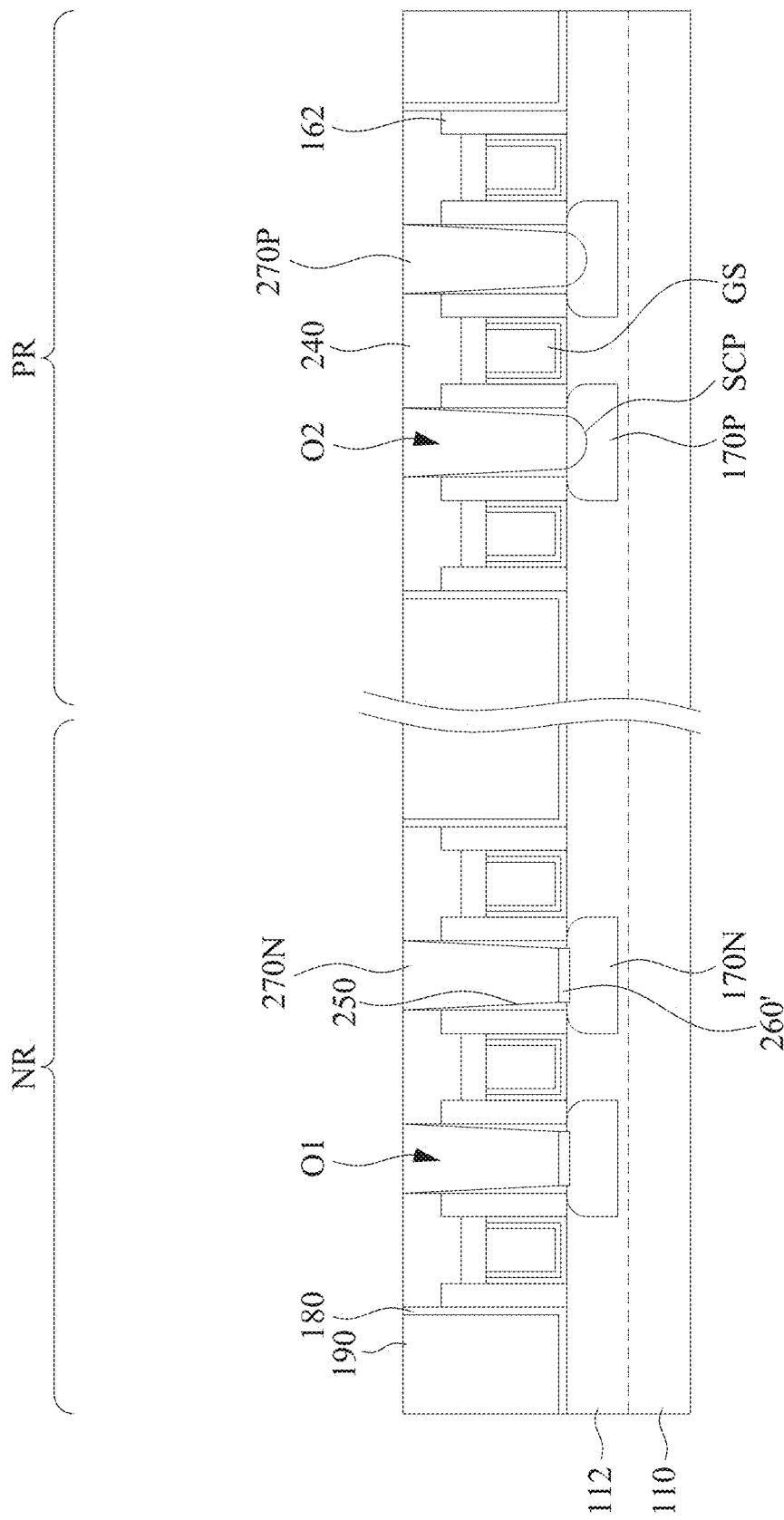
Figure 21B:
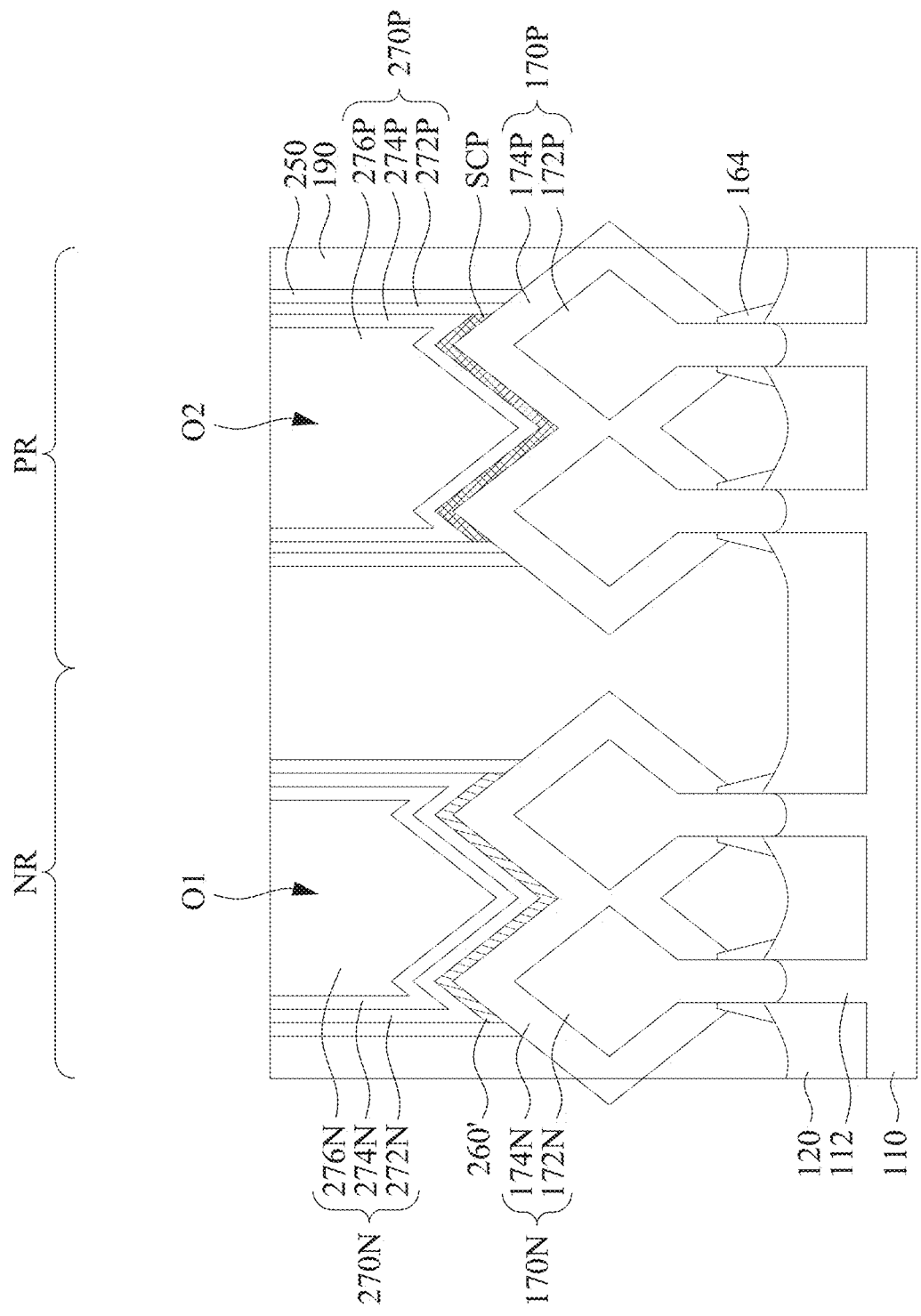

FIGS. 21A and 21B illustrate formation of source/drain contacts. After depositing the conductive material 270 (referring to FIGS. 20A-20B), a planarization process is performed to remove a portion of the conductive material 270 (referring to FIGS. 20A-20B) over a top surface of the ILD layer 190. In the embodiments of FIG. 10B, the planarization process is performed to remove a portion of the metal-containing layer 272, a portion of the protection layer 274, and a portion of the fill conductive layer 276 (referring to FIG. 20B) from the top surface of the ILD layer 190. The planarization process may be a chemical mechanical polishing (CMP) process. Remaining portions of the metal-containing layer 272, the protection layer 274, and the fill conductive layer 276 (referring to FIG. 20A-20B) are referred to as a metal-containing layers 272N and 272P, the protection layers 274N and 274P, and source/drain contacts 276N and 276P, respectively. In some embodiments, a combination of the metal-containing layer 272N, the protection layer 274N, and the source/drain contact 276N may be referred to as a source/drain contact 270N; and a combination of the metal-containing layer 272P, the protection layer 274P, and the source/drain contact 276P may be referred to as a source/drain contact 270P.

Figure 21C:
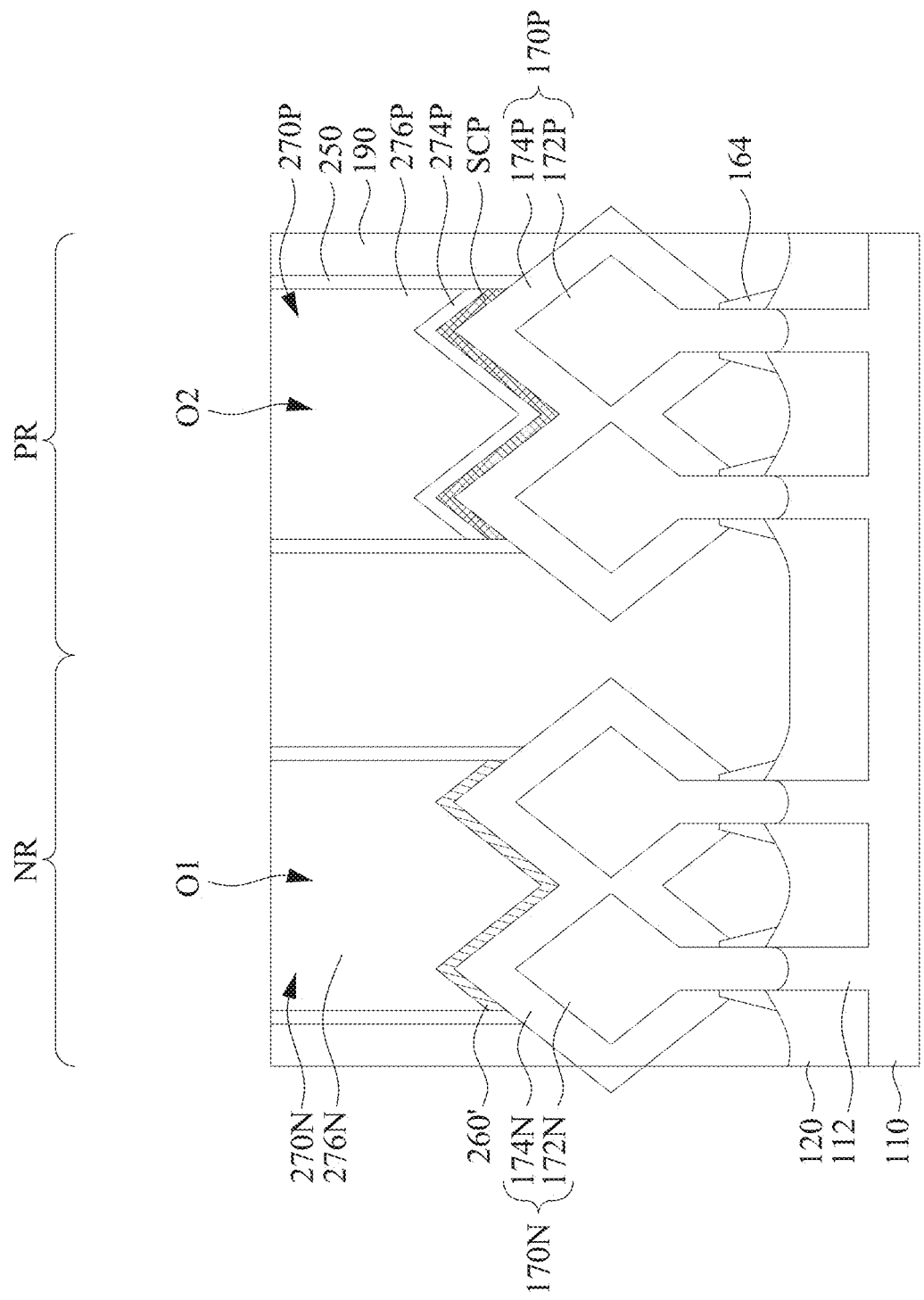

FIG. 21C illustrates cross-sectional views of formation of source/drain contacts according to some other embodiments. Details of the present embodiments are similar to those illustrated in FIG. 21B, except that the planarization process is performed to remove a portion of the fill conductive layer 276 (referring to FIG. 20C) from a top surface of the ILD layer 190, such that the sidewalls of the source/drain contacts 276N and 276P may be free of the metal-containing layer 272 and protection layer 274. Other details regarding FIG. 21C are similar to FIG. 21B, and thereto not repeated herein.

Figure 22:
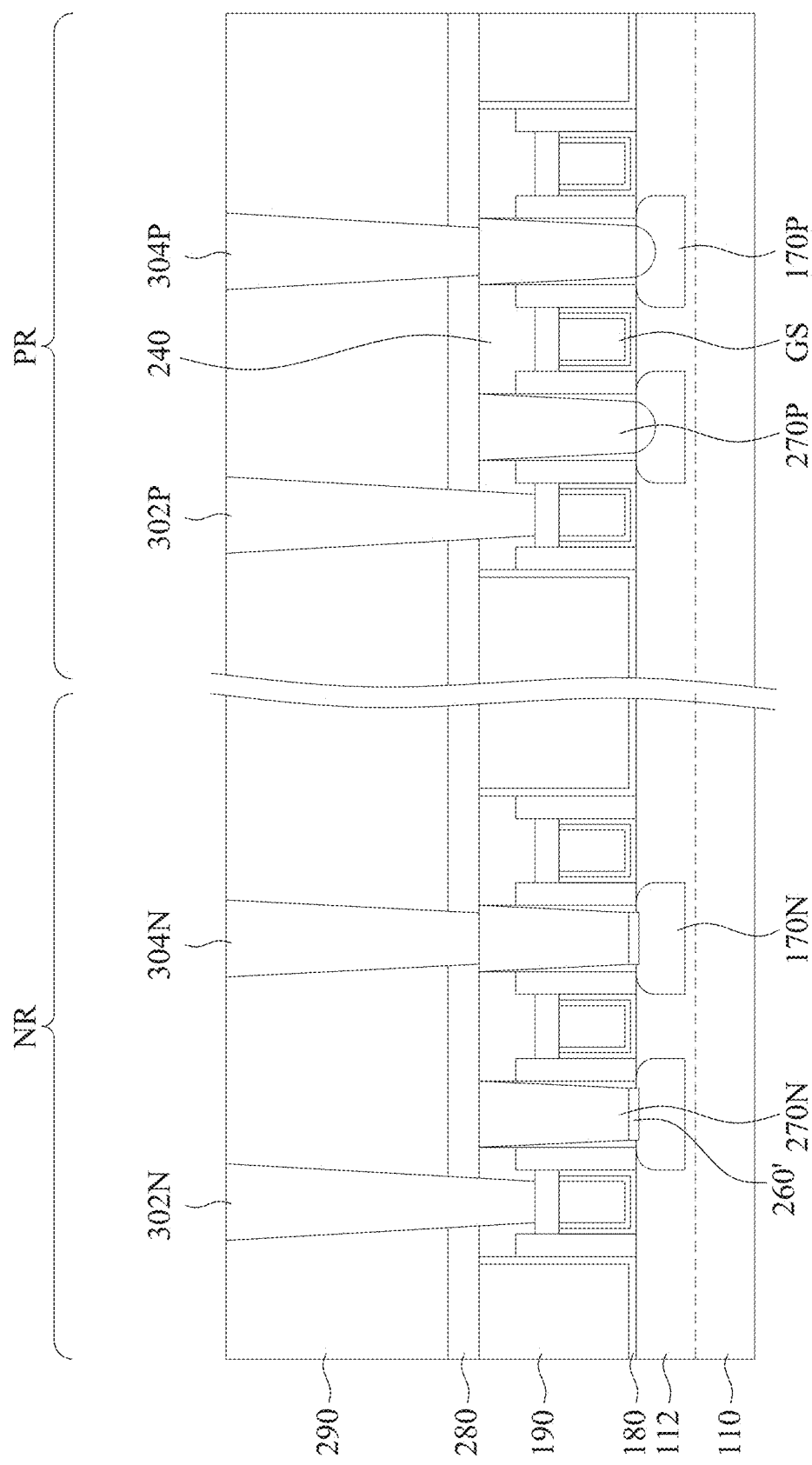

FIG. 22 illustrates formation of gate contacts 302N and 302P and conductive features 304N and 304P. The etch stop layer 280 and the ILD layer 290 may be formed over the ILD layer 190 and the gate structure GS, and the gate contacts 302N and 302P and conductive features 304N and 304P are formed through the etch stop layer 280 and the ILD layer 290 to connect the gate structure GS and the source/drain epitaxial structures 170N/170P, respectively. Other details of the present embodiments are similar to those described with FIGS. 1A-11, and thereto not repeated herein.

Figure 23A:
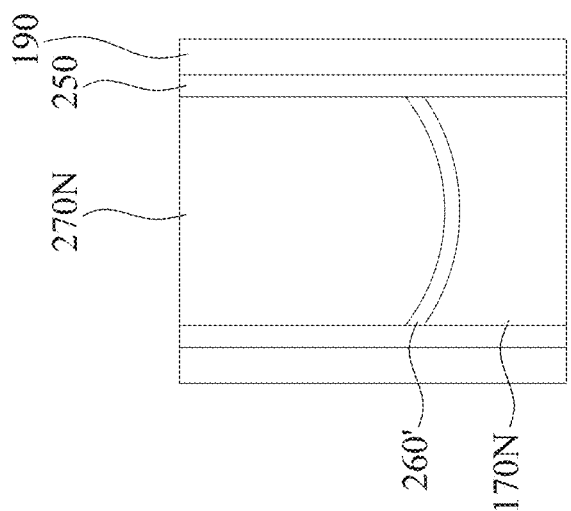
FIGS. 23A-23C are cross-sectional views of semiconductor devices in accordance with various embodiments of the present disclosure.
Figure 23B:
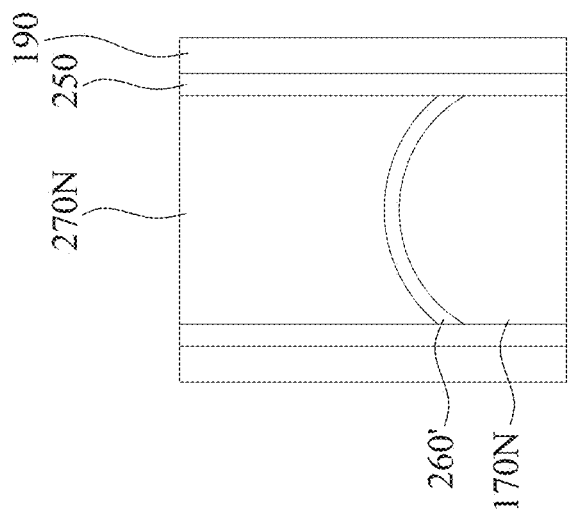
Figure 23C:
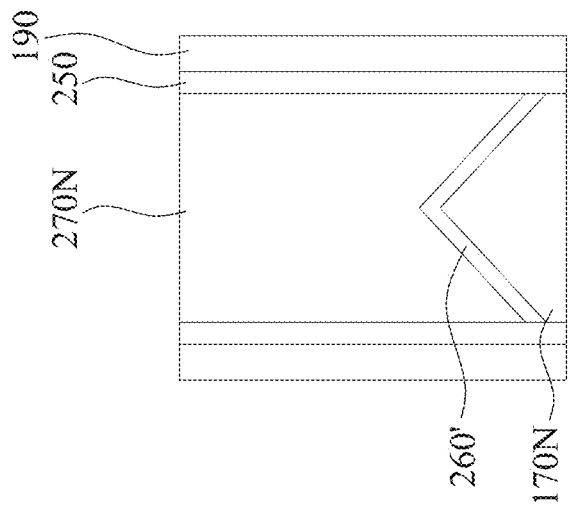

FIGS. 23A-23C are cross-sectional views of semiconductor devices in accordance with various embodiments of the present disclosure. The semimetal layer 260' is conformally deposited over the top surface of the source/drain epitaxial structure 170, and thus may have a profile according to the top surface of the source/drain epitaxial structure 170. In FIG. 23A, the source/drain epitaxial structure 170 may have a concave curved top surface in contact with the semimetal layer 260'. Thus, the semimetal layer 260' thereon has a concave curved top surface and a convex curved bottom surface. In FIG. 23B, the source/drain epitaxial structure 170 has a convex curved top surface in contact with the semimetal layer 260'. Thus, the semimetal layer 260' thereon may have a convex curved top surface and a concave curved bottom surface. In FIG. 23C, the source/drain epitaxial structure 170 has angle facets in contact with the semimetal layer 260'. Thus, the semimetal layer 260' thereon may have an angled top surface and an angled bottom surface.

FIGS. 24A-26 illustrate a method of manufacturing a semiconductor device at various stages in accordance with some embodiments of the present disclosure. Details of the present embodiments are similar to those of FIGS. 19A-22, except that the semimetal layer 260' is thin enough to allow the formation of a metal silicide region SCN in the present embodiments. It is understood that additional steps may be provided before, during, and after the steps shown in FIGS. 24A-26, and some of the steps described below can be replaced or eliminated for additional embodiments of the method. The order of the operations/processes may be interchangeable.

Figure 24A:
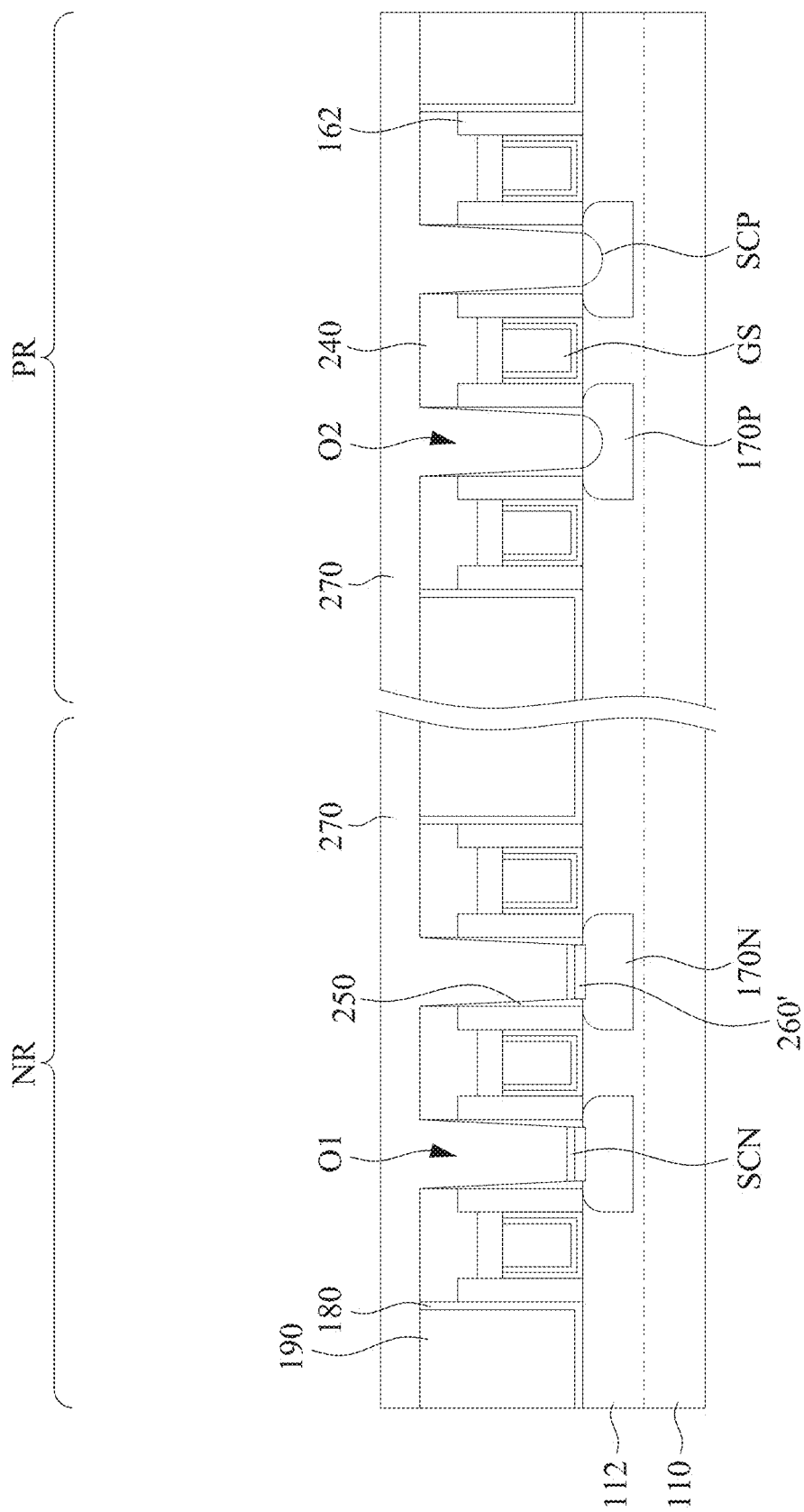
FIGS. 24A-26 illustrate a method of manufacturing a semiconductor device at various stages in accordance with some embodiments of the present disclosure.
Figure 24B:
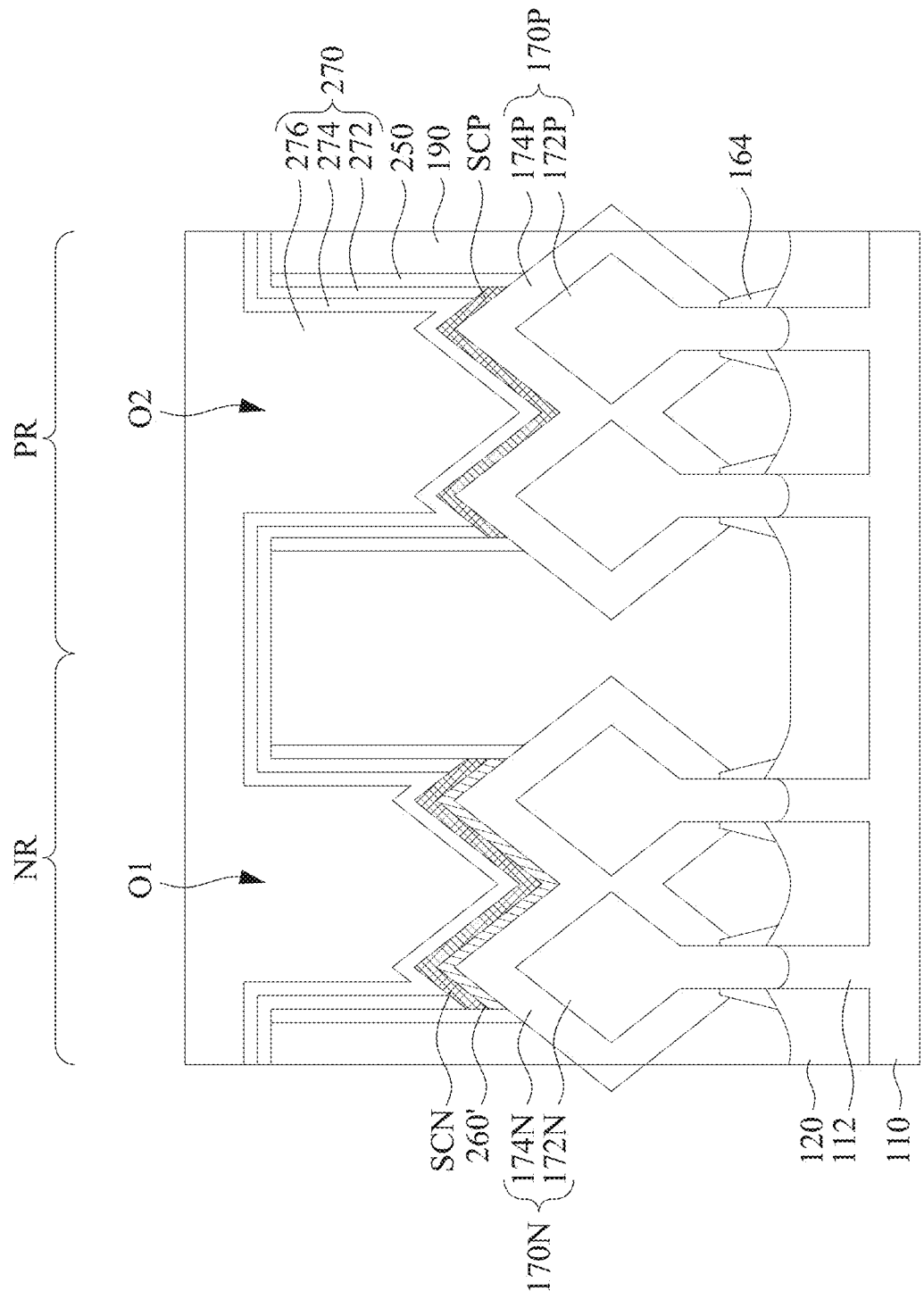

FIGS. 24A and 24B illustrate cross-sectional views of overfilling the openings O1 and O2 with a conductive material 270 according to some other embodiments. The conductive material 270 may include at least one fill conductive layer 276. Formation and materials of conductive material 270 are illustrated in FIGS. 9A and 9B, and thereto not repeated herein.

In the present embodiments, as the semimetal layer 260' is deposited with a thin thickness, prior to overfilling the openings O1 and O2 with the fill conductive layer 276, silicide regions SCN and SCP may be respectively formed on the semimetal layer 260' and top surfaces of the source/drain epitaxial structures 170P by using a silicidation process. The silicidation process may include depositing a metal-containing layer 272 over the top surfaces of the semimetal layer 260' and the source/drain epitaxial structures 170P, followed by annealing the metal-containing layer 272. The annealing process is performed such that a portion of the metal-containing layer 272 over the top surface of the semimetal layer 260' reacts with the semimetal layer 260' and a semiconductor material (e.g., silicon) in the source/drain epitaxial structures 170N to form the metal silicide regions SCN, and a portion of the metal-containing layer 272 over the top surface of the source/drain epitaxial structures 170P reacts with a semiconductor material (e.g., silicon and/or germanium) in the source/drain epitaxial structures 170P to form the metal silicide regions SCP. The semimetal layer 260' may be thin enough to allow the formation of a metal silicide region SCN. For example, the semimetal layer 260' may have a thickness in a range from about 0.5 nanometer to about 2 nanometers. Prior to the annealing process, a protection layer 274 may be formed over the metal-containing layer 272. Other details of the present embodiments are similar to those illustrated previously, and thereto not repeated herein.

In the present embodiments, as shown in FIG. 24B, the non-reacted portions of the metal-containing layer 272 on sidewalls of the openings O1 and O2 may remain, and portions of the protection layer 274 on the sidewalls of the openings O1 and O remains as well. Thus, after the deposition of the fill conductive layer 276, the metal-containing layer 272 and the protection layer 274 laterally surround the fill conductive layer 276.

Figure 24C:
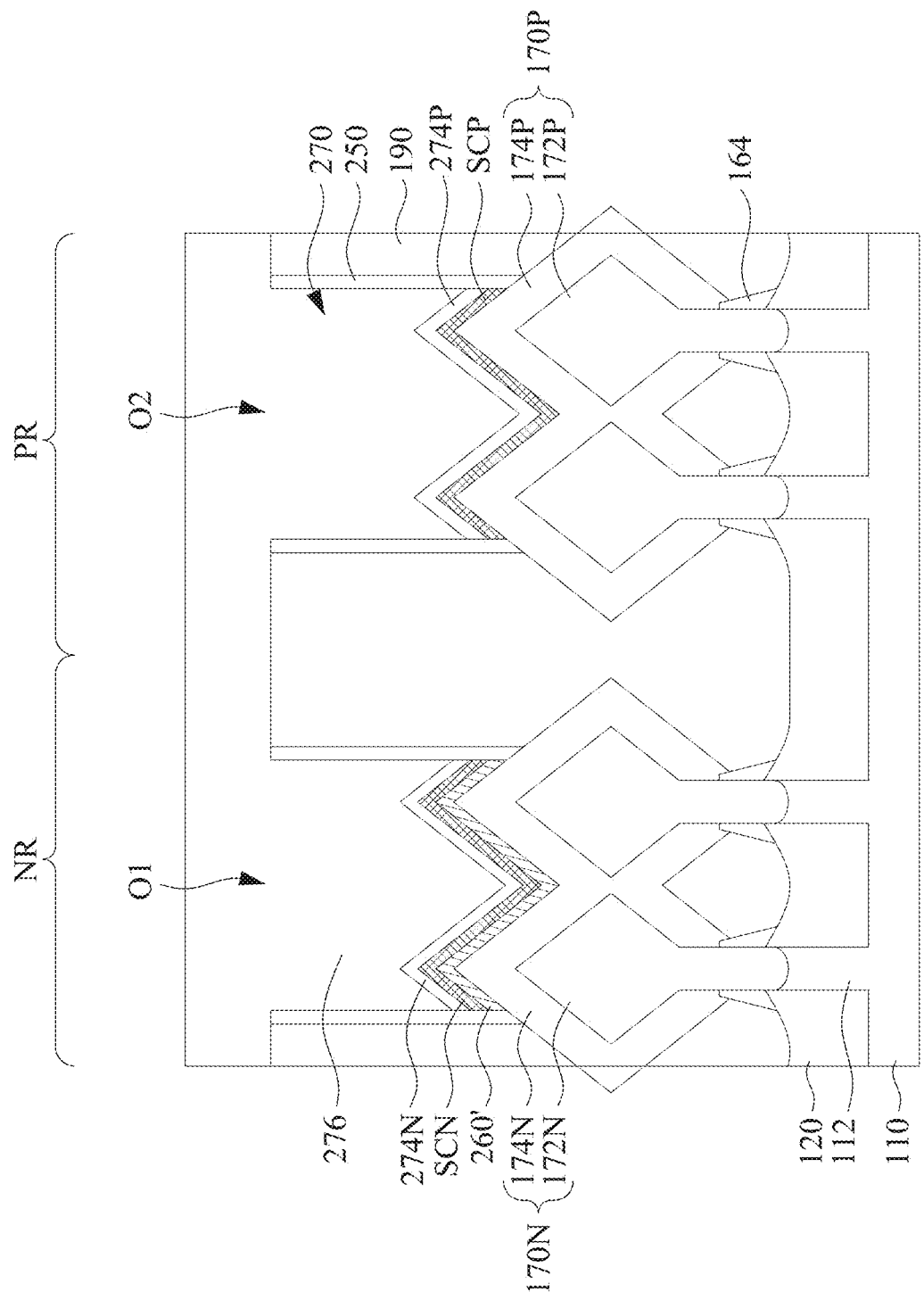

FIG. 24C illustrates cross-sectional views of overfilling the openings O1 and O2 with the conductive material 270 according to some other embodiments. Details of the present embodiments are similar to those illustrated in FIG. 24B, except that the non-reacted portions of the metal-containing layer 272 on sidewalls of the openings O1 and O2 (referring to FIG. 24B) may be removed from the sidewalls, and the portions of the protection layer 274 on the sidewalls of the openings O1 and O2 (referring to FIG. 24B) are removed as well. Thus, after the deposition of the fill conductive layer 276, sidewalls of the fill conductive layer 276 may be free of the metal-containing layer 272 and protection layer 274. Other details regarding FIG. 24C are similar to FIG. 24B, and thereto not repeated herein.

FIGS. 25A-25B illustrate formation of source/drain contacts according to some embodiments. As aforementioned, a planarization process is performed to remove a portion of the conductive material 270 (referring to FIGS. 24A-24B) above a top surface of the ILD layer 190. In the embodiments of FIG. 10B, the planarization process is performed to remove a portion of the metal-containing layer 272, a portion of the protection layer 274, and a portion of the fill conductive layer 276 (referring to FIG. 20B) from the top surface of the ILD layer 190. The planarization process may be a chemical mechanical polishing (CMP) process. Other detail regarding the formation of source/drain contacts 276N and 276P are similar to those illustrated previously, and thereto not repeated herein.

FIG. 25C illustrates cross-sectional views of formation of source/drain contacts according to some other embodiments. Details of the present embodiments are similar to those illustrated in FIG. 24B, except that the planarization process is performed to remove a portion of the fill conductive layer 276 (referring to FIG. 24C) from a top surface of the ILD layer 190, such that the sidewalls of the source/drain contacts 276N and 276P may be free of the metal-containing layer 272 and protection layer 274 (referring to FIG. 25B). Other details regarding FIG. 25C are similar to FIG. 25B, and thereto not repeated herein.

Figure 26:
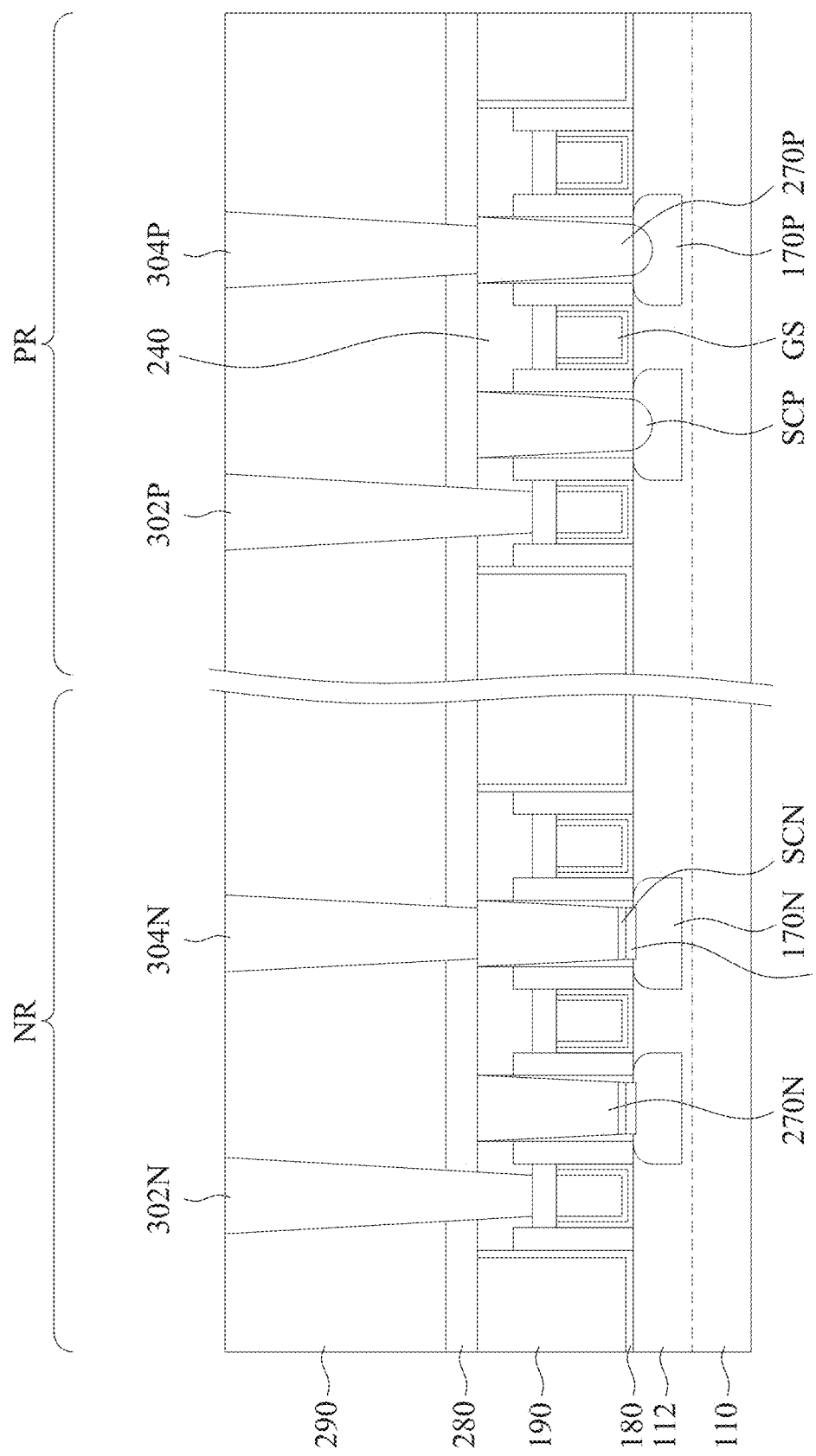

FIG. 26 illustrates formation of gate contacts 302N and 302P and conductive features 304N and 304P. The etch stop layer 280 and the ILD layer 290 may be formed over the ILD layer 190 and the gate structure GS, and the gate contacts 302N and 302P and conductive features 304N and 304P are formed through the etch stop layer 280 and the ILD layer 290 to connect the gate structure GS and the source/drain epitaxial structures 170N/170P, respectively. Other detail regarding the formation of gate contacts 302N and 302P and conductive features 304N and 304P are similar to those illustrated in FIGS. 10A-11, and thereto not repeated herein.

Figure 27A:
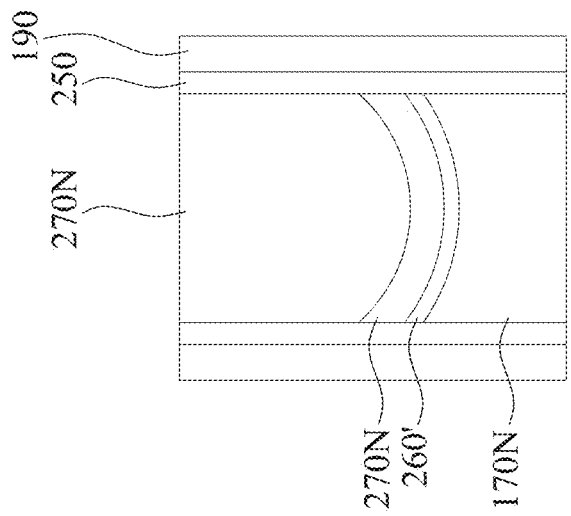
FIGS. 27A-27C are cross-sectional views of semiconductor devices in accordance with various embodiments of the present disclosure.
Figure 27B:
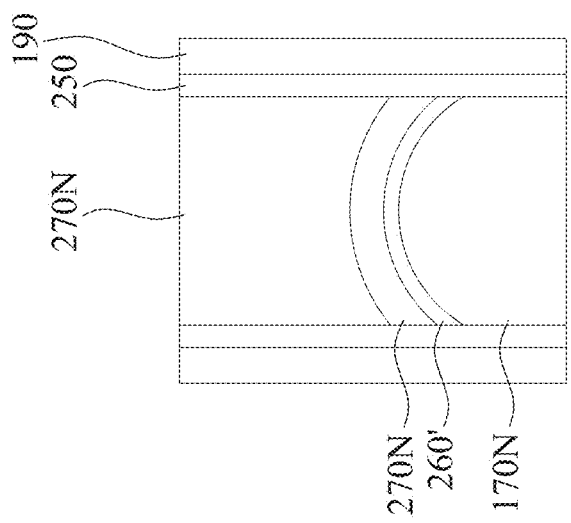
Figure 27C:
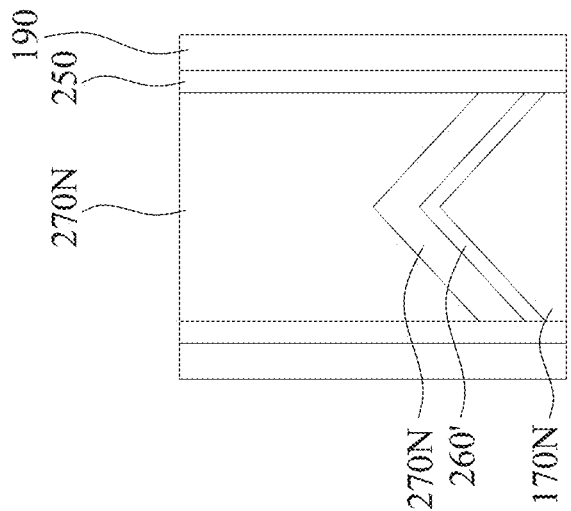

FIGS. 27A-27C are cross-sectional views of semiconductor devices in accordance with various embodiments of the present disclosure. The silicide region SCN is formed over the semimetal layer 260', which is conformally deposited over the top surface of the source/drain epitaxial structure 170, and thus may have a profile according to the top surface of the source/drain epitaxial structure 170. In FIG. 27A, the source/drain epitaxial structure 170 may have a concave curved top surface in contact with the semimetal layer 260'. Thus, the semimetal layer 260' thereon may have a concave curved top surface and a convex bottom surface. The silicide region SCN may have a concave curved top surface and a convex curved bottom surface in contact with the concave curved top surface of the semimetal layer 260'. In FIG. 27B, the source/drain epitaxial structure 170 has a convex curved top surface in contact with the semimetal layer 260'. Thus, the semimetal layer 260' thereon may have a convex curved top surface and a concave curved bottom surface. The silicide region SCN may have convex curved top surface and a concave curved bottom surface in contact with the convex curved top surface of the semimetal layer 260'. In FIG. 27C, the source/drain epitaxial structure 170 has angle facets in contact with the semimetal layer 260'. Thus, the semimetal layer 260' thereon may have an angled top surface and an angled bottom surface. The silicide region SCN may have an angled top surface and an angled bottom surface in contact with the angled top surface of the semimetal layer 260'.

Based on the above discussions, it can be seen that the present disclosure offers advantages over semiconductor devices. It is understood, however, that other embodiments may offer additional advantages, and not all advantages are necessarily disclosed herein, and that no particular advantage is required for all embodiments. One advantage is that by deposition interfacial semimetal insertion to modulate contact SBHs on NFET, contact resistivity is reduced. Another advantage is the NFET device performance is boosted by lower NFET contact SBH without impacting PFET contact SBH. Still another advantage is that the semimetal can be deposited at low temperature without over thermal budget, achieving a low temperature contact formation capability. Still another advantage is that the contact with the semimetal insertion can be thermally stable due to ternary-phase formation. Still another advantage is that the scheme is applicable to FinFET, nanosheet, nanowire, or suitable devices over a SOI sub state.

According to some embodiments of the present disclosure, the method includes forming a first transistor over a substrate, wherein the first transistor comprises a first source/drain feature; depositing an interlayer dielectric layer around the first transistor; etching an opening in the interlayer dielectric layer to expose the first source/drain feature; conformably depositing a semimetal layer over the interlayer dielectric layer, wherein the semimetal layer has a first portion in the opening in the interlayer dielectric layer and a second portion over a top surface of the interlayer dielectric layer; and forming a source/drain contact in the opening in the interlayer dielectric layer.

According to some embodiments of the present disclosure, the method includes forming a first transistor over a substrate, wherein the first transistor comprises a first source/drain feature; depositing an interlayer dielectric layer around the first transistor; etching an opening in the interlayer dielectric layer to expose a top surface of the first source/drain feature; selectively depositing a semimetal layer over the exposed top surface of the first source/drain feature, wherein a top surface of the interlayer dielectric layer is free of coverage by the semimetal layer; and forming a source/drain contact in the opening in the interlayer dielectric layer.

According to some embodiments of the present disclosure, the semiconductor device includes a semiconductor substrate, a first transistor, a semimetal layer, and a first source/drain contact. The first transistor is over the semiconductor substrate. The first transistor comprises a first gate structure and a first source/drain epitaxial feature adjacent the first gate structure. The semimetal layer is over the first source/drain epitaxial feature. The first source/drain contact is over the semimetal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
forming a first transistor over a substrate, wherein the first transistor comprises a first source/drain feature;
depositing an interlayer dielectric layer around the first transistor;
etching an opening in the interlayer dielectric layer to expose the first source/drain feature;
conformably depositing a semimetal layer over the interlayer dielectric layer, wherein the semimetal layer has a first portion in the opening in the interlayer dielectric layer and a second portion over a top surface of the interlayer dielectric layer;
forming a silicide region over the semimetal layer, wherein the silicide region comprises a semimetal material of the semimetal layer and a semiconductor material of the first source/drain feature; and
after forming the silicide region, forming a source/drain contact in the opening in the interlayer dielectric layer.

2. The method of claim 1, wherein forming the source/drain contact comprises:
filling the opening with a conductive material; and
removing the second portion of the semimetal layer and a portion of the conductive material from a top surface of the interlayer dielectric layer.

3. The method of claim 1, wherein forming the silicide region comprises:
depositing a metal-containing layer over the semimetal layer; and
annealing the metal-containing layer to form the silicide region by reacting with the semimetal layer and the first source/drain feature.

4. The method of claim 1, wherein forming the source/drain contact is performed such that the source/drain contact is in direct contact with the semimetal layer.

5. The method of claim 1, wherein the semimetal layer comprises Sb, Bi, or graphene.

6. The method of claim 1, further comprising:
forming a spacer on a sidewall of the opening in the interlayer dielectric layer prior to conformably depositing the semimetal layer, wherein forming the source/drain contact is performed such that the source/drain contact is in contact with the spacer.

7. The method of claim 1, wherein the first source/drain feature of the first transistor is an n-type source/drain feature.

8. The method of claim 1, further comprising:
forming a second transistor over the substrate, wherein the second transistor comprises a second source/drain feature, wherein a dopant of the second source/drain feature is different from a dopant of the first source/drain feature; and
forming a patterned mask covering the second transistor, wherein selectively depositing the semimetal layer is performed when the second transistor is covered by the patterned mask.

9. A method for manufacturing a semiconductor device, comprising:
forming a first transistor over a substrate, wherein the first transistor comprises a first source/drain feature;

depositing an interlayer dielectric layer around the first transistor;
etching an opening in the interlayer dielectric layer to expose a top surface of the first source/drain feature;
forming a dielectric spacer in the opening in the interlayer dielectric layer;
selectively depositing a semimetal layer over the exposed top surface of the first source/drain feature and not over a top surface of the interlayer dielectric layer, wherein selectively depositing the semimetal layer is performed such that a topmost portion of the semimetal layer is lower than a top end of the dielectric spacer; and
forming a source/drain contact in the opening in the interlayer dielectric layer.

10. The method of claim 9, further comprising:
forming a silicide region over the semimetal layer prior to forming the source/drain contact, wherein the silicide region comprises a semimetal material of the semimetal layer and a semiconductor material of the first source/drain feature.

11. The method of claim 9, wherein forming the source/drain contact is performed such that the source/drain contact is in contact with the semimetal layer.

12. The method of claim 9, further comprising:
forming a second transistor over the substrate, wherein the second transistor comprises a second source/drain feature; and
forming a patterned mask covering the second transistor, wherein selectively depositing the semimetal layer is performed when the second transistor is covered by the patterned mask.

13. The method of claim 12, wherein the first source/drain feature is an n-type source/drain feature, and the second source/drain feature is a p-type source/drain feature.

14. A semiconductor device, comprising:
a semiconductor substrate;
a first transistor over the semiconductor substrate, wherein the first transistor comprises a first gate structure and a first source/drain epitaxial feature adjacent the first gate structure;
a semimetal layer over the first source/drain epitaxial feature;
a first source/drain contact over the semimetal layer;
a second transistor over the semiconductor substrate, wherein the second transistor comprises a second gate structure and a second source/drain epitaxial feature adjacent the second gate structure; and
a second source/drain contact over the second source/drain epitaxial feature, wherein the second source/drain contact and the second source/drain epitaxial feature have no material of the semimetal layer therebetween.

15. The semiconductor device of claim 14, further comprising:
a silicide region between the semimetal layer and the first source/drain contact.

16. The semiconductor device of claim 14, wherein the first source/drain epitaxial feature is an n-type source/drain epitaxial feature, and the second source/drain epitaxial feature is a p-type source/drain epitaxial feature.

17. The semiconductor device of claim 14, wherein the semimetal layer comprises Sb, Bi, or graphene.

18. The semiconductor device of claim 15, wherein the silicide region comprises a semimetal material of the semimetal layer and a semiconductor material of the first source/drain contact.

19. The semiconductor device of claim 14, wherein the semimetal layer surrounds the first source/drain contact.

20. The semiconductor device of claim 14, wherein a top surface of the semimetal layer is lower than a top surface of the first source/drain contact.

* * * * *